(12) United States Patent
Nowatari et al.

(10) Patent No.: US 8,431,940 B2
(45) Date of Patent: *Apr. 30, 2013

(54) LIGHT-EMITTING ELEMENT, LIGHT-EMITTING DEVICE, LIGHTING DEVICE, AND ELECTRONIC DEVICE

(75) Inventors: Hiromi Nowatari, Atsugi (JP); Satoshi Seo, Kawasaki (JP); Nobuharu Ohsawa, Zama (JP); Takahiro Ushikubo, Atsugi (JP); Tetsuo Tsutsui, Kasuga (JP)

(73) Assignee: Semiconductor Energy Laboratory Co., Ltd., Atsugi-si, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/484,602

(22) Filed: May 31, 2012

(65) Prior Publication Data

US 2012/0235166 A1    Sep. 20, 2012

Related U.S. Application Data

(63) Continuation of application No. 13/174,948, filed on Jul. 1, 2011, now Pat. No. 8,207,540, and a continuation of application No. 12/627,147, filed on Nov. 30, 2009, now Pat. No. 7,985,974.

(30) Foreign Application Priority Data

Dec. 1, 2008   (JP) ................................. 2008-306425
May 29, 2009  (JP) ................................. 2009-131518

(51) Int. Cl.
*H01L 27/15*   (2006.01)
*H01L 33/00*   (2010.01)

(52) U.S. Cl.
USPC ........... 257/87; 257/94; 257/98; 257/E33.014

(58) Field of Classification Search ................... 257/87, 257/94, 98, 59, 72, E33.014
See application file for complete search history.

(56) References Cited

U.S. PATENT DOCUMENTS 6,013,384 A    1/2000  Kido et al.
7,192,659 B2   3/2007  Ricks et al.
(Continued)

FOREIGN PATENT DOCUMENTS

EP    1617493 A    1/2006
EP    1833104 A    9/2007
(Continued)

OTHER PUBLICATIONS

Matsumoto et al., "Multiphoton Organic EL device having Charge Generation Layer," SID Digest '03: SID International Symposium Digest of Technical Papers, vol. 34, pp. 979-981 (2003).

(Continued)

*Primary Examiner* — Tu-Tu Ho
(74) *Attorney, Agent, or Firm* — Eric J. Robinson; Robinson Intellectual Property Law Office, P.C.

(57) ABSTRACT

An object is to provide a light-emitting element which exhibits light emission with high luminance and can be driven at low voltage. Another object is to provide a light-emitting device or an electronic device with reduced power consumption. Between an anode and a cathode, n (n is a natural number of two or more) EL layers are provided, where between a first EL layer and a second EL layer, a first layer containing any of an alkali metal, an alkaline earth metal, a rare earth metal, an alkali metal compound, an alkaline earth metal compound, and a rare earth metal compound, a second layer containing a material having a high electron-transporting property in contact with the first layer, and a region containing a material having a high hole-transporting property and an acceptor material in contact with the second layer are provided in this order from the anode side.

32 Claims, 23 Drawing Sheets

U.S. PATENT DOCUMENTS

| | | | |
|---|---|---|---|
| 7,462,883 | B2 | 12/2008 | Kumaki et al. |
| 7,732,808 | B2 | 6/2010 | Ikeda et al. |
| 7,737,626 | B2 | 6/2010 | Kumaki et al. |
| 7,893,427 | B2 | 2/2011 | Kumaki et al. |
| 7,956,349 | B2 | 6/2011 | Tsutsui et al. |
| 7,964,864 | B2 | 6/2011 | Kumaki et al. |
| 7,985,974 | B2 * | 7/2011 | Nowatari et al. ............... 257/87 |
| 2003/0189401 | A1 | 10/2003 | Kido et al. |
| 2004/0262614 | A1 * | 12/2004 | Hack et al. ...................... 257/79 |
| 2005/0098207 | A1 | 5/2005 | Matsumoto et al. |
| 2005/0104511 | A1 | 5/2005 | Liao et al. |
| 2006/0008740 | A1 | 1/2006 | Kido et al. |
| 2006/0263629 | A1 | 11/2006 | Aziz et al. |
| 2006/0292394 | A1 | 12/2006 | Iwaki et al. |
| 2007/0020483 | A1 | 1/2007 | Park et al. |
| 2007/0040161 | A1 | 2/2007 | Kumaki et al. |
| 2007/0090376 | A1 | 4/2007 | Kumaki et al. |
| 2007/0114512 | A1 | 5/2007 | Kumaki et al. |
| 2007/0114527 | A1 | 5/2007 | Kumaki et al. |
| 2007/0116983 | A1 | 5/2007 | Kanno et al. |
| 2007/0129545 | A1 * | 6/2007 | Inoue et al. ................... 544/225 |
| 2007/0200125 | A1 | 8/2007 | Ikeda et al. |
| 2007/0210322 | A1 | 9/2007 | Ohsawa et al. |
| 2008/0278064 | A1 | 11/2008 | Kumaki et al. |
| 2012/0168738 | A1 | 7/2012 | Nowatari et al. |

FOREIGN PATENT DOCUMENTS

| | | |
|---|---|---|
| JP | 10-270171 | 10/1998 |
| JP | 2005-209643 | 8/2005 |
| JP | 3933591 | 6/2007 |
| WO | 01/15244 | 3/2001 |
| WO | WO-2006/009262 | 1/2006 |
| WO | WO-2007/130047 | 11/2007 |

OTHER PUBLICATIONS

Chang et al., "Highly efficient white organic electroluminescent devices based on tandem architecture," Appl. Phys. Lett., 87, No. 25, pp. 253501-1-253501-3 (2005).

Law et al., "Effective organic-based connection unit for stacked organic light-emitting devices," Appl. Phys. Lett., 89, No. 13, pp. 133511-1-133511-3 (2006).

Leem et al., "Highly efficient tandem *p-i-n* organic light-emitting diodes adopting a low temperature evaporated rhenium oxide interconnecting layer," Appl. Phys. Lett., 93, No. 10, pp. 103304-1-103304-3 (2008).

Birnstock et al., "White Stacked OLED with 35 lm/W and 100,000 Hours Lifetime at 1000 cd/m$^2$ for Display and Lighting Applications," SID Digest '08: SID International Symposium Digest of Technical Papers, vol. 39, pp. 822-825 (2008).

Liao et al., "Power efficiency improvement in a tandem organic light-emitting diode," Appl. Phys. Lett., 92, No. 22, pp. 223311-1-223311-3 (2008).

Chan et al., "Influences of Connecting Unit Architecture on the Performance of Tandem Organic Light-Emitting Devices," Adv. Funct. Mater., 17, No. 14, pp. 2509-2514 (2007).

Ikeda et al., "Low-Drive-Voltage OLEDs with a Buffer Layer Having Molybdenum Oxide," SID Digest, '06: SID International Symposium Digest of Technical Papers, vol. 37, pp. 923-926, (2006).

Nowatari et al., "Intermediate Connector with Suppressed Voltage Loss for White Tandem OLEDs," Society for Information Display 2009 International Symposium Digest of Technical Papers Sessions 38-69 vol. XV, Book II, pp. 899-902, Jun. 4, 2009.

Matsumoto et al., "Multiphoton Organic EL device having Charge Generation Layer," SID Digest '03: SID International Symposium Digest of Technical Papers, pp. 979-981 (2003).

Tsutsui et al., "Electric field-assisted bipolar charge spouting in organic thin-film diodes," Appl. Phys. Lett., vol. 84, No. 3, pp. 440-442, Jan. 19, 2004.

Chang et al., "Highly efficient white organic electroluminescent devices based on tandem architecture," Appl. Phys. Lett., 87, pp. 253501-1-253501-3 (2005).

Kanno et al., "White Stacked Electrophosphorescent Organic Light-Emitting Devices Employing $MoO_3$ as a Charge-Generation Layer," Adv. Mater., 18, pp. 339-342 (2006).

Liao et al., "High-efficiency tandem organic light-emitting diodes," Appl. Phys. Lett., vol. 84, No. 2, pp. 167-169, Jan. 12, 2004.

Terai et al., "Electric-field-assisted bipolar charge generation from internal charge separation zone composed of doped organic bilayer," Appl. Phys. Lett., 90, pp. 083502-1-083502-3 (2007).

Law et al., "Effective organic-based connection unit for stacked organic light-emitting devices," Appl. Phys. Lett., 89, pp. 133511-1-133511-3 (2006).

Leem et al., "Highly efficient tandem *p-i-n* organic light-emitting diodes adopting a low temperature evaporated rhenium oxide interconnecting layer," Appl. Phys. Lett., 93, pp. 103304-1-103304-3 (2008).

Birnstock et al., "White Stacked OLED with 35 lm/W and 100,000 Hours Lifetime at 1000 cd/m$^2$ for Display and Lighting Applications," SID Digest '08: SID International Symposium Digest of Technical Papers, pp. 822-825 (2008).

Lai et al., "Copper hexadecafluorophthalocyanine and copper phthalocyanine as a pure organic connecting unit in blue tandem organic light-emitting devices," J. Appl. Phys., 101, pp. 014509-1-014509-4 (2007).

Kanno et al., "High Efficiency Stacked Organic Light-Emitting Diodes Employing $Li_2O$ as a Connecting Layer," Jpn. J. Appl. Phys., vol. 45, No. 12, pp. 9219-9223 (2006).

Liao et al., "Power efficiency improvement in a tandem organic light-emitting diode," Appl. Phys. Lett., 92, pp. 223311-1-223311-3 (2008).

Chan et al., "Influences of Connecting Unit Architecture on the Performance of Tandem Organic Light-Emitting Devices," Adv. Funct. Mater., 17, pp. 2509-2514 (2007).

Ikeda et al., "Low-Drive-Voltage OLEDs with a Buffer Layer Having Molybdenum Oxide," SID Digest, '06: SID International Symposium Digest of Technical Papers, pp. 923-926, (2006).

Hiramoto et al., "p-i-n like behavior in three-layered organic solar cells having a co-deposited interlayer of pigments," J. Appl. Phys., vol. 72, No. 8, pp. 3781-3787, Oct. 15, 1992.

Brabec et al., "Photovoltaic properties of conjugated polymer/methanofullerene composites embedded in a polystyrene matrix," J. Appl. Phys., vol. 85, No. 9, pp. 6866-6872 (1999).

European Search Report (Application No. 09177424.0) Dated Sep. 17, 2012.

* cited by examiner

LIGHT-EMITTING ELEMENT, LIGHT-EMITTING DEVICE, LIGHTING DEVICE, AND ELECTRONIC DEVICE

BACKGROUND OF THE INVENTION

1. Field of the Invention

The present invention hereinafter disclosed relates to a light-emitting element having a light-emitting layer between a pair of electrodes. In addition, the present invention relates to a light-emitting device in which the light-emitting element is used and a lighting device and an electronic device in each of which the light-emitting device is used.

2. Description of the Related Art

In recent years, a light-emitting element in which a light-emitting organic compound or a light-emitting inorganic compound is used as a light-emitting material has been actively developed. In particular, a light-emitting element called an electroluminescence (hereinafter, EL) element has a simple structure in which a light-emitting layer containing a light-emitting material is provided between electrodes, and has attracted attention as a next-generation flat panel display element because of its characteristics such as thinness, light-weight, high response speed, and direct current low voltage driving. In addition, a display in which such a light-emitting element is used has a feature that it is excellent in contrast and image quality and has a wide viewing angle. Moreover, such a light-emitting element is a plane light source; therefore, application of such a light-emitting element is considered as a light source such as a backlight of a liquid crystal display and lighting.

Current is applied to a light-emitting layer provided between a pair of electrodes in a light-emitting element to excite a light-emitting material contained in the light-emitting layer, whereby a predetermined emission color can be obtained. Supplying a large amount of current to the light-emitting layer is considered in order to increase emission luminance of such a light-emitting element; however, such a method hinders reduction of power consumption. In addition, applying a large amount of current also leads to acceleration of deterioration of the light-emitting element.

Hence, a light-emitting element is proposed whose emission luminance is increased by stacking a plurality of light-emitting layers and applying current which has the same current density as current applied in the case of a light-emitting element having a single light-emitting layer (for example, Patent Document 1).

REFERENCE

Patent Document

[Patent Document 1] Japanese Published Patent Application No. 3933591

In Patent Document 1, a light-emitting element is proposed in which a plurality of light-emitting units (hereinafter in this specification, the light-emitting unit is also referred to as an EL layer) are provided and the light-emitting units are separated by a charge production layer. More specifically, a light-emitting element is proposed in which a charge production layer formed of vanadium pentoxide is provided over a metal-doped layer functioning as an electron-injecting layer of a first light-emitting unit, and further a second light-emitting unit is stacked over the metal-doped layer with the charge production layer interposed therebetween. However, in the light-emitting element having such a structure, mutual interaction occurs between the metal-doped layer and the charge-generation layer formed of the oxide at their interface and the interface has a high electric field; thus, high voltage is needed for driving the light-emitting element, unfortunately.

In view of the above problem, it is an object to provide a light-emitting element which exhibits light emission with high luminance and can be driven at low voltage. In addition, it is another object to provide a light-emitting device or an electronic device with reduced power consumption.

SUMMARY OF THE INVENTION

One embodiment disclosed in this specification is a light-emitting element having a structure in which n (n is a natural number of two or more) EL layers are provided between an anode and a cathode, where between m-th (m is a natural number, $1 \leq m \leq n-1$) EL layer and (m+1)-th EL layer, a first layer containing any of an alkali metal, an alkaline earth metal, a rare earth metal, an alkali metal compound, an alkaline earth metal compound, and a rare earth metal compound, a second layer containing a material having a high electron-transporting property in contact with the first layer, and a region containing a material having a high hole-transporting property and an acceptor material in contact with the second layer are provided in this order from the anode side.

Another embodiment disclosed in this specification is a light-emitting element having a structure in which n (n is a natural number of two or more) EL layers are provided between an anode and a cathode, where between m-th (m is a natural number, $1 \leq m \leq n-1$) EL layer and (m+1)-th EL layer, a first layer containing a material having a high electron-transporting property and a donor material, a second layer containing a material having a high electron-transporting property in contact with the first layer, and a region containing a material having a high hole-transporting property and an acceptor material in contact with the second layer are provided in this order from the anode side.

In addition, in the above first layer containing the material having a high electron-transporting property and the donor material, the donor material may be added so that the mass ratio of the donor material to the material having a high electron-transporting property is from 0.001:1 to 0.1:1. Moreover, the donor material is preferably an alkali metal, an alkaline earth metal, a rare earth metal, an alkali metal compound, an alkaline earth metal compound, or a rare earth metal compound.

Furthermore, in the above structure, the region containing the material having a high hole-transporting property and the acceptor material is a region to which the acceptor material is added so that the mass ratio of the acceptor material to the material having a high hole-transporting property is from 0.1:1 to 4.0:1. Of carriers generated in the region, holes are injected into (m+1)-th EL layer and electrons move to the second layer.

Furthermore, in the above structure, the region containing the material having a high hole-transporting property and the acceptor material may be a region in which a layer containing the material having a high hole-transporting property and a layer containing the acceptor material are stacked.

Furthermore, in the above structure, as the material having a high electron-transporting property that is contained in the second layer, a material whose LUMO level is preferably greater than or equal to −5.0 eV, more preferably greater than or equal to −5.0 eV and less than or equal to −3.0 eV is preferably used.

Furthermore, with the light-emitting element having the above structure, low driving voltage can be realized; therefore, low power consumption of a light-emitting device (e.g., an image display device or a light-emitting device) in which the light-emitting element is used can be realized. Thus, a light-emitting device in which the light-emitting element having the above structure is used and a lighting device and an electronic device in each of which the light-emitting device is used are also included as one embodiment of the present invention.

With the above structure, at least one of the above objects is achieved.

Note that the light-emitting device in this specification includes, in its category, electronic devices such as an image display device and a lighting device in each of which a light-emitting element is used. Further, the category of the light-emitting device includes a module including a light-emitting element attached with a connector such as a module attached with an anisotropic conductive film, TAB (tape automated bonding) tape, or a TCP (tape carrier package); a module in which the top of the TAB tape or the TCP is provided with a printed wire board; or a module in which an IC (integrated circuit) is directly mounted on a light-emitting element by COG (chip on glass); and the like.

Note that the ordinal numbers such as "first" and "second" in this specification are used for convenience and do not denote the order of steps and the stacking order of layers. In addition, the ordinal numbers in this specification do not denote particular names which specify the invention.

A light-emitting element which has a plurality of light-emitting layers and can be driven at low voltage can be provided.

In addition, by manufacture of a light-emitting device using the above-described light-emitting element, the light-emitting device can have low power consumption. Furthermore, such a light-emitting device is applied to a lighting device and an electronic device, whereby the lighting device and the electronic device can have low power consumption.

DETAILED DESCRIPTION OF THE INVENTION

Figure 1A:
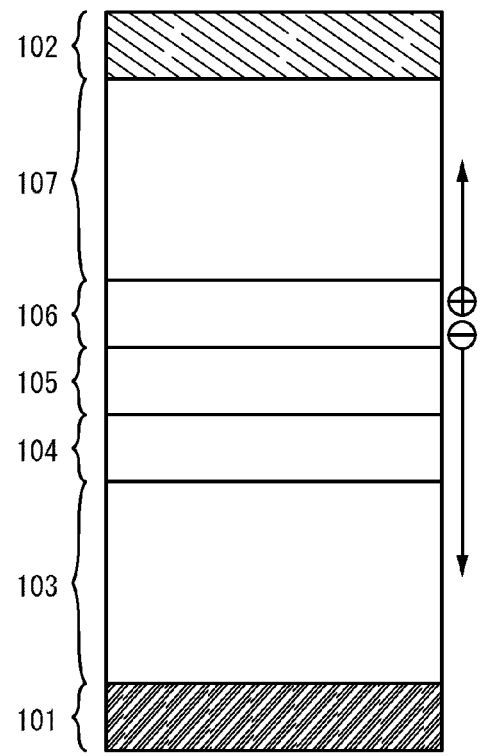
FIG. 1A illustrates an example of an element structure of a light-emitting element and FIG. 1B is a band diagram thereof.

Hereinafter, embodiments and examples of the present invention disclosed will be described with reference to the accompanying drawings. Note that it is easily understood by those skilled in the art that the present invention disclosed can be carried out in many different modes, and the modes and details disclosed herein can be modified in various ways without departing from the spirit and scope of the present invention. Therefore, the present invention disclosed should not be construed as being limited to the description below of embodiments and examples. In the drawings for explaining the embodiments and examples, the same parts or parts having a similar function are denoted with the same reference numerals, and description of such parts is not repeated.

Embodiment 1

In Embodiment 1, one embodiment of a light-emitting element will be described with reference to FIGS. 1A and 1B.

In an element structure illustrated in FIG. 1A, a first EL layer 103 and a second EL layer 107 each including a light-emitting region are sandwiched between a pair of electrodes (an anode 101 and a cathode 102), and between the first EL layer 103 and the second EL layer 107, an electron-injecting buffer 104, an electron-relay layer 105, and a charge production region 106 are stacked in this order from the anode 101 side.

The charge production region 106 is a region containing a material having a high hole-transporting property and an acceptor material, where holes and electrons that are carriers of the light-emitting element are produced. The holes produced in the charge production region 106 move to the second EL layer 107 while the electrons move to the electron-relay layer 105. Further, since the electron-relay layer 105 has a high electron-transporting property, it can rapidly transport the electrons to the electron-injecting buffer 104. Moreover, since the electron-injecting buffer 104 can reduce injection barriers when the electrons are injected into the first EL layer 103, it can increase the efficiency of electron injection into the first EL layer 103.

A material having a high electron-injecting property can be used for the electron-injecting buffer 104: for example, an alkali metal, an alkaline earth metal, a rare earth metal, a compound of the above metal (e.g., an alkali metal compound (an oxide such as lithium oxide, a halide, and carbonate such as lithium carbonate or cesium carbonate), an alkaline earth metal compound (e.g., an oxide, a halide, and carbonate), and a rare earth metal compound (e.g., an oxide, a halide, and carbonate). Alternatively, the electron-injecting buffer 104 may contain a material having a high electron-transporting property and a donor material.

Figure 1B:
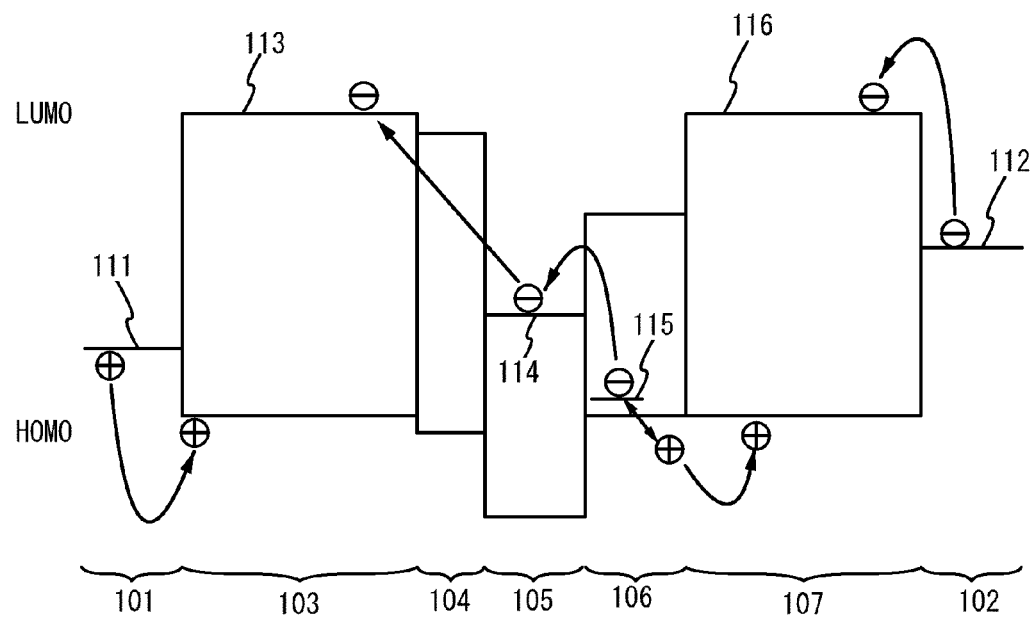

FIG. 1B is a band diagram of the element structure of FIG. 1A. In FIG. 1B, reference numeral 111 denotes the Fermi level of the anode 101; 112, the Fermi level of the cathode 102; 113, the lowest unoccupied molecular orbital (LUMO) level of the first EL layer 103; 114, the LUMO level of the electron-relay layer 105; 115, the acceptor level of an acceptor in the charge production region 106; and 116, the LUMO level of the second EL layer 107.

In FIG. 1B, the holes injected from the anode 101 are injected into the first EL layer 103. On the other hand, the electrons generated in the charge production region 106 move to the electron-relay layer 105, and then injected into the first EL layer 103 through the electron-injecting buffer 104, and recombined with the holes, whereby light is emitted. In addition, the holes generated in the charge production region 106 move to the second EL layer 107 and recombined with the electrons injected from the cathode 102 in the second EL layer 107, whereby light is emitted.

In the light-emitting element described in this embodiment, since the electron-relay layer 105 functions as a layer for sufficiently injecting electrons generated in the charge production region 106 into the first EL layer 103, the electron-relay layer 105 is preferably formed using a material whose LUMO level is a level between the acceptor level of the acceptor in the charge production region 106 and the LUMO level of the first EL layer 103. Specifically, a material whose LUMO level is greater than or equal to about $-5.0$ eV is preferably used, and a material whose LUMO level is greater than or equal to $-5.0$ eV and less than or equal to $-3.0$ eV is more preferably used.

The acceptor material contained in the charge production region 106 has a strong acceptor property, and the material having a high electron-injecting property or the donor material contained in the electron-injecting buffer 104 has a strong donor property; therefore, when the charge production region 106 and the electron-injecting buffer 104 are in contact with each other, electrons are donated and accepted at the interface between the charge production region 106 and the electron-injecting buffer 104, which leads to an increase in driving voltage of the light-emitting element. In addition, the driving voltage of the light-emitting element is likely to be increased when PN junction is formed at the interface where the charge production region 106 and the electron-injecting buffer 104 are in contact with each other. However, in the light-emitting element described in this embodiment, the charge production region 106 and the electron-injecting buffer 104 can be prevented from being in contact with each other by the electron-relay layer 105; thus, the acceptor material contained in the charge production region 106 and the material having a high electron-injecting property or the donor material contained in the electron-injecting buffer 104 can be prevented from interacting with each other by the electron-relay layer 105. In addition, the electron-relay layer 105 is formed using a material whose LUMO level falls within the above-described range, whereby a high electric field of the interface between the electron-relay layer 105 and the electron-injecting buffer 104 is suppressed, and the electrons generated in the charge production region 106 can be efficiently injected into the first EL layer 103.

Further, as illustrated in the band diagram of FIG. 1B, the electrons that have moved to the electron-relay layer 105 from the charge production region 106 are easily injected into the LUMO level 113 of the first EL layer 103 because of reduced injection barrier due to the electron-injecting buffer 104. Note that the holes generated in the charge production region 106 move to the second EL layer 107.

Next, the material that can be used for the above-described light-emitting element is specifically described.

The anode 101 is preferably formed using a metal, an alloy, an electrically-conductive compound, a mixture of these materials, or the like, having a high work function (specifically, a work function of greater than or equal to 4.0 eV). Specifically, indium tin oxide (ITO), indium tin oxide containing silicon or silicon oxide, indium zinc oxide (IZO), indium oxide containing tungsten oxide and zinc oxide, and the like can be given, for example.

Films of these conductive metal oxides are usually formed by sputtering method. Alternatively, the films may be formed by application of a sol-gel method or the like. For example, a film of indium oxide-zinc oxide (IZO) can be formed by a sputtering method using a target in which zinc oxide is added to indium oxide at 1 wt % to 20 wt %. Indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively.

Besides, as a material used for the anode 101, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like. Alternatively, a conductive polymer such as poly(3,4-ethylenedioxythiophene)/poly(styrenesulfonic acid) (PEDOT/PSS) or polyaniline/poly(styrenesulfonic acid) (PAni/PSS) may be used. Note that, in the case where a charge production region is provided in contact with the anode 101 as part of the first EL layer 103, a variety of conductive materials such as Al and Ag can be used for the anode 101 regardless of the magnitude of their work functions.

The cathode 102 is preferably formed using a metal, an alloy, an electrically-conductive compound, a mixture of these materials, or the like, having a low work function (specifically, a work function of less than or equal to 3.8 eV). As specific examples of such a cathode material, the following can be given: an element that belongs to Group 1 or 2 of the periodic table, that is, an alkali metal such as lithium (Li) or cesium (Cs), an alkaline earth metal such as magnesium (Mg), calcium (Ca), or strontium (Sr), an alloy containing these (such as an MgAg alloy or an AlLi alloy), a rare-earth metal such as europium (Eu) or ytterbium (Yb), an alloy containing these, and the like. Note that a film of an alkali metal, an alkaline earth metal, or an alloy thereof can be formed by a vacuum evaporation method. Alternatively, an alloy containing an alkali metal or an alkaline earth metal can be formed by a sputtering method. Further alternatively, a film can be formed using silver paste or the like by an ink jet method or the like.

Alternatively, the cathode 102 can be formed using a stack of a thin film of an alkali metal compound, an alkaline earth metal compound, or a rare earth metal compound (e.g., lithium fluoride (LiF), lithium oxide (LiOx), cesium fluoride (CsF), calcium fluoride ($CaF_2$), or erbium fluoride ($ErF_3$)) and a film of a metal such as aluminum. Note that, in the case where the charge production region is provided in contact with the cathode 102 as part of the second EL layer 107, a variety of conductive materials such as Al, Ag, ITO, and indium oxide-tin oxide containing silicon or silicon oxide can be used for the cathode 102 regardless of the magnitude of their work functions.

Note that in the light-emitting element described in this embodiment, at least one of the anode and the cathode may have a light-transmitting property. The light-transmitting property can be ensured with use of a transparent electrode such as ITO, or reduction in the thickness of an electrode.

The first EL layer 103 and the second EL layer 107 each may include at least a light-emitting layer, and may also have a structure in which a light-emitting layer and layers other than the light-emitting layer are stacked. Note that the light-emitting layer included in the first EL layer 103 may be different from the light-emitting layer included in the second EL layer 107. Alternatively, the first EL layer 103 and the second EL layer 107 may independently have a structure in which a light-emitting layer and layers other than the light-emitting layer are stacked. As the layers other than the light-emitting layer, there are layers formed of a material having a high hole-injecting property, a material having a high hole-transporting property, a material having a high electron-transporting property, a material having a high electron-injecting property, a material having a bipolar property (a material having high electron-and-hole-transporting properties), and the like. Specifically, a hole-injecting layer, a hole-transporting layer, a hole-blocking layer, a light-emitting layer, an electron-transporting layer, an electron-injecting layer, and the like are given, and they can be combined as appropriate and stacked from the anode side. Furthermore, a charge production region can be provided in a portion of the first EL layer, which is on the side where the first EL layer 103 is in contact with the anode 101.

A material which is used for forming each of the above-described layers included in the EL layer is specifically described.

The hole-injecting layer is a layer containing a material having a high hole-injecting property. As the material having a high hole-injecting property, for example, molybdenum oxide, vanadium oxide, ruthenium oxide, tungsten oxide, manganese oxide, or the like can be used. Besides, a phthalocyanine-based compound such as phthalocyanine (abbreviation: $H_2Pc$) or copper phthalocyanine (abbreviation: CuPc), a high molecule such as poly(3,4-ethylenedioxythiophene)/poly(styrenesulfonic acid) (PEDOT/PSS), or the like can also be used for forming the hole-injecting layer.

The hole-transporting layer is a layer containing a material having a high hole-transporting property. As the material having a high hole-transporting property, the following can be given, for example: aromatic amine compounds such as 4,4'-bis[N-(1-naphtyl)-N-phenylamino]biphenyl (abbreviation: NPB or α-NPD), N,N-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2), 3-[N-(1-naphtyl)-N-(9-phenylcarbazol-3-yl)amino]-9-phenylcarbazole (abbreviation: PCzPCN1), and the like. Alternatively, the following carbazole derivative can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthryl)phenyl]-9H-carbazole (abbreviation: CzPA). The materials listed here are mainly materials having a hole mobility of greater than or equal to $10^{-6}$ $cm^2/Vs$. However, materials other than those can also be used as long as they have a hole-transporting property higher than an electron-transporting property. The layer containing a material having a high hole-transporting property is not limited to a single layer, and may be a stack of two or more layers each containing the above-described material.

In addition to the above materials, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), or poly[N,N-bis(4-butylphenyl)-N,N'-bis(phenyl)benzidine] (abbreviation: Poly-TPD) can be used for the hole-transporting layer.

The light-emitting layer is a layer containing a light-emitting material. As the light-emitting material, the following fluorescent compound can be used, for example: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-antryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazole-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N",N",N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N, 9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and the like.

Alternatively, as the light-emitting material, the following phosphorescent compound can be used, for example: bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis[2-(3',5'-bistrifluoromethylphenyl)pyridinato-N,$C^{2'}$]iridium(III)picolinate (abbreviation: Ir(CF$_3$ppy)$_2$(pic)), bis[2-(4',6'-difluorophenyl)pyridinato-N,$C^{2'}$]iridium(III) acetylacetonate (abbreviation: FIracac), tris(2-phenylpyridinato-N,$C^{2'}$)iridium(III) (abbreviation: Ir(ppy)$_3$), bis(2-phenylpyridinato)iridium(III)acetylacetonato (abbreviation: Ir(ppy)$_2$(acac)), bis(benzo[h]quinolinato)iridium(III)acetylacetonate (abbreviation: Ir(bzq)$_2$(acac)), bis(2,4-diphenyl-1,3-oxazolato-N,$C^{2'}$)iridium(III)acetylacetonate (abbreviation: Ir(dpo)$_2$(acac)), bis[2-(4'-perfluorophenylphenyl)pyridinato]iridium(III) acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), bis[2-(2'-benzo[4,5-α]thienyl)pyridinato-N,$C^{3'}$]iridium(III) acetylacetonate (abbreviation: Ir(btp)$_2$(acac)), bis(1-phenylisoquinolinato-N,$C^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrin platinum(II) (abbreviation: PtOEP), tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), tris[1-(2-thenoyl)-3,3,3-trifluoroacetonato](monophenanthroline)europium(III) (abbreviation: Eu(TTA)$_3$(Phen)), and the like.

Note that those light-emitting materials are preferably dispersed in a host material to be used. As the host material, for example, the following can be used: an aromatic amine compound such as NPB (abbreviation), TPD (abbreviation), TCTA (abbreviation), TDATA (abbreviation), MTDATA (abbreviation), or BSPB (abbreviation); a carbazole derivative such as PCzPCA1 (abbreviation), PCzPCA2 (abbreviation), PCzPCN1 (abbreviation), CBP (abbreviation), TCPB (abbreviation), CzPA (abbreviation), or 4-(1-naphthyl)-4'-(9-phenyl-9H-carbazol-3-yl)-triphenylamine (abbreviation: PCBANB); a material having a high hole-transporting property which contains a high molecular compound, such as PVK (abbreviation), PVTPA (abbreviation), PTPDMA (abbreviation), or Poly-TPD (abbreviation); a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq); a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$); or a material having a high electron-transporting property, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), poly[(9,9-dihexylfluorene-2,7-diyl)-co-(pyridine-3,5-diyl)] (abbreviation: PF-Py), or poly[(9,9-dioctyllfluorene-2,7-diyl)-co-(2,2'-bipyridine-6,6'-diyl)] (abbreviation: PF-BPy).

The electron-transporting layer is a layer containing a material having a high electron-transporting property. As the material having a high electron-transporting property, for example, a metal complex having a quinoline skeleton or a benzoquinoline skeleton, such as Alq (abbreviation), Almq$_3$ (abbreviation), BeBq$_2$ (abbreviation), or BAlq (abbreviation) can be used. In addition to the above, a metal complex having an oxazole-based or thiazole-based ligand, such as Zn(BOX)$_2$ (abbreviation) or Zn(BTZ)$_2$ (abbreviation) can also be used. Furthermore, in addition to the above metal complexes, PBD (abbreviation), OXD-7 (abbreviation), CO11 (abbreviation), TAZ (abbreviation), BPhen (abbreviation), BCP (abbreviation), or the like can also be used. The materials listed here are mainly materials having an electron mobility of greater than or equal to $10^{-6}$ cm$^2$/Vs. Note that materials other than those may be used as long as they have an electron-transporting property higher than a hole-transporting property. Furthermore, the electron-transporting layer may have a structure in which two or more layers formed of the above materials are stacked, without limitation to a single-layer structure.

In addition to the above materials, a high molecular compound such as PF-Py (abbreviation) or PF-BPy (abbreviation) can be used for the electron-transporting layer.

The electron-injecting layer is a layer containing a material having a high electron-injecting property. As the material having a high electron-injecting property, the following can be given: an alkali metal or an alkaline earth metal such as lithium fluoride (LiF), cesium fluoride (CsF), and calcium fluoride (CaF$_2$), and a compound thereof. Alternatively, a layer containing a material having an electron-transporting property and an alkali metal, an alkaline earth metal, or a compound thereof (e.g., Alq containing magnesium (Mg)) can be used. Such a structure makes it possible to increase the efficiency of injection of electrons from the cathode 102.

In the case where a charge production region is provided in the first EL layer 103 or the second EL layer 107, the charge production region is a region that contains a material having a high hole-transporting property and an acceptor material. The charge production region may not only contain a material having a high hole-transporting property and an acceptor material in the same film but also includes a stacked layer of a layer containing a material having a high hole-transporting property and a layer containing an acceptor material. However, in the case of the stacked-layer structure provided on the anode side, the layer containing an acceptor material is in contact with the anode 101, while in the case of the stacked-layer structure provided on the cathode side, the layer containing a material having a high hole-transporting property is in contact with the cathode 102.

The charge production region is formed in the first EL layer 103 or the second EL layer 107, whereby the anode 101 or the cathode 102 can be formed without consideration of a work function of a material for forming an electrode.

As the acceptor material that is used for the charge production region, a transition metal oxide and an oxide of a metal belonging to Groups 4 to 8 of the periodic table can be given. Specifically, molybdenum oxide is particularly preferable. Note that molybdenum oxide has a low hygroscopic property.

As the material having a high hole-transporting property used for the charge production region, any of a variety of organic compounds such as an aromatic amine compound, a carbazole derivative, an aromatic hydrocarbon, and a high molecular compound (such as an oligomer, a dendrimer, or a polymer) can be used. Specifically, a material having a hole mobility of greater than or equal to $10^{-6}$ cm$^2$/Vs is preferable. However, materials other than those can also be used as long as they have a hole-transporting property higher than an electron-transporting property.

Note that layers formed of the above-described materials are stacked in appropriate combination, whereby the first EL layer 103 or the second EL layer 107 can be formed. Further, as a formation method of the first EL layer 103 or the second EL layer 107, any of a variety of methods (e.g., a dry process and a wet process) can be selected as appropriate depending on a material to be used. For example, a vacuum evaporation method, an ink-jet method, a spin coating method, or the like can be used. Note that a different formation method may be employed for each layer.

Further, between the first EL layer 103 and the second EL layer 107, the electron-injecting buffer 104, the electron-relay layer 105, and the charge production region 106 are provided in this order from the anode 101 side. The charge production region 106 is formed in contact with the second EL layer 107, the electron-relay layer 105 is formed in contact with the charge production region 106, and the electron-injecting buffer 104 is formed in contact with and between the electron-relay layer 105 and the first EL layer 103.

The charge production region 106 is a region that contains a material having a high hole-transporting property and an acceptor material. Note that the charge production region 106 can be formed using a material similar to the above-described material used for the charge production region that can be formed in part of the first EL layer 103 or the second EL layer 107, whereby the charge production region 106 can have a similar structure to the charge production region. Therefore, the charge production region 106 can not only contain a material having a high hole-transporting property and an acceptor material in the same film but also include a stacked layer of a layer containing a material having a high hole-transporting property and a layer containing an acceptor material. Note that in the case of the stacked layer, the layer containing a material having a high hole-transporting property is in contact with the second EL layer 107.

Note that the acceptor material is preferably added to the charge production region 106 so that the mass ratio of the acceptor material to the material having a high hole-transporting property is from 0.1:1 to 4.0:1.

The electron-relay layer 105 is a layer that can quickly receive electrons drawn out by the acceptor material in the charge production region 106. Therefore, the electron-relay layer 105 is a layer that contains a material having a high electron-transporting property and is preferably formed using a material having a LUMO level between the acceptor level of the acceptor in the charge production region 106 and the LUMO level of the first EL layer 103. Specifically, a material whose LUMO level is greater than or equal to about −5.0 eV is preferably used, and a material whose LUMO level is greater than or equal to about −5.0 eV and less than or equal to −3.0 eV is more preferably used. As the material used for the electron-relay layer 105, for example, a perylene derivative and a nitrogen-containing condensed aromatic compound can be given. Note that a nitrogen-containing condensed aromatic compound is preferably used for the electron-relay layer 105 because of its stability. Furthermore, of nitrogen-containing condensed aromatic compounds, a compound having an electron-withdrawing group such as a cyano group or a fluoro group is preferably used, in which case electrons are easily received in the electron-relay layer 105.

As specific examples of the perylene derivative, the following can be given: 3,4,9,10-perylenetetracarboxylicdianhydride (PTCDA), 3,4,9,10-perylenetetracarboxylic-bis-benzimidazole (PTCBI), N,N'-dioctyl-3,4,9,10-perylenetetracarboxylic diimide (PTCDI-C8H), N,N'-dihexyl-3,4,9,10-perylenetetracarboxylicdiimide (HexPTC), and the like.

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like. Besides, perfluoropentacene, 7,7,8,8-tetracyanoquinodimethane (abbreviation: TCNQ), 1,4,5,8-naphthalenetetracarboxylicdianhydride (abbreviation: NTCDA), copper hexadecafluoro phthalocyanine (abbreviation: F$_{16}$CuPc), N,N'-bis(2,2,3,3,4,4,5,5,6,6,7,7,8,8-pentadecafluorooctyl-1,4,5,8-naphthalenetetracarboxylic diimide (abbreviation: NTCDI-C8F), 3',4'-dibutyl-5,5"-bis(dicyanomethylene)-5,5"-dihydro-2,2':5',2"-terthiophen) (abbreviation: DCMT), methanofullerene such as [6,6]-phenyl C$_{61}$ butyric acid methyl ester (abbreviation: PCBM), or the like can be used for the electron-relay layer 105.

The electron-injecting buffer 104 is a layer that can inject the electrons received by the electron-relay layer 105 into the first EL layer 103. The provision of the electron-injecting buffer 104 makes it possible to reduce the injection barrier between the charge production region 106 and the first EL layer 103; thus, the electrons generated in the charge production region 106 can be easily injected into the first EL layer 103.

A material having a high electron-injecting property can be used for the electron-injecting buffer 104: for example, an alkali metal, an alkaline earth metal, a rare earth metal, a compound of the above metal (e.g., an alkali metal compound (an oxide such as lithium oxide or the like, a halide, and carbonate such as lithium carbonate or cesium carbonate), an alkaline earth metal compound (e.g., an oxide, a halide, and carbonate), and a rare earth metal compound (e.g., an oxide, a halide, and carbonate).

Further, in the case where the electron-injecting buffer 104 contains a material having a high electron-transporting property and a donor material, the donor material is preferably added so that the mass ratio of the donor material to the material having an electron-transporting property is from 0.001:1 to 0.1:1. Note that as the donor material, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (e.g., an oxide of lithium oxide or the like, a halide, and carbonate such as lithium carbonate or cesium carbonate), an alkaline earth metal compound (e.g., an oxide, a halide, and carbonate), and a rare earth metal compound (e.g., an oxide, a halide, and carbonate). Note that as the material having a high electron-transporting property, a material similar to the above-described material for the electron-transporting layer that can be formed in part of the first EL layer 103 can be used.

The light-emitting element described in this embodiment can be manufactured by combination of the above-described materials. Although light emission from the above-described light-emitting material can be obtained with this light-emitting element, a variety of emission colors can be obtained by changing the type of the light-emitting material that is used for the light-emitting layer. In addition, a plurality of light-emitting materials of different colors are used as the light-emitting material, whereby light emission having a broad spectrum or white light emission can also be obtained.

Note that, although the light-emitting element in which two EL layers are provided is described in this embodiment, the number of EL layers is not limited to two, and may be three, for example. In the case where n (n is a natural number of two or more) EL layers are provided in a light-emitting element, an electron-injecting buffer, an electron-relay layer, and a charge production region are stacked in this order from the anode side between m-th (m is a natural number, $1 \leq m \leq n-1$) EL layer and (m+1)-th EL layer, whereby an increase in the driving voltage of the light-emitting element can be suppressed.

Further, the light-emitting element described in this embodiment can be formed over any of a variety of substrates. As the substrate, for example, a substrate made of glass, plastic, a metal plate, metal foil, or the like can be used. In the case where light emission of the light-emitting element is extracted from the substrate side, a substrate having a light-transmitting property may be used. Note that as the substrate, a substrate other than the above may be used as long as it can serve as a support in the manufacturing process of the light-emitting element.

Note that a passive matrix light-emitting device in which both electrodes are formed in a grid pattern over the same substrate can be manufactured with the structure of the light-emitting element described in this embodiment. In addition, an active matrix light-emitting device including a light-emitting element which is electrically connected to a thin film transistor (TFT) functioning as a switch, or the like and the driving of which is controlled by the TFT can also be manufactured with the structure of the light-emitting element described in this embodiment. Note that the structure of the TFT is not particularly limited. A staggered TFT or an inverted staggered TFT may be employed. In addition, a driver circuit formed with a TFT may be formed using an n-type TFT and a p-type TFT, or using either an n-type TFT or a p-type TFT. Crystallinity of a semiconductor film used for the TFT is not particularly limited, either. An amorphous semiconductor film may be used, or a crystalline semiconductor film may be used. Alternatively, a single crystal semiconductor film or a microcrystalline semiconductor may be used. Further alternatively, an oxide semiconductor, for example, an oxide semiconductor containing indium, gallium, and zinc can be used.

Further, the light-emitting element described in this embodiment can be formed by any of a variety of methods regardless of whether it is a dry process (e.g., a vacuum evaporation method or a sputtering method) or a wet process (e.g., an ink-jet method, a spin coating method, or an application method).

The element structure described in this embodiment is employed, whereby the driving voltage of the light-emitting element can be less likely to be adversely affected by the thickness of the charge production region 106. Thus, an increase in the driving voltage of the light-emitting element can be suppressed, and improvement of color purity by optical adjustment can be realized.

In addition, when the element structure described in this embodiment is employed, the electron-relay layer 105 is sandwiched between the charge production region 106 and the electron-injecting buffer 104. In this case, a structure in which the acceptor contained in the charge production region 106 and the material having a high electron-injecting property or the donor material contained in the electron-injecting buffer 104 are less likely to interact, and thus their functions are less likely to be inhibited can be obtained. Thus, the light-emitting element can be driven at low voltage.

Note that the structure described in this embodiment can be combined with any of the structures described in other embodiments as appropriate.

Embodiment 2

In Embodiment 2, an example of the light-emitting element included in the basic structure described in Embodiment 1 will be described with reference to FIGS. 2A and 2B. Specifically, a case where the electron-injecting buffer 104 has a single layer of an alkali metal, an alkaline earth metal, a rare earth metal, or a compound thereof will be described.

Figure 2A:
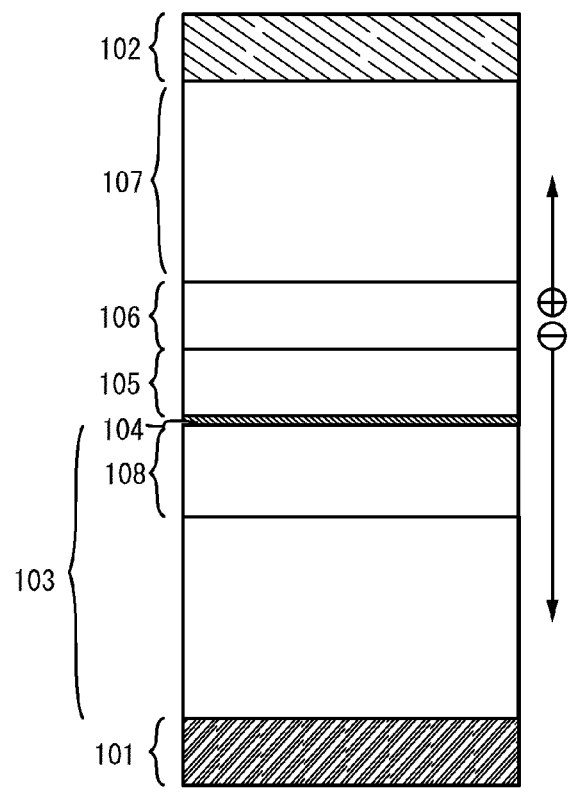
FIG. 2A illustrates an example of an element structure of a light-emitting element and FIG. 2B is a band diagram thereof.

As illustrated in FIG. 2A, in a light-emitting element described in this embodiment, the first EL layer 103 and the second EL layer 107 each including a light-emitting region are sandwiched between a pair of electrodes (the anode 101 and the cathode 102), and between the first EL layer 103 and the second EL layer 107, the electron-injecting buffer 104, the electron-relay layer 105, and the charge production region 106 are stacked in this order from the anode 101 side.

The anode 101, the cathode 102, the first EL layer 103, the second EL layer 107, the charge production region 106, and the electron-relay layer 105 in Embodiment 2 can be formed using materials similar to those described in Embodiment 1.

In this embodiment, as a material used for the electron-injecting buffer 104, the following can be given: materials having a high electron-injecting property, such as alkali metals such as lithium (Li) and cesium (Cs); alkaline earth metals such as magnesium (Mg), calcium (Ca), and strontium (Sr); rare earth metals such as europium (Eu) and ytterbium (Yb); alkali metal compounds (e.g., an oxide of lithium oxide and the like, a halide, and carbonate such as lithium carbonate and cesium carbonate); alkaline earth metal compounds (e.g., an oxide, a halide, and carbonate), and rare earth metal compounds (e.g., an oxide, a halide, and carbonate); and the like.

In the light-emitting element described in this embodiment, a single layer of any of the above-described metals or a compound thereof is provided as the electron-injecting buffer 104. The electron-injecting buffer 104 is formed to have a very small thickness (specifically, less than or equal to 1 nm) so that an increase in the driving voltage is prevented. Note that in this embodiment, the electron-transporting layer 108 is preferably formed in contact with the electron-injecting buffer 104 in the first EL layer 103 and that the electron-injecting buffer 104 is proximately located at the interface between the electron-relay layer 105 and the electron-transporting layer 108, which is part of the EL layer 103. However, in the case where the electron-injecting buffer 104 is formed over the electron-transporting layer 108 after the electron-transporting layer 108 is formed, part of the material used for forming the electron-injecting buffer 104 can also exist in the electron-transporting layer 108 that is part of the EL layer 103.

Figure 2B:
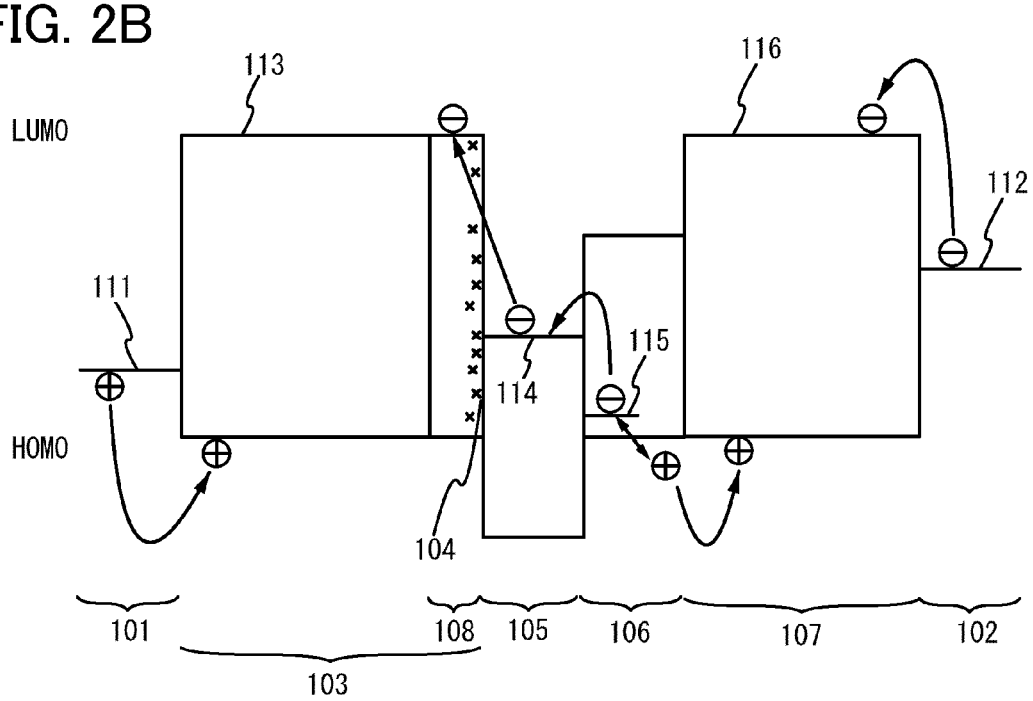

FIG. 2B is a band diagram of the element structure of FIG. 2A. In FIG. 2B, the electron-injecting buffer 104 is provided at the interface between the electron-relay layer 105 and the first EL layer 103, whereby the injection barrier between the charge production region 106 and the first EL layer 103 can be reduced; thus, electrons generated in the charge production region 106 can be easily injected into the first EL layer 103. In addition, holes generated in the charge production region 106 move to the second EL layer 107.

The structure of the electron-injecting buffer described in this embodiment is employed, whereby the driving voltage of the light-emitting element can be reduced in comparison with a structure of an electron-injecting buffer described later in Embodiment 3 (that is formed by addition of a donor material to a material having a high electron-transporting property). Note that in this embodiment, as the material having a high electron-injecting property in the electron-injecting buffer 104, an alkali metal compound (e.g., an oxide such as lithium oxide, a halide, and carbonate such as lithium carbonate or cesium carbonate), an alkaline earth metal compound (e.g., an oxide, a halide, and carbonate), a rare earth metal compound (e.g., an oxide, a halide, and carbonate), or the like is preferably used. Those materials having a high electron-injecting property are stable in the air, and therefore provide high productivity and are suitable for mass production.

Note that the structure described in this embodiment can be combined with any of the structures described in other embodiments as appropriate.

Embodiment 3

In Embodiment 3, an example of the light-emitting element included in the basic structure described in Embodiment 1 will be described with reference to FIGS. 3A and 3B. Specifically, a case where the electron-injecting buffer 104 of the light-emitting element described in Embodiment 1 contains a material having a high electron-transporting property and a donor material.

Figure 3A:
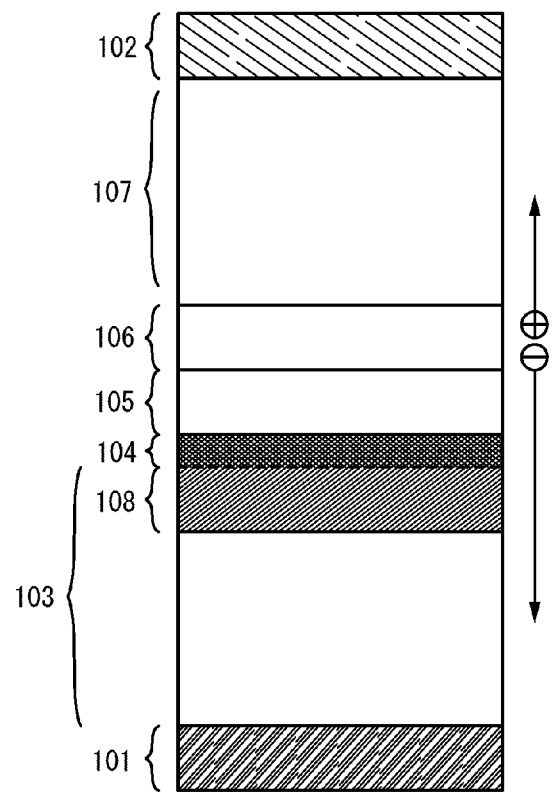
FIG. 3A illustrates an example of an element structure of a light-emitting element and FIG. 3B is a band diagram thereof.
Figure 3B:
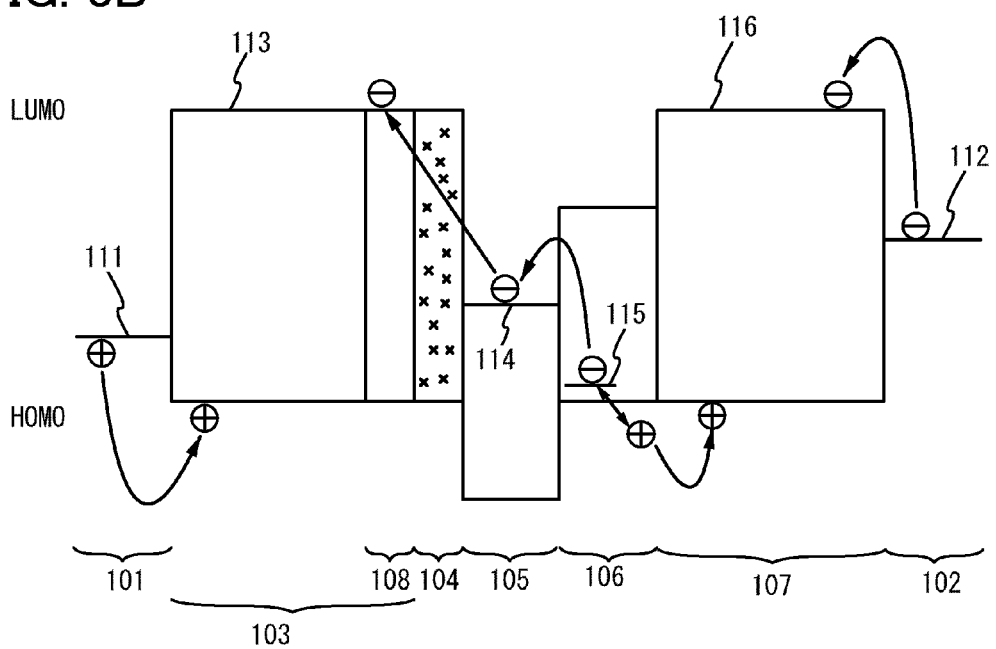

As illustrated in FIG. 3A, in a light-emitting element described in this embodiment, the first EL layer 103 and the second EL layer 107 each including a light-emitting region are sandwiched between a pair of electrodes (the anode 101 and the cathode 102), and between the first EL layer 103 and the second EL layer 107, the electron-injecting buffer 104, the electron-relay layer 105, and the charge production region 106 are stacked in this order from the anode 101 side. In addition, the electron-injecting buffer 104 contains a material having a high electron-transporting property and a donor material.

Note that, in this embodiment, the donor material is preferably added so that the mass ratio of the donor material to the material having a high electron-transporting property is from 0.001:1 to 0.1:1. Accordingly, the electron-injecting buffer 104 can have high film quality and high reactivity.

The anode 101, the cathode 102, the EL layer 103, the charge production region 106, and the electron-relay layer 105 in Embodiment 3 can be formed using materials similar to those described in Embodiment 1.

In this embodiment, as the material having a high electron-transporting property used for the electron-injecting buffer 104, the following can be used, for example: a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq), or the like. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$) can be used. Further alternatively, besides the metal complexes, 2-(4-biphenylyl)-5-(4-tert-butylphenyl)-1, 3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-biphenylyl)-1,2,4-triazole (abbreviation: TAZ), bathophenanthroline (abbreviation: BPhen), bathocuproine (abbreviation: BCP), or the like can be used. The materials described here are mainly materials having an electron mobility of greater than or equal to $10^{-6}$ cm$^2$/Vs.

Besides the above-described materials, a high molecular compound such as poly[(9,9-dihexylfluorene-2,7-diyl)-co-(pyridine-3,5-diyl)] (abbreviation: PF-Py) and poly[(9,9-dioctylfluorene-2,7-diyl)-co-(2,2'-bipyridine-6,6'-diyl)] (abbreviation: PF-BPy) can be used.

Further, in this embodiment, as the donor material used for the electron-injecting buffer 104, an alkali metal, an alkaline earth metal, a rare earth metal, a compound thereof (e.g., an alkali metal compound (e.g., an oxide such as lithium oxide, a halide, and carbonate such as lithium carbonate or cesium carbonate), an alkaline earth metal compound (e.g., an oxide, a halide, and carbonate), a rare earth metal compound (e.g., an oxide, a halide, and carbonate)), or the like can be used. Alternatively, an organic compound such as tetrathianaphthacene (abbreviation: TTN), nickelocene, or decamethylnickelocene can be used.

Note that, in this embodiment, in the first EL layer 103, the electron-transporting layer 108 may be formed in contact with the electron-injecting buffer 104, and that in the case where the electron-transporting layer 108 is formed, the material having a high electron-transporting property used for the electron-injecting buffer 104 and a material having a high electron-transporting property used for the electron-transporting layer 108 that is part of the EL layer 103 may be the same or different.

As illustrated in FIG. 3A, the light-emitting element described in this embodiment has a feature in that the electron-injecting buffer 104 containing the material having a high electron-transporting property and the donor material is formed between the EL layer 103 and the electron-relay layer 105. FIG. 3B is a band diagram of this element structure.

In other words, the electron-injecting buffer 104 is formed, whereby the injection barrier between the electron-relay layer 105 and the EL layer 103 can be reduced; thus, electrons generated in the charge production region 106 can be easily injected into the first EL layer 103. In addition, holes generated in the charge production region 106 move to the second EL layer 107.

Note that the structure described in this embodiment can be combined with any of the structures described in other embodiments as appropriate.

Embodiment 4

In Embodiment 4, as an example of the light-emitting element included in the basic structure described in Embodiment 1, the structure of the charge production region 106 will be described with reference to FIGS. 4A and 4B.

Figure 4A:
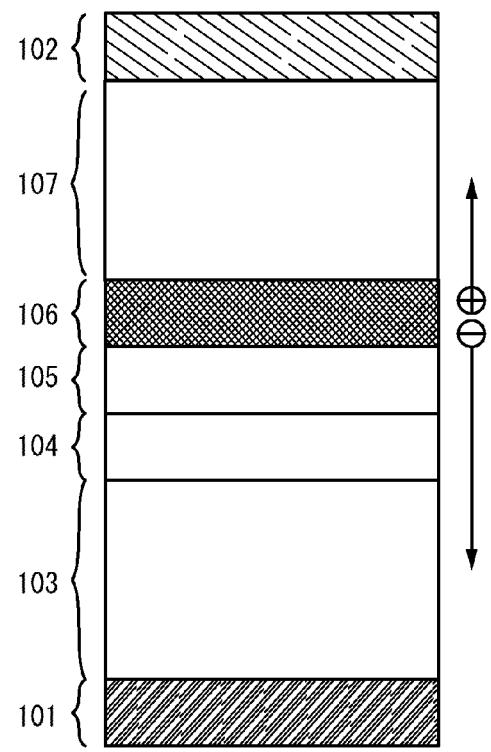
FIGS. 4A and 4B are views each illustrating an element structure of a light-emitting element.
Figure 4B:
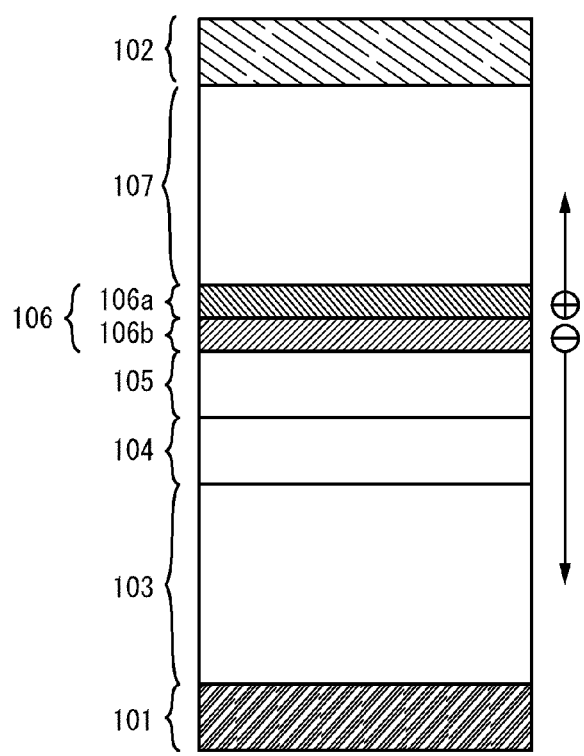

In element structures illustrated in FIGS. 4A and 4B, the first EL layer 103 and the second EL layer 107 each including a light-emitting region are sandwiched between a pair of electrodes (the anode 101 and the cathode 102), and between the first EL layer 103 and the second EL layer 107, the electron-injecting buffer 104, the electron-relay layer 105, and the charge production region 106 are stacked in this order from the anode 101 side. In FIGS. 4A and 4B, the anode 101, the cathode 102, the first EL layer 103, the electron-injecting buffer 104, the electron-relay layer 105, and the second EL layer 107 can be formed using materials similar to those described in Embodiment 1 and can have structures similar to those described in Embodiment 1.

In the element structures illustrated in FIGS. 4A and 4B, the charge production region 106 is a region that contains a material having a high hole-transporting property and an acceptor material. Note that in the charge production region 106, electrons are drawn out from the material having a high hole-transporting property by the acceptor material, whereby holes and electrons are generated.

The charge production region 106 illustrated in FIG. 4A has a structure in which a material having a high hole-transporting property and an acceptor material are contained in the same film. In that case, the acceptor material is preferably added so that the mass ratio of the acceptor material to the material having a high hole-transporting property is from 0.1:1 to 4.0:1, in which case carriers are easily generated in the charge production region 106.

In FIG. 4A, the material having a high hole-transporting property is doped with the acceptor material, and thus an increase of the driving voltage can be suppressed even when the thickness of the charge production region 106 is increased. Accordingly, the increase in the driving voltage can be suppressed, and improvement of color purity by optical adjustment can be realized. In addition, short-circuiting of the light-emitting element can be prevented by increase of the thickness of the charge production region 106.

On the other hand, the charge production region 106 illustrated in FIG. 4B has a structure in which a layer 106a containing a material having a high hole-transporting property and a layer 106b containing an acceptor material are stacked. In the charge production region 106 of the light-emitting element illustrated in FIG. 4B, the material having a high hole-transporting property and the acceptor material are in contact with each other and electrons are donated and accepted, whereby an electron transfer complex is formed. The electron transfer complex is formed only at the interface between the layer 106a containing the material having a high hole-transporting property and the layer 106b containing the acceptor material. Thus, the light-emitting element illustrated in FIG. 4B is preferable because an absorption band of visible light is not easily formed even when the thickness of the charge production region 106 is increased.

Further, the light-emitting element illustrated in FIG. 4B is combined with the structure described in Embodiment 2 to make the electron-injecting buffer 104 have a single layer of an alkali metal, an alkaline earth metal, a rare earth metal, or a compound thereof, whereby the layers between the first EL layer 103 and the second EL layer 107, that is, the electron-injecting buffer 104, the electron-relay layer 105, and the charge production region 106 can be formed without doping and the total thickness of those layers can be reduced to less than or equal to about 5 nm.

As the material having a high hole-transporting property used for the charge production region 106, any of a variety of organic compounds such as an aromatic amine compound, a carbazole derivative, aromatic hydrocarbon, and a high molecular compound (such as an oligomer, a dendrimer, and a polymer) can be used. Specifically, a material having a hole mobility of greater than or equal to $10^{-6}$ cm$^2$/Vs is preferable. However, materials other than those can also be used as long as they have a hole-transporting property higher than an electron-transporting property.

As specific examples of the aromatic amine compound, the following can be given: 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA) 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), N,N'-bis(4-methylphenyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis[N-(3-methylphenyl)-N-phenylamino]biphenyl (abbreviation: DNTPD), 1,3,5-tris[N-(4-diphenylaminophenyl)-N-phenylamino]benzene (abbreviation: DPA3B), and the like.

As specific examples of the carbazole derivative, the following can be given: 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. Besides, the following can be given: 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

As specific examples of the aromatic hydrocarbon, the following can be given: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl,
anthracene; tetracene; rubrene, perylene; 2,5,8,11-tetra(tert-butyl)perylene; and the like. In addition to those, pentacene, coronene, or the like can also be used. In this way, the aromatic hydrocarbon having a hole mobility of greater than or equal to $1\times10^{-6}$ cm$^2$/Vs and 14 to 42 carbon atoms is more preferably used.

Further, the aromatic hydrocarbon may have a vinyl skeleton. As the aromatic hydrocarbon having a vinyl group, for example, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like can be given.

Moreover, a high molecular compound such as poly(N-vinylcarbazole) (abbreviation: PVK) or poly(4-vinyltriphenylamine) (abbreviation: PVTPA) can also be used.

As the acceptor material used for the charge production region 106, 7,7,8,8-tetracyano-2,3,5,6-tetrafluoroquinodimethane (abbreviation: F$_4$-TCNQ), chloranil, and the like can be given. In addition, a transition metal oxide can be given. Moreover, an oxide of a metal belonging to any of Groups 4 to 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron-transporting properties.

Note that the structure described in this embodiment can be combined with any of the structures described in other embodiments as appropriate.

Embodiment 5

In Embodiment 5, another example of the light-emitting element included in the basic structure described in Embodiment 1 will be described with reference to FIGS. 24A and 24B.

Figure 24A:
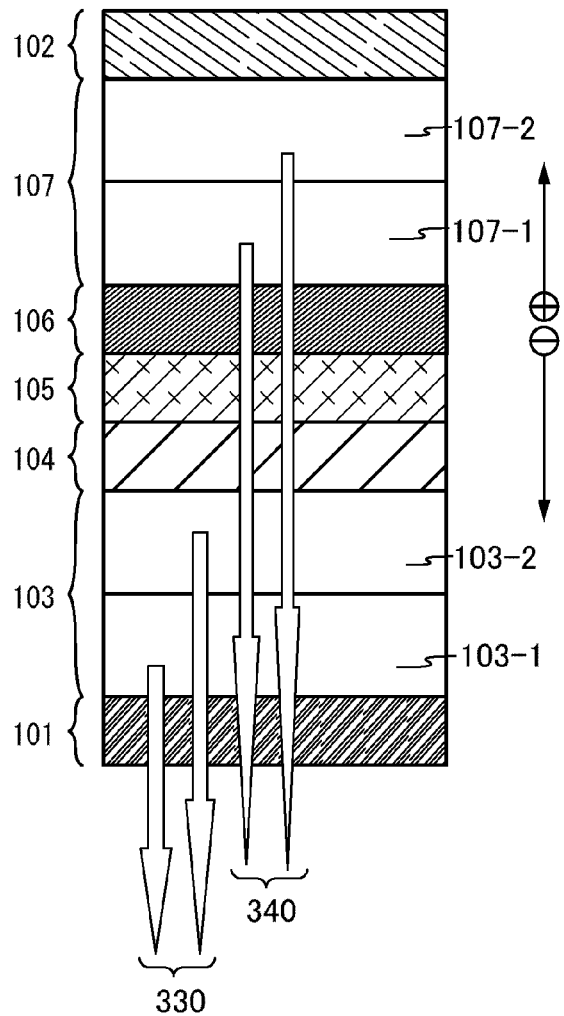
FIG. 24A is a view illustrating an example of a structure of a light-emitting element and FIG. 24B is a graph showing emission spectra of the light-emitting element.

As illustrated in FIG. 24A, a light-emitting element described in this embodiment has a structure in which the first EL layer 103 and the second EL layer 107 each including a light-emitting region are sandwiched between a pair of electrodes (the anode 101 and the cathode 102), and between the first EL layer 103 and the second EL layer 107, the electron-injecting buffer 104, the electron-relay layer 105, and the charge production region 106 are stacked in this order from the anode 101 side.

The anode 101, the cathode 102, the electron-injecting buffer 104, the electron-relay layer 105, and the charge production region 106 in this embodiment can be formed using materials similar to those described in Embodiment 1.

In this embodiment, the first EL layer 103 includes a first light-emitting layer 103-1 which exhibits an emission spectrum having a peak in the blue to blue-green wavelength range and a second light-emitting layer 103-2 which exhibits an emission spectrum having a peak in the yellow to orange wavelength range. Further, the second EL layer 107 includes a third light-emitting layer 107-1 which exhibits an emission spectrum having a peak in the blue-green to green wavelength range and a fourth light-emitting layer 107-2 which exhibits an emission spectrum having a peak in the orange to red wavelength range. Note that the first light-emitting layer 103-1 and the second light-emitting layer 103-2 may be stacked in reverse order. Note also that the third light-emitting layer 107-1 and the fourth light-emitting layer 107-2 may be stacked in reverse order.

When the anode 101 side is positively biased and the cathode 102 side is negatively biased in such a light-emitting element, holes injected from the anode 101 and electrons generated in the charge production region 106 and injected through the electron-relay layer 105 and the electron-injecting buffer 104 are recombined in the first light-emitting layer 103-1 or the second light-emitting layer 103-2, whereby first light emission 330 is obtained. Furthermore, electrons injected from the cathode 102 and holes generated in the charge production region 106 are recombined in the third light-emitting layer 107-1 or the fourth light-emitting layer 107-2, whereby second light emission 340 is obtained.

Figure 24B:
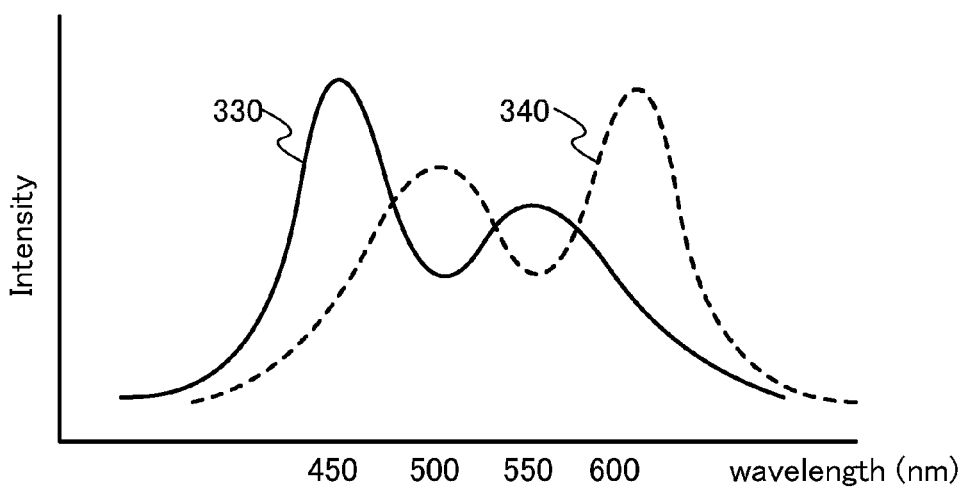

The first light emission 330 is a combination of light emission from both the first light-emitting layer 103-1 and the second light-emitting layer 103-2; thus, as shown in FIG. 24B, the first light emission 330 exhibits an emission spectrum having peaks in both the blue to blue-green wavelength range and the yellow to orange wavelength range. In other words, the first EL layer 103 exhibits light emission of a two-wavelength-type white color or a color close to white. Further, the second light emission 340 is a combination of light emission from both the third light-emitting layer 107-1 and the fourth light-emitting layer 107-2; thus, as shown in FIG. 24B, the second light emission 340 exhibits an emission spectrum having peaks in both the blue-green to green wavelength range and the orange to red wavelength range. In other words, the second EL layer 107 exhibits light emission of two-wavelength-type white color or a color close to white, which is different from the light emission of the first EL layer 103.

Accordingly, light emission which covers the blue to blue-green wavelength range, the blue-green to green wavelength range, the yellow to orange wavelength range, and the orange to red wavelength range is obtained by the light-emitting element in this embodiment, as a result of combining the first light emission 330 and the second light emission 340.

In this embodiment, even if, for example, the emission luminance of the first light-emitting layer 103-1 (which exhibits an emission spectrum having a peak in the blue to blue-green wavelength range) deteriorates over time or changes due to current density, deviation of chromaticity is relatively small because the contribution of the first light-emitting layer 103-1 with respect to the entire spectrum is approximately one quarter.

Note that, although the example has been described in which the first EL layer 103 exhibits the spectrum having peaks in both the blue to blue-green wavelength range and the yellow to orange wavelength range, and the second EL layer 107 exhibits the spectrum having peaks in both the blue-green to green wavelength range and the orange to red wavelength range, the first EL layer 103 and the second EL layer 107 each may exhibit the opposite spectrum. In other words, a structure may be employed in which the second EL layer 107 exhibits the spectrum having peaks in both the blue to blue-green wavelength range and the yellow to orange wavelength range, and the first EL layer 103 exhibits the spectrum having peaks in both the blue-green to green wavelength range and the orange to red wavelength range. In addition, each of the first EL layer 103 and the second EL layer 107 may have a structure in which layers other than the light-emitting layer are stacked.

Next, materials that can be used as a light-emitting organic compound for the EL layer of the light-emitting element described in this embodiment will be described. However, materials that can be applied to the light-emitting element described in this embodiment are not limited to those given below.

Blue to blue-green light emission can be obtained, for example, by using perylene, 2,5,8,11-tetra-t-butylperylene (abbreviation: TBP), 9,10-diphenylanthracene, or the like as a guest material, and dispersing the guest material in a suitable host material. Alternatively, the blue to blue-green light emission can be obtained from a styrylarylene derivative such as 4,4'-bis(2,2-diphenylvinyl)biphenyl (abbreviation: DPVBi), or an anthracene derivative such as 9,10-di-2-naphthylanthracene (abbreviation: DNA) or 9,10-bis(2-naphthyl)-2-t-butylanthracene (abbreviation: t-BuDNA). Further alternatively, a polymer such as poly(9,9-dioctylfluolene) may be used. Further, as a guest material for blue light emission, a styrylamine derivative is preferable. As examples of the styrylamine derivative, N,N'-bis[4-(9H-carbazol-9-yl)phenyl]-N,N'-diphenylstilbene-4,4'-diamine (abbreviation: YGA2S), N,N'-diphenyl-N,N'-bis(9-phenyl-9H-carbazol-3-yl)stilbene-4,4'-diamine (abbreviation: PCA2S), and the like can be given. In particular, YGA2S is preferable because it has a peak at around 450 nm. Further, as a host material, an anthracene derivative is preferable; 9,10-bis(2-naphthyl)-2-t-butylanthracene (abbreviation: t-BuDNA) and 9-[4-(10-phenyl-9-anthryl)phenyl]-9H-carbazole (abbreviation: CzPA) are suitable. In particular, CzPA is preferable because of its electrochemical stability.

Blue-green to green light emission can be obtained, for example, by using a coumarin dye such as coumarin 30 or coumarin 6; bis[2-(2,4-difluorophenyl)pyridinato]picolinatoiridium (abbreviation: FIrpic); bis(2-phenylpyridinato) acetylacetonatoiridium (abbreviation: Ir(ppy)$_2$(acac)); or the like as a guest material and dispersing the guest material in a suitable host material. Alternatively, the blue-green to green light emission can be obtained by dispersing perylene or TBP given above in an appropriate host material at a high concentration of greater than or equal to 5 wt %. Further alternatively, the blue-green to green light emission can be obtained from a metal complex such as BAlq, Zn(BTZ)$_2$, or bis(2-methyl-8-quinolinolato)chlorogallium (Ga(mq)$_2$Cl). Further alternatively, a polymer such as poly (p-phenylenevinylene) may be used. Further, an anthracene derivative is preferably used as a guest material of a blue-green to green light-emitting layer, in which case high emission efficiency can be obtained. For example, when 9,10-bis{4-[N-(4-diphenylamino)phenyl-N-phenyl]aminophenyl}-2-tert-butylanthracene (abbreviation: DPABPA) is used, highly efficient blue-green light emission can be obtained. Further, an anthracene derivative in which an amino group has been substituted into the 2-position is preferably used, in which case highly efficient green light emission can be obtained. In particular, N-(9,10-diphenyl-2-anthryl)-N,9-diphenyl-9H-carbazol-3-amine (abbreviation: 2PCAPA) is suitable because of its long life. As a host material for those materials, an anthracene derivative is preferable; CzPA, which is given above, is preferable because of its electrochemical stability. Further, in the case of manufacturing a light-emitting element in which green light emission and blue light emission are combined and which has two peaks in the blue to green wavelength range, an anthracene derivative having an electron-transporting property, such as CzPA is preferably used as a host material for a blue light-emitting layer and an aromatic amine compound having a hole-transporting property, such as NPB is preferably used as a host material for a green light-emitting layer, in which case light emission can be obtained at an interface between the blue light-emitting layer and the green light-emitting layer. In other words, in such a case, an aromatic amine compound like NPB is preferable as a host material for a green light-emitting material such as 2PCAPA.

Yellow to orange light emission can be obtained, for example, by using rubrene, 4-(dicyanomethylene)-2-[p-(dimethylamino)styryl]-6-methyl-4H-pyran (abbreviation: DCM1), 4-(dicyanomethylene)-2-methyl-6-(9-julolidyl) ethynyl-4H-pyran (abbreviation: DCM2), bis[2-(2-thienyl) pyridinato]acetylacetonatoiridium (abbreviation: Ir(thp)$_2$ (acac)), bis(2-phenylquinolinato)acetylacetonatoiridium (abbreviation: Ir(pq)$_2$(acac)), or the like as a guest material and dispersing the guest material in a suitable host material. In particular, a tetracene derivative such as rubrene is preferable as a guest material because of its high efficiency and chemical stability. As a host material in that case, an aromatic amine compound such as NPB is preferable. Alternatively, a metal complex such as bis(8-quinolinolato)zinc (abbreviation: Znq$_2$), bis[2-cinnamoyl-8-quinolinolato]zinc (abbreviation: Znsq$_2$), or the like can be used as a host material. Further alternatively, a polymer such as poly(2,5-dialkoxy-1,4-phenylenevinylene) may be used.

Orange to red light emission can be obtained, for example, using 4-(di cyanomethylene)-2,6-bis[p-(dimethylamino) styryl]-4H-pyran (abbreviation: BisDCM), 2-(2-{2-[4-(dimethylamino)phenyl]ethenyl}-6-methyl-4H-pyran-4-ylidene) propanedinitrile (abbreviation: DCM1), 4-(dicyanomethylene)-2-methyl-6-(9-julolidyl)ethynyl-4H-pyran (abbreviation: DCM2), bis[2-(2-thienyl)pyridinato] acetylacetonatoiridium (abbreviation: Ir(thp)$_2$(acac)), or the like as a guest material and dispersing the guest material in a suitable host material. Alternatively, the orange to red light emission can be obtained from a metal complex such as bis(8-quinolinolato)zinc (abbreviation: Znq$_2$) or bis[2-cinnamoyl-8-quinolinolato) zinc (abbreviation: Znsq$_2$). Further alternatively, a polymer such as poly(3-alkylthiophene) may be used. As a guest material which exhibits red light emission, a 4H-pyran derivative such as 4-(dicyanomethylene)-2,6-bis [p-(dimethylamino)styryl]-4H-pyran (abbreviation: Bis-DCM), 2-(2-{2-[4-(dimethylamino)phenyl]ethenyl}-6-methyl-4H-pyran-4-ylidene)propanedinitrile (abbreviation: DCM1), 4-(dicyanomethylene)-2-methyl-6-(9-julolidyl) ethynyl-4H-pyran (abbreviation: DCM2), {2-isopropyl-6-[2-(2,3,6,7-tetrahydro-1,1,7,7-tetramethyl-1H,5H-benzo[ij] quinolizin-9-yl)ethenyl]-4H-pyran-4-ylidene}propanedinitrile (abbreviation: DCJTI), or {2,6-bis [2-(2,3,6,7-tetrahydro-8-methoxy-1,1,7,7-tetramethyl-1H, 5H-benzo[ij]quinolizin-9-yl)ethenyl]-4H-pyran-4-ylidene}propanedinitrile (abbreviation: BisDCJTM) is preferable because of its high efficiency. In particular, DCJTI and BisDCJTM are preferable because they have a light emission peak at around 620 nm.

As the appropriate host material in the above-described structures, a host material which has a shorter wavelength than the light-emitting organic compound or a host material which has a large energy gap is preferably used. Specifically, a hole-transporting material or an electron-transporting material typified by the examples given in Embodiment 1 can be selected as appropriate. Alternatively, 4,4'-bis(N-carbazolyl)-biphenyl (abbreviation: CBP), 4,4',4"-tris(N-carbazolyl) triphenylamine (abbreviation: TCTA), 1,3,5-tris[4-(N-carbazolyl)phenyl]benzene (abbreviation: TCPB), or the like may be used.

White light emission which covers the blue to blue-green wavelength range, the blue-green to green wavelength range, the yellow to orange wavelength range, and the orange to red wavelength range is obtained by the light-emitting element described in this embodiment, as a result of combining the emission spectrum of the first EL layer and the emission spectrum of the second EL layer.

Note that light may be made more like natural light having a continuous emission spectrum in such a manner that the thickness of each stacked layer is adjusted and slight interference of light is deliberately caused so that generation of a projected sharp peak is suppressed and a trapezoidal emission spectrum is obtained. In addition, the position of a peak of an emission spectrum can also be changed by adjusting the thickness of each stacked layer and intentionally causing slight interference of light. By adjusting the thickness of each stacked layer so that a plurality of peak intensities which appear in an emission spectrum are made roughly the same and by decreasing the intervals between the peaks, white light emission having an emission spectrum which is closer to a trapezoidal shape can be obtained.

Note that in this embodiment, the EL layer is described in which in each of the plurality of light-emitting layers, emission colors that are complementary colors are combined to obtain white light emission. Hereinafter, a specific structure of an EL layer which exhibits white light emission by the relationship of complementary colors will be described.

The EL layer provided in the light-emitting element described in this embodiment has a structure in which, for example, a first layer containing a material having a high hole-transporting property and a first light-emitting material; a second layer containing a material having a high hole-transporting property and a second light-emitting material; and a third layer containing a material having a high electron-transporting property and the second light-emitting material are stacked in this order from the anode 101 side.

Both the first light-emitting material and the second light-emitting material should emit light in order that white light emission is obtained in the EL layers of the light-emitting element described in this embodiment. Thus, in order to adjust the transporting properties of carriers in the EL layers, both the material having a high hole-transporting property and the material having a high electron-transporting property are preferably used as host materials. Note that as the material having a high hole-transporting property or the material having a high electron-transporting property which can be used for the EL layers, the materials given as examples in Embodiment 1 can be used as appropriate.

Further, as the first light-emitting material and the second light-emitting material, materials emitting light of colors that are complementary colors can be selected. As the complementary colors, color combinations of blue and yellow, blue-green and red, and the like can be given. A material which emits blue, yellow, blue-green, or red light may be selected as appropriate from, for example, the light-emitting materials given above. Note that the emission wavelength of the first light-emitting material is made to be shorter than the emission wavelength of the second light-emitting material, whereby part of excitation energy of the second light-emitting material is transferred to the first light-emitting material, so that the first light-emitting material can be made to emit light. Thus, in the light-emitting element of this embodiment, the emission peak wavelength of the second light-emitting material is preferably shorter than the emission peak wavelength of the first light-emitting material.

In the structure of the light-emitting element described in this embodiment, both light emission from the first light-emitting material and light emission from the second light-emitting material can be obtained, and the emission color of the first light-emitting material and the emission color of the second light-emitting material are complementary colors, and accordingly white light emission can be obtained. In addition, the structure of the light-emitting element described in this embodiment is employed, whereby a light-emitting element with a long life can be obtained.

Note that the structure described in this embodiment can be combined with any of the structures described in other embodiments as appropriate.

Embodiment 6

Figure 5A:
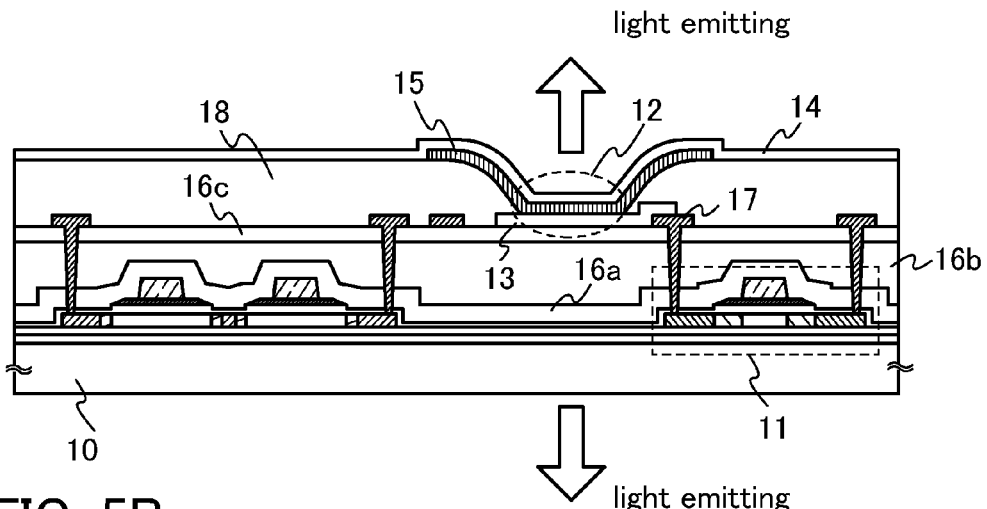
FIGS. 5A to 5C are each a cross-sectional view of an active matrix light-emitting device.
Figure 5B:
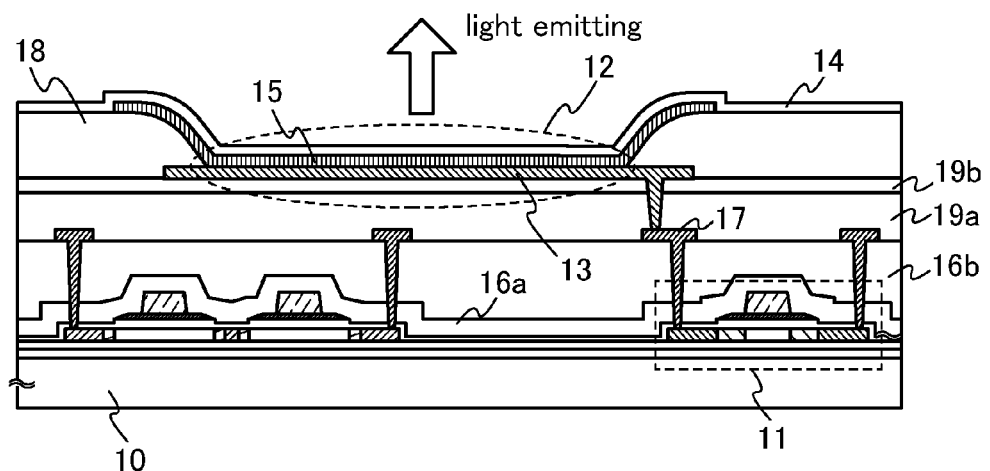
Figure 5C:
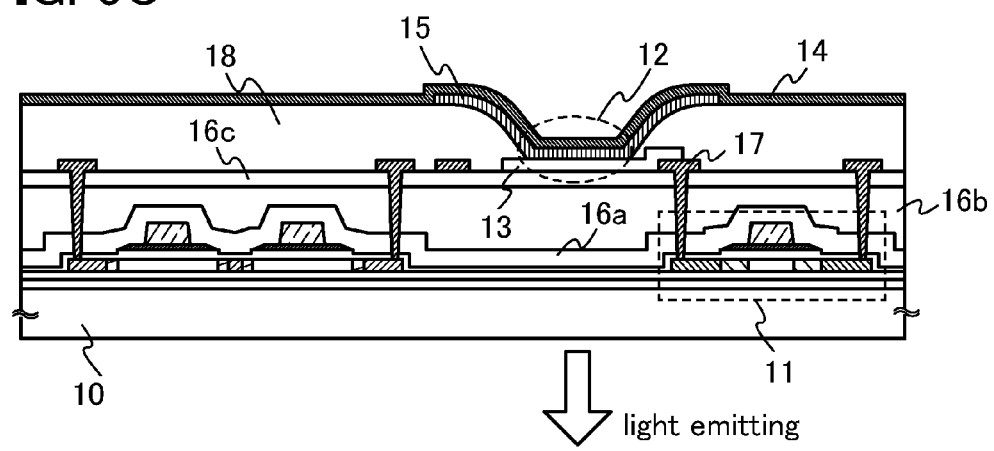

In Embodiment 6, one mode of a light-emitting device including the light-emitting element described in any of the above embodiments will be described with reference to FIGS. 5A to 5C. FIGS. 5A to 5C are cross-sectional views of light-emitting devices.

In each of FIGS. 5A to 5C, a portion surrounded by a rectangle of dotted lines corresponds to a transistor 11 which is provided for driving a light-emitting element 12. The light-emitting element 12 includes a layer 15 containing an organic compound between a first electrode 13 and a second electrode 14. The layer containing an organic compound includes n (n is a natural number of two or more) EL layers, where between m-th (m is a natural number, 1≦m≦n−1) EL layer and (m+1)-th EL layer, an electron-injecting buffer, an electron-relay layer, and a charge production region are provided in this order from an anode side. Further, in each of the EL layers, at least a light-emitting layer is provided, and a hole-injecting layer, a hole-transporting layer, an electron-transporting layer, or an electron-injecting layer is provided as appropriate in addition to the light-emitting layer. In other words, the light-emitting element 12 has a structure like the one described in any of Embodiments 1 to 4. A drain region of the transistor 11 is electrically connected to the first electrode 13 by a wiring 17 penetrating a first interlayer insulating film 16 (16a, 16b, and 16c). The light-emitting element 12 is separated from other adjacently-provided light-emitting elements by partition layers 18. The light-emitting device of this embodiment having such a structure is provided over a substrate 10 in this embodiment.

The transistor 11 illustrated in each of FIGS. 5A to 5C is a top-gate type transistor in which a gate electrode is provided on an opposite side to the substrate with a semiconductor layer interposed between the substrate and the gate electrode. However, there is no particular limitation on the structure of the transistor 11; for example, the transistor 11 may be of bottom-gate type. In the case where the transistor 11 is of bottom-gate type, the transistor 11 may have a structure in which a protective film is formed over the semiconductor layer used to form a channel (a channel protective type) or a structure in which part of the semiconductor layer used to form a channel has a depression (a channel etch type).

Further, the semiconductor layer included in the transistor 11 may be either crystalline or non-crystalline. Alternatively, a microcrystalline semiconductor, an oxide semiconductor, or the like may be used.

For the oxide semiconductor layer, composite oxide of an element selected from indium, gallium, aluminum, zinc, and tin can be used. For example, zinc oxide (ZnO), indium oxide containing zinc oxide (IZO), and oxide containing indium oxide, gallium oxide, and zinc oxide (IGZO) can be given. As a specific example of the crystalline semiconductor layer, a layer formed of single crystal or polycrystalline silicon, silicon germanium, or the like can be given. It may be formed by laser crystallization or may be formed by crystallization through a solid phase growth method using, for example, nickel.

In the case where the semiconductor layer is formed using an amorphous material, for example, amorphous silicon, it is preferable that the light-emitting device have a circuit in which the transistor 11 and other transistors (transistors constituting a circuit for driving the light-emitting element) are all n-channel transistors. Further, many oxide semiconductors, for example, zinc oxide (ZnO), indium oxide containing zinc oxide (IZO), oxide containing indium oxide, gallium oxide, and zinc oxide (IGZO), are n-type semiconductors; thus, a transistor in which any of those compounds is contained in an active layer is an n-channel transistor. In a case other than the above, a light-emitting device may have a circuit including either an n-channel transistor or a p-channel transistor, or may have a circuit including both an n-channel transistor and a p-channel transistor.

Further, the first interlayer insulating film 16 may be a multilayer as illustrated in FIGS. 5A and 5C, or may be a single layer. Note that the interlayer insulating film 16a is formed of an inorganic material such as silicon oxide or silicon nitride; the interlayer insulating film 16b is formed of acrylic, siloxane (an organic group including a skeleton of a silicon-oxygen bond (Si—O bond) and containing at least hydrogen as a substituent) or a self-planarizing material which can be formed as a film by an application method, such as silicon oxide. In addition, the interlayer insulating film 16c is formed of a silicon nitride film containing argon (Ar). Note that there is no particular limitation on the material forming each layer, and a material other than the above materials may also be used. A layer formed using a material other than the above materials may be further combined. As described above, the first interlayer insulating films 16a to 16c may be formed using either an inorganic material or an organic material, or both of them.

As for the partition layer 18, the radius of curvature of the edge portion preferably changes continuously. In addition, the partition layer 18 is formed using acrylic, siloxane, resist, silicon oxide, or the like. Note that the partition layer 18 may be formed using either an inorganic material or an organic material, or both of them.

Note that, although the structure in which only the first interlayer insulating films 16a to 16c are provided between the transistor 11 and the light-emitting element 12 is illustrated in each of FIGS. 5A and 5C, the structure illustrated in FIG. 5B may be employed in which a second interlayer insulating film 19 (19a and 19b) is provided in addition to the first interlayer insulating film 16 (16a and 16b). In the light-emitting device illustrated in FIG. 5B, the first electrode 13 penetrates the second interlayer insulating film 19 to be connected to the wiring 17.

The second interlayer insulating film 19 may be a multilayer like the first interlayer insulating film 16 or may be a single layer. The second interlayer insulating film 19a is formed of acrylic, siloxane (an organic group including a skeleton of a silicon-oxygen bond (Si—O bond) and containing at least hydrogen as a substituent), or a self-planarizing substance which can be formed as a film by an application method, such as silicon oxide. The second interlayer insulating film 19b is formed of a silicon nitride film containing argon (Ar). Note that there is no particular limitation on the material forming each layer, and a material other than the above materials may also be used. A layer formed of a material other than the above materials may be further combined. As described above, the second interlayer insulating film 19 may be formed using either an inorganic material or an organic material, or both of them.

In the case where both the first electrode and the second electrode in the light-emitting element 12 are formed using a light-transmitting material, emitted light can be extracted from both the first electrode 13 and the second electrode 14 as indicated by the outline arrows in FIG. 5A. In addition, in the case where only the second electrode 14 is formed using a light-transmitting material, emitted light can be extracted from only the second electrode 14 as indicated by the outline arrow in FIG. 5B. In that case, the first electrode 13 is preferably formed using a material having high reflectivity, or a film formed using a material having high reflectivity (reflective film) is preferably provided under the first electrode 13. Furthermore, in the case where only the first electrode 13 is formed using a light-transmitting material, emitted light can be extracted from only the first electrode 13 as indicated by the outline arrow in FIG. 5C. In that case, the second electrode 14 is preferably formed using a material having high reflectivity, or a reflective film is preferably formed above the second electrode 14.

Further, in the light-emitting element 12, the layer 15 may be stacked so that the light-emitting element 12 is driven when a voltage is applied so that the potential of the second electrode 14 becomes higher than that of the first electrode 13, or the layer 15 may be stacked so that the light-emitting element 12 is driven when a voltage is applied so that the potential of the second electrode 14 becomes lower than that of the first electrode 13. In the former case, the transistor 11 is an n-channel transistor, while in the latter case, the transistor 11 is a p-channel transistor.

Note that, although only one light-emitting element is illustrated in each of the cross-sectional views of FIGS. 5A to 5C, a plurality of light-emitting elements are arranged in matrix in a pixel portion. Further, in the case where color display of color components, R (red), G (green), and B (blue), is performed, a plurality of light-emitting elements which provide three kinds of light emissions (R, G, and B) are formed in the pixel portion. In addition, the color components are not limited to three colors, and color components of four colors or more may be used or a color other than R, and B may be used. For example, white may be added so that R, G, B, and W (W means white) can be used.

As a manufacturing method of light-emitting elements of different color components, the following method can be used: a method in which EL layers of different colors are separately arranged; a method in which all EL layers are formed so as to emit white light and the EL layers are combined with color filters, whereby light-emitting elements of different color components are obtained; a method in which all EL layers are formed so as to emit blue light or light with a shorter wavelength than blue light and the EL layers are combined with color conversion layers, whereby light-emitting elements of different color components are obtained; or the like.

Figure 6A:
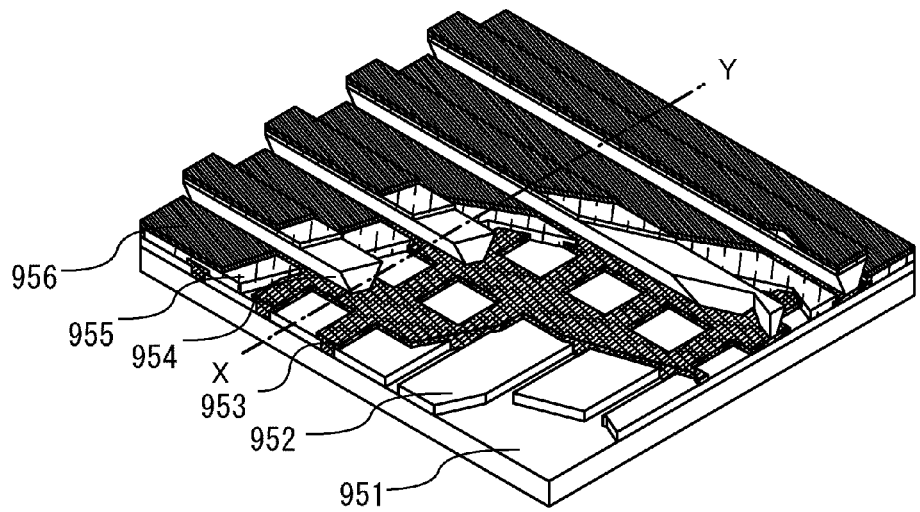
FIGS. 6A and 6B are views illustrating a passive matrix light-emitting device.

As described above, in this embodiment, an active matrix light-emitting device in which the driving of the light-emitting element is controlled by the transistor is described. However, a passive matrix light-emitting device in which a light-emitting element is driven without providing an element for driving, such as a transistor, over the same substrate as the light-emitting element may be employed. FIG. 6A is a perspective view of a passive matrix light-emitting device manufactured by application of the light-emitting element described in any of Embodiments 1 to 4. In addition, FIG. 6B is a cross-sectional view taken along a dashed line X-Y of FIG. 6A.

Figure 6B:
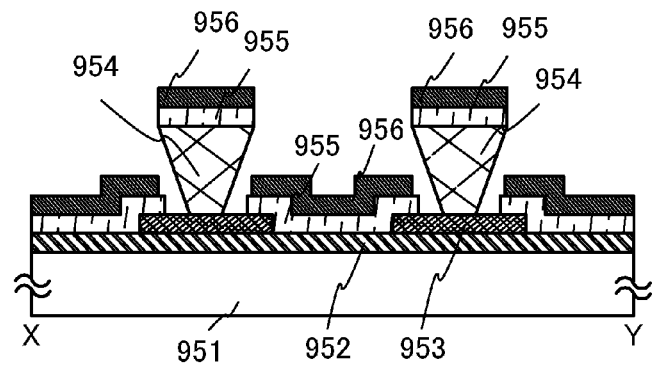

In FIGS. 6A and 6B, over a substrate 951, a layer 955 containing an organic compound is provided between an electrode 952 and an electrode 956. The layer containing an organic compound includes n (n is a natural number of two or more) EL layers, where between m-th (m is a natural number, $1 \leq m \leq n-1$) EL layer and (m+1)-th EL layer, an electron-injecting buffer, an electron-relay layer, and a charge production region are provided in this order from an anode side. Further, in each of the EL layers, at least a light-emitting layer is provided, and a hole-injecting layer, a hole-transporting layer, an electron-transporting layer, or an electron-injecting layer is provided as appropriate in addition to the light-emitting layer. End portions of the electrode 952 are covered with an insulating layer 953. Then, a partition layer 954 is provided over the insulating layer 953. The partition layer 954 preferably has tapered sidewalls with such a slope that the distance between opposite sidewalls decreases toward the substrate surface. In other words, a cross section of the partition layer 954 in the direction of a narrow side is trapezoidal, and a base (a side facing in a similar direction to a plane direction of the insulating layer 953 and being in contact with the insulating layer 953) is shorter than an upper side (a side facing in a similar direction to the plane direction of the insulating layer 953 and not being in contact with the insulating layer 953). The partition layer 954 is provided in this manner, whereby a defect of the light-emitting element due to static electricity or the like can be prevented. The passive matrix light-emitting device can also be driven with low power consumption when it includes the light-emitting element described in any of Embodiments 1 to 4.

The light-emitting element described as an example in any of the above embodiments is used in the light-emitting device described in this embodiment; thus, the light-emitting device can have high luminance, can be driven at low voltage, and consumes less power.

Embodiment 7

In Embodiment 7, electronic devices each of which includes, as part thereof, the light-emitting device described in Embodiment 6 will be described. Electronic devices described in Embodiment 7 each include a display portion which includes the light-emitting element described in any of Embodiments 1 to 4, has high luminance, is driven at low voltage, and consumes less power.

As examples of the electronic devices of this embodiment, the following can be given: cameras such as video cameras and digital cameras, goggle type displays, navigation systems, audio replay devices (e.g., car audio systems and audio systems), computers, game machines, portable information terminals (e.g., mobile computers, cellular phones, portable game machines, and electronic book readers), image replay devices in which a recording medium is provided (specifically, devices that are capable of replaying recording media such as digital versatile discs (DVDs) and equipped with a display device that can display an image), and the like. Specific examples of those electronic devices are illustrated in FIGS. 7A to 7E.

Figure 7A:
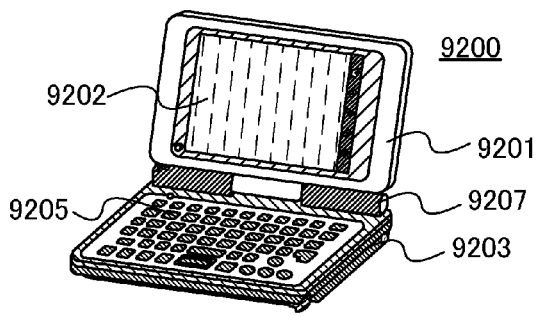
FIGS. 7A to 7E are diagrams each illustrating an electronic device.

FIG. 7A illustrates an example of a portable information terminal device 9200. The portable information terminal device 9200 incorporates a computer and therefore can process a variety of types of data. As an example of the portable information terminal device 9200, a personal digital assistant (PDA) can be given.

The portable information terminal device 9200 has two housings: a housing 9201 and a housing 9203. The housing 9201 and the housing 9203 are joined with a joining portion 9207 such that the portable information terminal device 9200 can be foldable. A display portion 9202 is incorporated in the housing 9201, and the housing 9203 is provided with a keyboard 9205. Needless to say, the structure of the portable information terminal device 9200 is not limited to the one described above, and the portable information terminal device 9200 may be provided with other accessories as appropriate. In the display portion 9202, light-emitting elements similar to those described in any of the above embodiments are arranged in matrix. The light-emitting elements have features of high luminance, low driving voltage, and low power consumption. The display portion 9202 including those light-emitting elements also has similar features; thus, low power consumption of this portable information terminal device can be achieved.

Figure 7B:
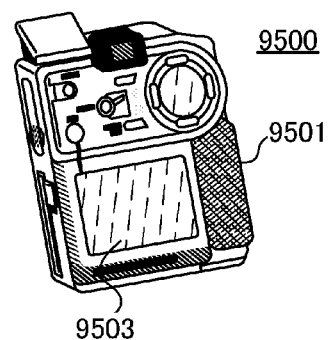

FIG. 7B illustrates an example of a digital video camera 9500 according to this embodiment. The digital video camera 9500 includes a display portion 9503 incorporated in a housing 9501 and various operation portions. Note that the structure of the digital video camera 9500 is not particularly limited and the digital video camera 9500 may be provided with other accessories as appropriate.

In this digital video camera, the display portion 9503 includes light-emitting elements similar to those described in any of the above embodiments, which are arranged in matrix. The light-emitting elements have features of low driving voltage, high luminance, and low power consumption. The display portion 9503 including those light-emitting elements also has similar features; therefore, low power consumption of this digital video camera can be achieved.

Figure 7C:
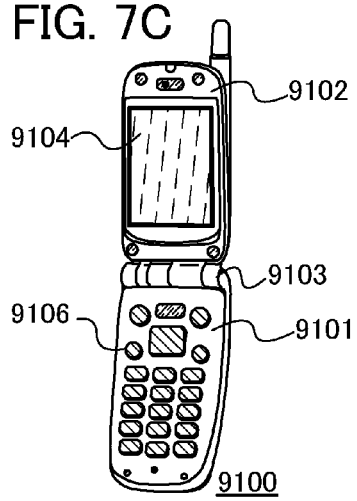

FIG. 7C illustrates an example of a cellular phone 9100 according to this embodiment. The cellular phone 9100 has two housings: a housing 9102 and a housing 9101. The housing 9102 and the housing 9101 are joined with a joining portion 9103 such that the cellular phone can be foldable. A display portion 9104 is incorporated in the housing 9102, and the housing 9101 is provided with operation keys 9106. Note that the structure of the cellular phone 9100 is not particularly limited and the cellular phone 9100 may be provided with other accessories as appropriate.

In this cellular phone, the display portion 9104 includes light-emitting elements similar to those described in any of the above embodiments, which are arranged in matrix. The light-emitting elements have features of high luminance, low driving voltage, and low power consumption. The display portion 9104 including those light-emitting elements also has similar features; therefore, low power consumption of this cellular phone can be achieved. As a backlight of a display provided for a cellular phone or the like, the light-emitting element described in any of the above embodiments may be used.

Figure 7D:
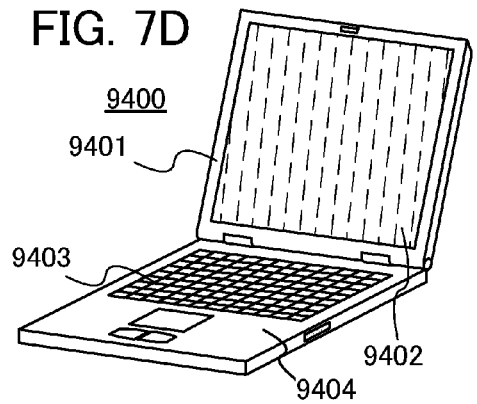

FIG. 7D illustrates an example of a portable computer 9400. The computer 9400 has two housings: a housing 9401 and a housing 9404 that are joined such that the computer 9400 can be opened and closed. A display portion 9402 is incorporated in the housing 9401, and the housing 9404 is provided with a key board 9403 and the like. Note that the structure of the computer 9400 is not particularly limited and the computer 9400 may be provided with other accessories as appropriate.

In this computer, the display portion 9402 includes light-emitting elements similar to those described in the any of above embodiments, which are arranged in matrix. The light-emitting elements have features of high luminance, low driving voltage, and low power consumption. The display portion 9402 including those light-emitting elements also has similar features; therefore, low power consumption of this computer can be achieved.

Figure 7E:
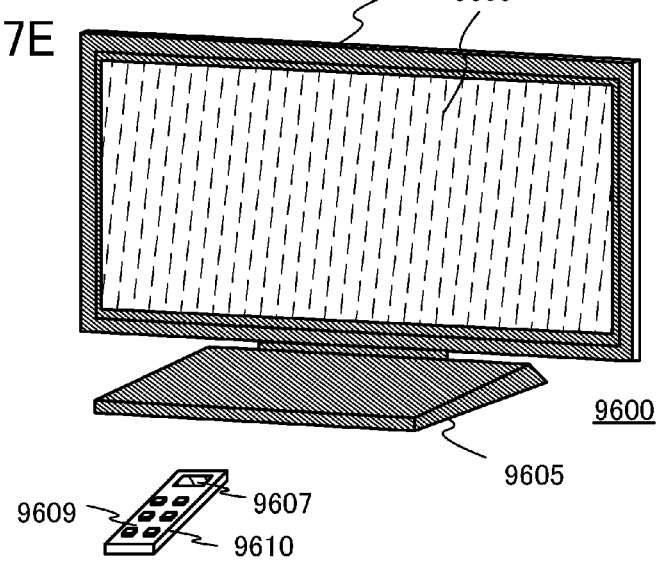

FIG. 7E illustrates an example of a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels can be selected and volume can be controlled with an operation key 9609 of the remote controller 9610, whereby images displayed on the display portion 9603 can be controlled. Furthermore, the remote controller 9610 may be provided with a display portion 9607 for displaying information outputted from the remote controller 9610.

Note that the television set 9600 is provided with a receiver, a modem, and the like. With the use of the receiver, a general television broadcast can be received. Moreover, when the television set is connected to a communication network with or without wires via the modem, one-way (from a sender to a receiver) or two-way (between a sender and a receiver or between receivers) information communication can be performed.

In at least one of the display portion 9603 and the display portion 9607 of this television set, light-emitting elements similar to those described in any of the above embodiments are arranged in matrix. The light-emitting elements have features of high luminance, low driving voltage, and low power consumption. The display portion including those light-emitting elements also has the similar features.

As described above, the application range of the light-emitting device described in the above embodiment is so wide that this light-emitting device can be applied to electronic devices in all fields. With use of the light-emitting elements described in Embodiments 1 to 4, an electronic device having a low power consumption display portion which exhibits high luminance light emission can be provided.

Further, the light-emitting device described in the above embodiment can also be used as a lighting device. An embodiment in which the light-emitting device described in the above embodiment is used as a lighting device will be described with reference to FIG. 8.

Figure 8:
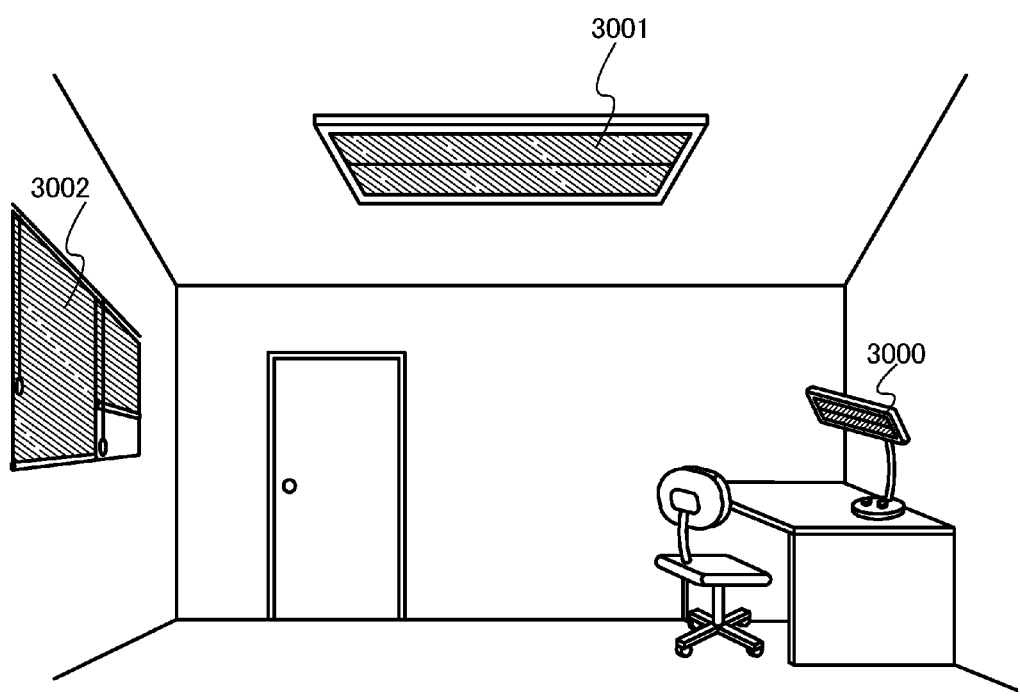
FIG. 8 is a diagram illustrating lighting devices.

FIG. 8 illustrates an example in which the light-emitting device, an example of which is described in the above embodiment, is used as a table lamp that is a lighting device and an interior lighting device. The table lamp illustrated in FIG. 8 includes a light source 3000. For the light source 3000, the light-emitting device, an example of which is described in the above embodiment is used. Thus, a low power consumption light-emitting device can be obtained. Since this light-emitting device can have a larger area, the light-emitting device can be used as a lighting device having a large area. In addition, this light-emitting device is thin and consumes less power and therefore can be used as a lighting device which achieves reduction in thickness and power consumption of the lighting device. Moreover, this light-emitting device can be flexible and therefore can be used as, for example, a roll-type lighting device like a lighting device 3002. As described above, the television set described with reference to FIG. 7E can be installed in a room where the light-emitting device described in this embodiment is used as the indoor lighting devices 3001 and 3002.

As described above, the application range of the light-emitting device described in Embodiment 6 is so wide that the light-emitting device can be applied to electronic devices in all fields. Note that this embodiment can be combined with any of Embodiments 1 to 5 as appropriate.

Example 1

In Example 1, a light-emitting element that is one embodiment of the present invention will be described with reference to FIGS. 9A and 9B. Chemical formulae of the materials used in this example and Examples 2 to 6 are shown below.

[Chemical formula 1]

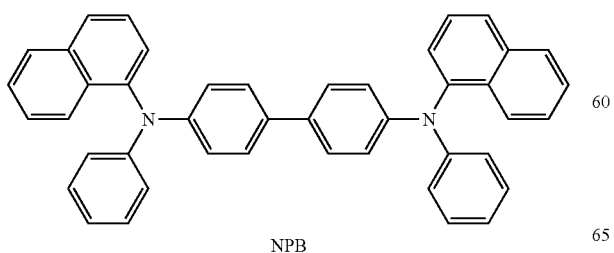

NPB

-continued

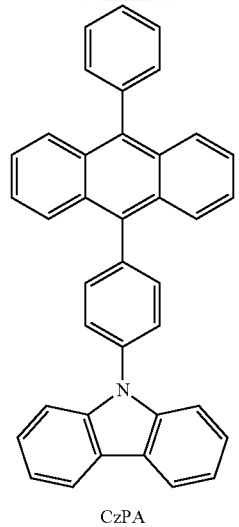

CzPA

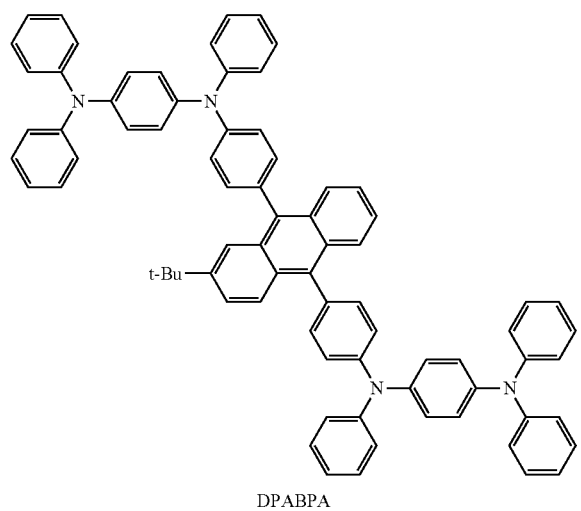

DPABPA

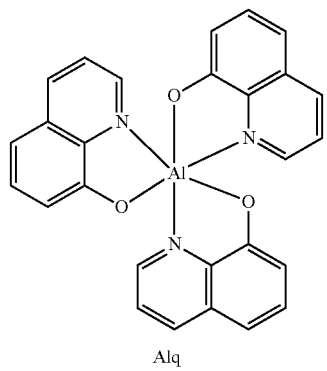

Alq

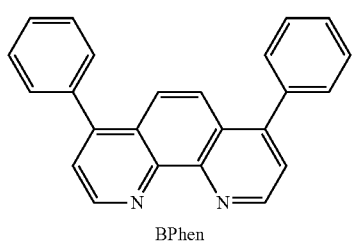

BPhen

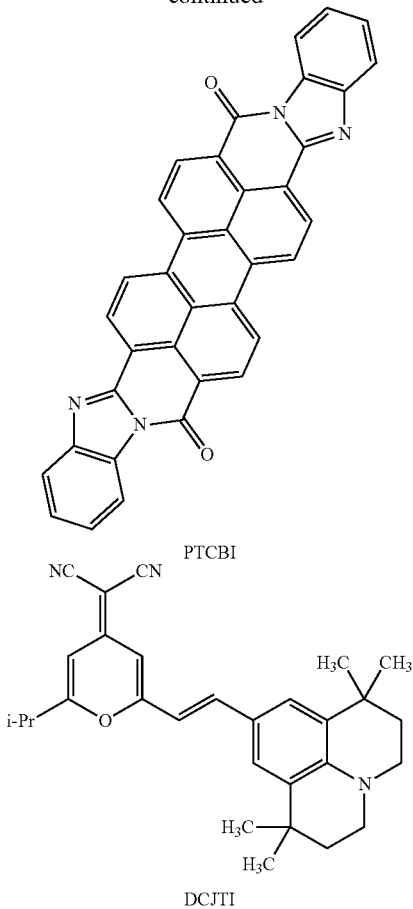

PTCBI

DCJTI

A method for manufacturing a light-emitting element 1 and a reference light-emitting element 1 in this example will be described below.

First, the light-emitting element 1 will be described (see FIG. 9A). Indium tin oxide containing silicon oxide was deposited over a glass substrate 2100 by a sputtering method to form a first electrode 2101. The first electrode 2102 has a thickness of 110 nm and an area of 2 mm×2 mm.

Next, the substrate on which the first electrode 2101 was formed was fixed to a substrate holder provided in a vacuum evaporation apparatus in such a way that a surface of the substrate on which the first electrode 2101 was formed faced downward, and then the pressure was reduced to about $10^{-4}$ Pa. After that, 4,4'-bis[N-(1-naphthyl)-N-phenylamino]biphenyl (abbreviation: NPB) that is a material having a high hole-transporting property and molybdenum(VI) oxide that is an acceptor material were co-evaporated on the first electrode 2101 to form a first charge production region 2103a containing a composite material of an organic compound and an inorganic compound. The thickness of the first charge production region 2103a was 50 nm. The weight ratio of NPB to molybdenum(VI) oxide was adjusted to be 4:1 (=NPB:molybdenum oxide). Note that the co-evaporation method is an evaporation method in which evaporation is carried out from a plurality of evaporation sources at the same time in one treatment chamber.

Next, NPB was deposited to a thickness of 10 nm on the first charge production region 2103a by an evaporation method using resistance heating to form a hole-transporting layer 2103b.

Furthermore, 9-[4-(N-carbazolyl)]phenyl-10-phenylanthracene (abbreviation: CzPA) and 9,10-bis{4-[N-(4-diphenylamino)phenyl-N-phenyl]aminophenyl}-2-tert-butylanthracene (abbreviation: DPABPA) were co-evaporated to form a light-emitting layer 2103c with a thickness of 30 nm on the hole-transporting layer 2103b. Here, the weight ratio of CzPA to DPABPA was adjusted to be 1:0.1 (=CzPA:DPABPA). Note that CzPA is a material having an electron-transporting property and DPABPA that is a guest material is a material exhibiting blue-green light emission.

After that, tris(8-quinolinolato)aluminum (abbreviation: Alq) was deposited on the light-emitting layer 2103c to a thickness of 10 nm by an evaporation method using resistance heating to form an electron-transporting layer 2103d. Accordingly, a first EL layer 2103 including the first charge production region 2103a, the hole-transporting layer 2103b, the light-emitting layer 2103c, and the electron-transporting layer 2103d was formed.

Next, bathophenanthroline (abbreviation: BPhen) and lithium (Li) were co-evaporated to form an electron-buffer 2104 with a thickness of 10 nm on the electron-transporting layer 2103d. Here, the weight ratio of BPhen to Li was adjusted to be 1:0.02 (=BPhen:Li).

Next, 3,4,9,10-perylenetetracarboxylic-bis-benzimidazole (abbreviation: PTCBI) was evaporated to form an electron-relay layer 2105 with a thickness of 3 nm on the electron-injecting buffer 2104. Note that the LUMO level of PTCBI is approximately −4.0 eV according to the result of cyclic voltammetry (CV).

Next, NBP that is a material having a high hole-transporting property and molybdenum(VI) oxide that is an acceptor material were co-evaporated on the electron-relay layer 2105 to form a second charge production region 2106. The thickness of the second charge production region 2106 was 20 nm. The weight ratio of NPB to molybdenum(VI) oxide was adjusted to be 4:1 (=NPB:molybdenum oxide).

Next, a second EL layer 2107 was formed on the second charge production region 2106. A method for manufacturing the second EL layer 2107 will be described below. First, NPB was deposited to a thickness of 10 nm on the second charge production region 2106 to form a hole-transporting layer 2107a by an evaporation method using resistance heating.

After that, tris(8-quinolinolato)aluminum (abbreviation: Alq) and 4-dicyanomethylene-2-isopropyl-6-[2-(1,1,7,7-tetramethyl-2,3,6,7-tetrahydro-1H,5H-benzo[ij]quinolidin-9-yl)ethenyl]-4H-pyran (abbreviation: DCJTI) were co-evaporated to form a light-emitting layer 2107b with a thickness of 40 nm on the hole-transporting layer 2107a. Here, the weight ratio of Alq to DCJTI was adjusted to be 1:0.01 (=Alq:DCJTI). Note that Alq is a material having an electron-transporting property and DCJTI that is a guest material is a material exhibiting red light emission.

Next, Alq with a thickness of 10 nm and BPhen with a thickness of 20 nm were stacked on the light-emitting layer 2107b by evaporation to form an electron-transporting layer 2107c. Then, lithium fluoride (LiF) was evaporated to a thickness of 1 nm on the electron-transporting layer 2107c to form an electron-injecting layer 2107d. Accordingly, the second EL layer 2107 including the hole-transporting layer 2107a, the light-emitting layer 2107b, the electron-transporting layer 2107c, and the electron-injecting layer 2107d was formed.

Lastly, aluminum was deposited to a thickness of 200 nm on the electron-injecting layer 2107d by an evaporation method using resistance heating to form a second electrode 2102. Accordingly, the light-emitting element 1 was manufactured.

Next, the reference light-emitting element 1 will be described (see FIG. 9B). The reference light-emitting element 1 has the structure of the light-emitting element 1, from which the electron-relay layer 2105 is removed. The other layers were formed by manufacturing methods similar to those of the light-emitting element 1. As for the reference light-emitting element 1, after the electron-injecting buffer 2104 was formed, the second charge production region 2106 was formed on the electron-injecting buffer 2104. Accordingly, the reference light-emitting element 1 of this example was obtained.

Table 1 below shows the element structures of the light-emitting element 1 and the reference light-emitting element 1.

TABLE 1

| | 2101 | 2103 | | | | 2104 | 2105 | 2106 |
| | | 2103a | 2103b | 2103c | 2103d | | | |
|---|---|---|---|---|---|---|---|---|
| Light-emitting element 1 | ITSO 110 nm | NPB:MoOx (=4:1) 50 nm | NPB 10 nm | CzPA:DPABPA (=1:0.1) 30 nm | Alq 10 nm | BPhen:Li (=1:0.02) 10 nm | PTCBI 3 nm | NPB:MoOx (=4:1) 20 nm |
| Reference light-emitting element 1 | ITSO 110 nm | NPB:MoOx (=4:1) 50 nm | NPB 10 nm | CzPA:DPABPA (=1:0.1) 30 nm | Alq 10 nm | BPhen:Li (=1:0.02) 10 nm | — | NPB:MoOx (=4:1) 20 nm |

| | 2107 | | | | | 2102 |
| | 2107a | 2107b | 2107c | | 2107d | |
|---|---|---|---|---|---|---|
| Light-emitting element 1 | NPB 10 nm | Alq:DCJTI (=1:0.01) 40 nm | Alq 10 nm | BPhen 20 nm | LiF 1 nm | Al 200 nm |
| Reference light-emitting element 1 | NPB 10 nm | Alq:DCJTI (=1:0.01) 40 nm | Alq 10 nm | BPhen 20 nm | LiF 1 nm | Al 200 nm |

The thus obtained light-emitting element 1 and reference light-emitting element 1 were sealed in a glove box under a nitrogen atmosphere so that they were not exposed to atmospheric air. After that, the operating characteristics of these light-emitting elements were measured. The measurement was carried out at room temperature (under an atmosphere in which the temperature was kept at 25° C.).

Figure 10:
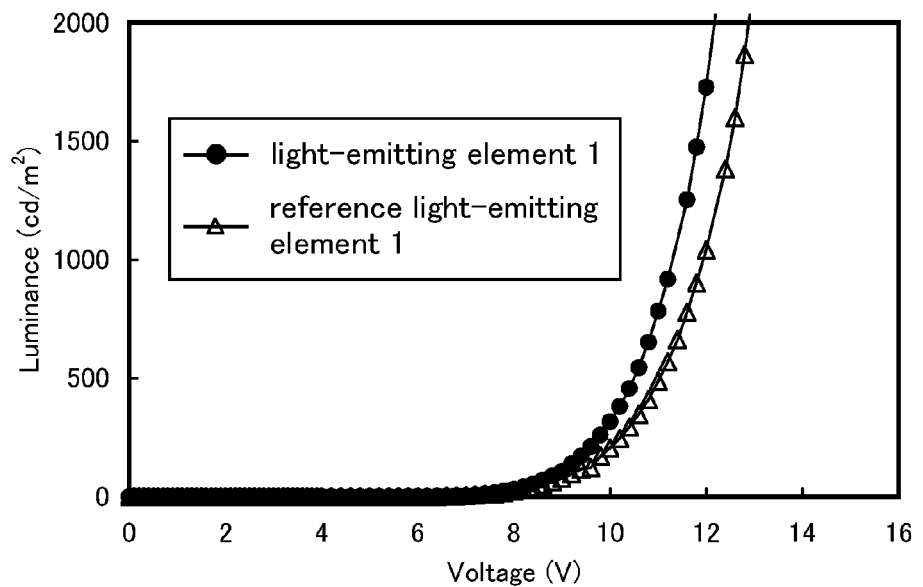
FIG. 10 is a graph showing characteristics of light-emitting elements of Example 1.
Figure 11:
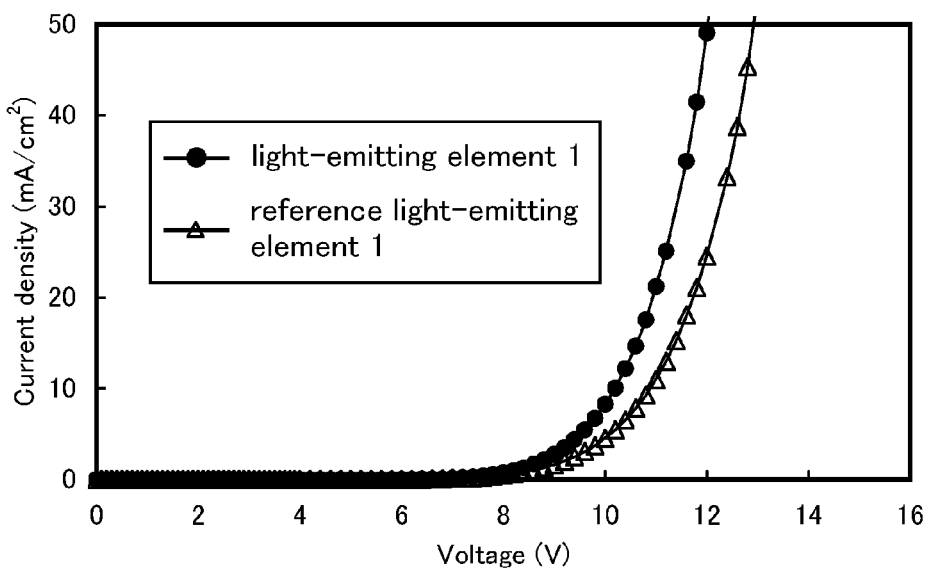
FIG. 11 is a graph showing characteristics of the light-emitting elements of Example 1.

FIG. 10 shows voltage-luminance characteristics of the light-emitting element 1 and the reference light-emitting element 1. In FIG. 10, the horizontal axis represents applied voltage (V) and the vertical axis represents luminance (cd/m$^2$). In addition, FIG. 11 shows current density-luminance characteristics. In FIG. 11, the horizontal axis represents voltage (V) and the vertical axis represents current density (mA/cm$^2$). Moreover, Table 2 below shows initial values of main characteristics of the light-emitting element 1 and the reference light-emitting element 1 at around 1000 cd/m$^2$.

TABLE 2

| | Voltage (V) | Chromaticity (x, y) | Current efficiency (cd/A) |
|---|---|---|---|
| Light-emitting element 1 | 11 | (0.31, 0.28) | 3.7 |
| Reference light-emitting element 1 | 12 | (0.32, 0.29) | 4.2 |

Note that, as seen from CIE chromaticity coordinates of Table 2, the light-emitting element 1 and the reference light-emitting element 1 both exhibit white light emission. That is because blue-green light emission derived from DPABPA contained in the first EL layer 2103 and red light emission derived from DCJTI contained in the second EL layer 2107 were both obtained.

According to FIG. 10, the light-emitting element 1 in which the electron-relay layer is provided can have higher luminance than the reference light-emitting element 1 when the same voltage is applied to these light-emitting elements. In addition, according to FIG. 11, the light-emitting element 1 has a higher current density than the reference light-emitting element 1.

Accordingly, it was confirmed that the light-emitting element 1 of this example had characteristics as a light-emitting element and functioned well. In addition, it was confirmed that the light-emitting element 1 was a light-emitting element capable of being driven at low voltage.

Example 2

Figure 12A:
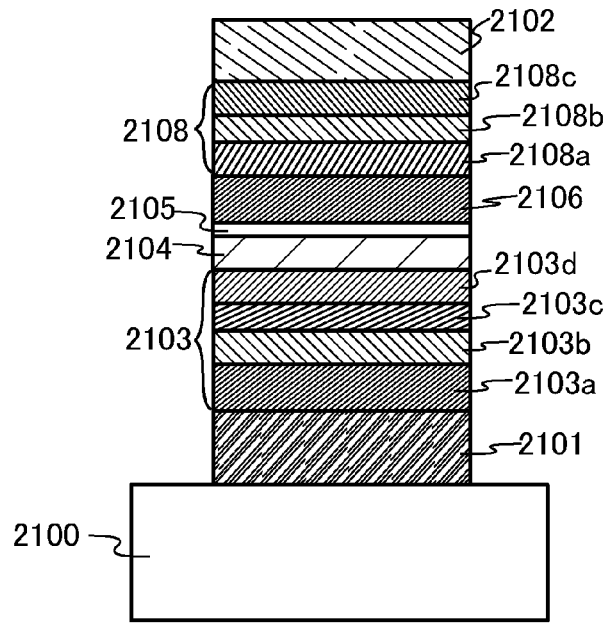
FIGS. 12A and 12B are views illustrating structures of a light-emitting element and a reference light-emitting element of Examples.
Figure 12B:
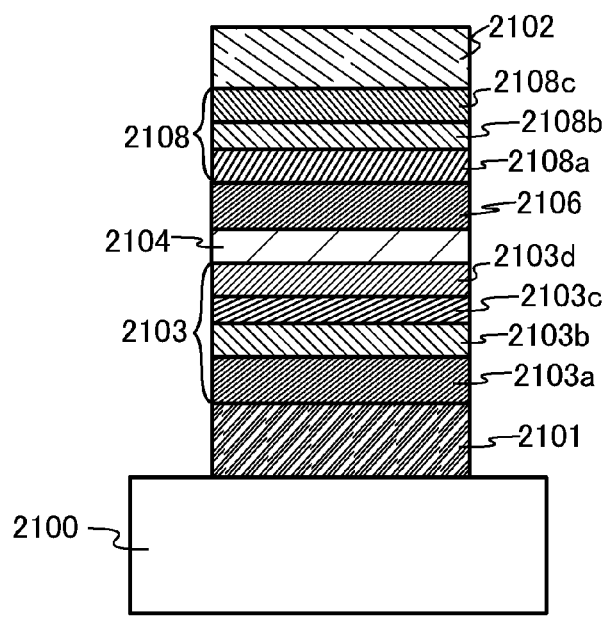

In Example 2, a light-emitting element that is one embodiment of the present invention will be described with reference to FIGS. 12A and 12B. Note that as for a light-emitting element and a reference light-emitting element described in this example, the same or similar parts as/to or parts having the same or similar functions as/to those described in Example 1 are denoted by the same reference numerals as those of Example 1, and the description of them will not be repeated.

Hereinafter, a method for manufacturing a light-emitting element 2 and a reference light-emitting element 2 of this example will be described.

First, the light-emitting element 2 will be described (see FIG. 12A). The light-emitting element 2 of this example was manufactured in a manner similar to that of the light-emitting element 1 described in Example 1 up to the formation of the electron-relay layer 2105. In the light-emitting element 2 of this example, molybdenum(VI) oxide that is an acceptor material with a thickness of 20 nm and NPB that is a material having a high hole-transporting property with a thickness of 10 nm were stacked on the electron-relay layer 2105 by evaporation to form the second charge production region 2106.

Next, a second EL layer 2108 was formed on the second charge production region 2106. A method for manufacturing the second EL layer 2108 will be described below. First, Alq and DCJTI were co-evaporated to form a light-emitting layer 2108a with a thickness of 40 nm on the second charge production region 2106. Here, the weight ratio of Alq to DCJTI was adjusted to be 1:0.01 (=Alq:DCJTI). Note that Alq is a material having an electron-transporting property and DCJTI that is a guest material is a material exhibiting red light emission.

Next, Alq with a thickness of 10 nm and BPhen with a thickness of 20 nm were stacked on the light-emitting layer 2108a by evaporation to form an electron-transporting layer 2108b. Then, lithium fluoride (LiF) was evaporated to a thickness of 1 nm on the electron-transporting layer 2108b to form an electron-injecting layer 2108c. Accordingly, the second EL layer 2108 including the light-emitting layer 2108a, the electron-transporting layer 2108b, and the electron-injecting layer 2108c was formed.

Lastly, aluminum was deposited on the electron-injecting layer 2108c to a thickness of 200 nm by an evaporation method using resistance heating to form the second electrode 2102. Accordingly, the light-emitting element 2 was manufactured.

Next, the reference light-emitting element 2 will be described (see FIG. 12B). The reference light-emitting element 2 of this example has the structure of the light-emitting element 2, from which the electron-relay layer 2105 is removed. The other layers were formed by manufacturing methods similar to those of the light-emitting element 2. As for the reference light-emitting element 2, after the electron-injecting buffer 2104 was formed, the second charge production region 2106 was formed on the electron-injecting buffer 2104. Accordingly, the reference light-emitting element 2 of this example was obtained.

Table 3 below shows the element structures of the light-emitting element 2 and the reference light-emitting element 2.

The thus obtained light-emitting element 2 and reference light-emitting element 2 were sealed in a glove box under a nitrogen atmosphere so that they were not exposed to atmospheric air. After that, the operating characteristics of these light-emitting elements were measured. The measurement was carried out at room temperature (under an atmosphere in which the temperature was kept at 25° C.).

Figure 13:
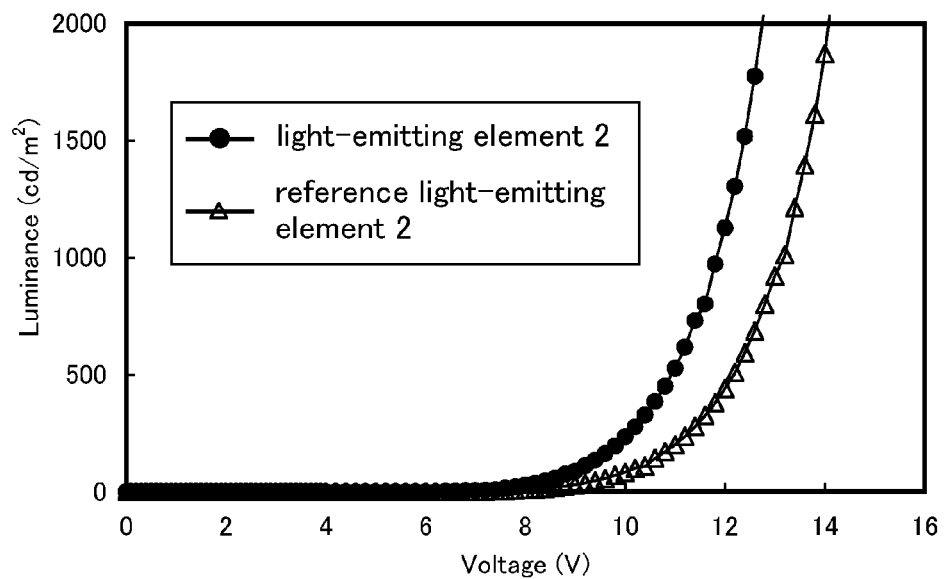
FIG. 13 is a graph showing characteristics of light-emitting elements of Example 2.
Figure 14:
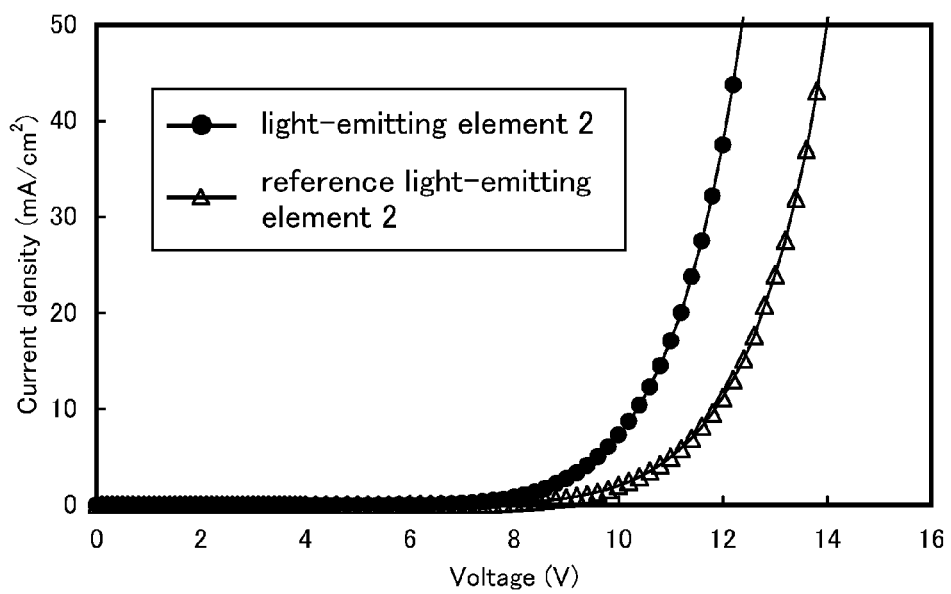
FIG. 14 is a graph showing characteristics of the light-emitting elements of Example 2.

FIG. 13 shows voltage-luminance characteristics of the light-emitting element 2 and the reference light-emitting element 2. In FIG. 13, the horizontal axis represents applied voltage (V) and the vertical axis represents luminance (cd/m$^2$). In addition, FIG. 14 shows current density-luminance characteristics. In FIG. 14, the horizontal axis represents voltage (V) and the vertical axis represents current density (mA/cm$^2$). Moreover, Table 4 shows initial values of main characteristics of the light-emitting element 2 and the reference light-emitting element 2 at around 1000 cd/m$^2$.

TABLE 4

|  | Voltage (V) | Chromaticity (x, y) | Current efficiency (cd/A) |
|---|---|---|---|
| Light-emitting element 2 | 12 | (0.31, 0.27) | 3 |
| Reference light-emitting element 2 | 13 | (0.31, 0.29) | 3.8 |

Note that, as seen from CIE chromaticity coordinates of Table 4, the light-emitting element 2 and the reference light-emitting element 2 both exhibit white light emission. That is because blue-green light emission derived from DPABPA contained in the first EL layer 2103 and red light emission derived from DCJTI contained in the second EL layer 2108 were both obtained.

According to FIG. 13, the light-emitting element 2 in which the electron-relay layer is provided can have higher luminance than the reference light-emitting element 2 when the same voltage is applied to these light-emitting elements. In addition, according to FIG. 14, the light-emitting element 2 has a higher current density than the reference light-emitting element 2.

Accordingly, it was confirmed that the light-emitting element 2 of this example had characteristics as a light-emitting element and functioned well. In addition, it was confirmed that the light-emitting element 2 was a light-emitting element capable of being driven at low voltage.

TABLE 3

|  | 2101 | 2103 | | | | 2104 | 2105 | 2106 | |
|---|---|---|---|---|---|---|---|---|---|
|  |  | 2103a | 2103b | 2103c | 2103d |  |  |  |  |
| Light-emitting element 2 | ITSO 110 nm | NPB:MoOx (=4:1) 50 nm | NPB 10 nm | CzPA:DPABPA (=1:0.1) 30 nm | Alq 10 nm | BPhen:Li (=1:0.02) 10 nm | PTCBI 3 nm | MoOx 20 nm | NPB 10 nm |
| Reference light-emitting element 2 | ITSO 110 nm | NPB:MoOx (=4:1) 50 nm | NPB 10 nm | CzPA:DPABPA (=1:0.1) 30 nm | Alq 10 nm | BPhen:Li (=1:0.02) 10 nm | — | MoOx 20 nm | NPB 10 nm |

|  | 2108 | | | 2102 |
|---|---|---|---|---|
|  | 2108a | 2108b | 2108c |  |
| Light-emitting element 2 | Alq:DCJTI (=1:0.01) 40 nm | Alq 10 nm / BPhen 20 nm | LiF 1 nm | Al 200 nm |
| Reference light-emitting element 2 | Alq:DCJTI (=1:0.01) 40 nm | Alq 10 nm / BPhen 20 nm | LiF 1 nm | Al 200 nm |

Example 3

In Example 3, a light-emitting element that is one embodiment of the present invention will be described with reference to FIGS. 9A and 9B. Note that as for a light-emitting element and a reference light-emitting element described in this example, the same or similar parts as/to or parts having the same or similar functions as/to those described in above Examples are denoted by the same reference numerals as those of above Examples, and the description of them will not be repeated.

Hereinafter, a method for manufacturing a light-emitting element 3 and a reference light-emitting element 3 of this example will be described.

First, the light-emitting element 3 will be described (see FIG. 9A). The light-emitting element 3 of this example was manufactured in a manner similar to that of the light-emitting element 1 described in Example 1, except for the electron-transporting layer 2103$d$ of the first EL layer 2103 and the electron-injecting buffer 2104. As for the light-emitting element 3 of this example, Alq with a thickness of 10 nm and BPhen with a thickness of 10 nm were stacked on the light-emitting layer 2103$c$ to form the electron-transporting layer 2103$d$.

Next, lithium oxide (LiO$_2$) was evaporated to a thickness of 0.1 nm on the electron-transporting layer 2103$d$ to form the electron-injecting buffer 2104. Accordingly, the light-emitting element 3 of this example was obtained.

Next, the reference light-emitting element 3 will be described (see FIG. 9B). The reference light-emitting element 3 of this example has the structure of the light-emitting element 3, from which the electron-relay layer 2105 is removed. The other layers were formed by manufacturing methods similar to those of the light-emitting element 3. As for the reference light-emitting element 3, after the electron-injecting buffer 2104 was formed, the second charge production region 2106 was formed on the electron-injecting buffer 2104. Accordingly, the reference light-emitting element 3 of this example was obtained.

Table 5 below shows the element structures of the light-emitting element 3 and the reference light-emitting element 3.

The thus obtained light-emitting element 3 and reference light-emitting element 3 were sealed in a glove box under a nitrogen atmosphere so that they were not exposed to atmospheric air. After that, the operating characteristics of these light-emitting elements were measured. The measurement was carried out at room temperature (under an atmosphere in which the temperature was kept at 25° C.).

Figure 15:
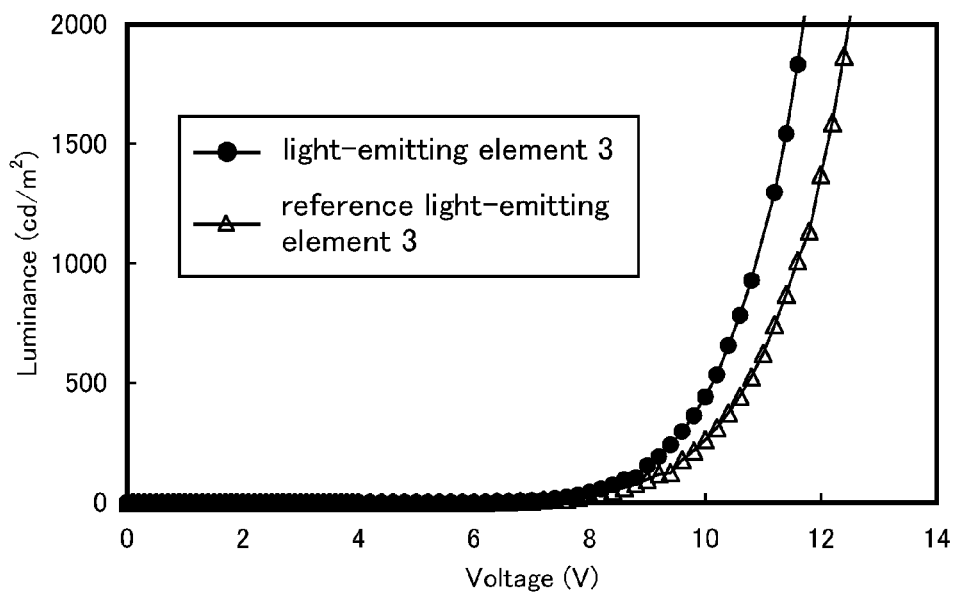
FIG. 15 is a graph showing characteristics of light-emitting elements of Example 3.
Figure 16:
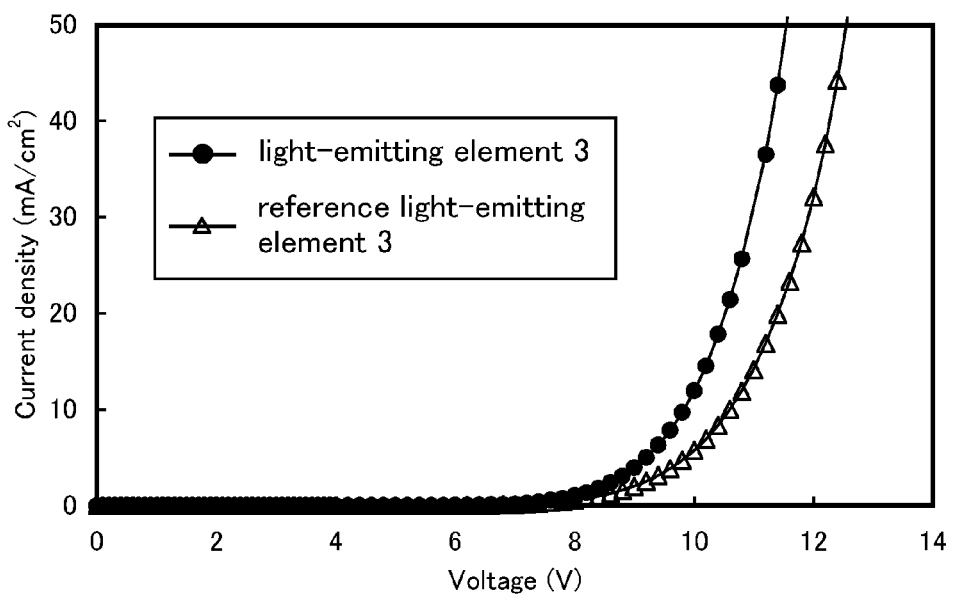
FIG. 16 is a graph showing characteristics of the light-emitting elements of Example 3.

FIG. 15 shows voltage-luminance characteristics of the light-emitting element 3 and the reference light-emitting element 3. In FIG. 15, the horizontal axis represents applied voltage (V) and the vertical axis represents luminance (cd/m$^2$). In addition, FIG. 16 shows current density-luminance characteristics. In FIG. 16, the horizontal axis represents voltage (V) and the vertical axis represents current density (mA/cm$^2$). Moreover, Table 6 below shows initial values of main characteristics of the light-emitting element 3 and the reference light-emitting element 3 at around 1000 cd/m$^2$.

TABLE 6

|  | Voltage (V) | Chromaticity (x, y) | Current efficiency (cd/A) | External quantum efficiency (%) |
|---|---|---|---|---|
| Light-emitting element 3 | 11 | (0.31, 0.27) | 3.6 | 2.7 |
| Reference light-emitting element 3 | 12 | (0.31, 0.29) | 4.3 | 3 |

Note that, as seen from CIE chromaticity coordinates of Table 6, the light-emitting element 3 and the reference light-emitting element 3 both exhibit white light emission. That is because blue-green light emission derived from DPABPA contained in the first EL layer 2103 and red light emission derived from DCJTI contained in the second EL layer 2107 were both obtained.

According to FIG. 15, the light-emitting element 3 in which the electron-relay layer is provided can have higher luminance than the reference light-emitting element 3 when the same voltage is applied to these light-emitting elements. In addition, according to FIG. 16, the light-emitting element 3 has a higher current density than the reference light-emitting element 3.

TABLE 5

|  | 2101 | 2103a | 2103b | 2103c |  | 2103d | 2104 | 2105 | 2106 |
|---|---|---|---|---|---|---|---|---|---|
| Light-emitting element 3 | ITSO 110 nm | NPB: MoOx (=4:1) 50 nm | NPB 10 nm | CzPA: DPABPA (=1:0.1) 30 nm | Alq 10 nm | BPhen 10 nm | Li$_2$O 0.1 nm | PTCBI 3 nm | NPB: MoOx (=4:1) 20 nm |
| Reference light-emitting element 3 | ITSO 110 nm | NPB: MoOx (=4:1) 50 nm | NPB 10 nm | CzPA: DPABPA (=1:0.1) 30 nm | Alq 10 nm | BPhen 10 nm | Li$_2$O 0.1 nm | — | NPB: MoOx (=4:1) 20 nm |

|  |  | 2107 |  |  |  |  |
|---|---|---|---|---|---|---|
|  | 2107a | 2107b |  | 2107c | 2107d | 2102 |
| Light-emitting element 3 | NPB 10 nm | Alq:DCJTI (=1:0.01) 40 nm | Alq 10 nm | BPhen 20 nm | LiF 1 nm | Al 200 nm |
| Reference light-emitting element 3 | NPB 10 nm | Alq:DCJTI (=1:0.01) 40 nm | Alq 10 nm | BPhen 20 nm | LiF 1 nm | Al 200 nm |

Accordingly, it was confirmed that the light-emitting element 3 of this example had characteristics as a light-emitting element and functioned well. In addition, it was confirmed that the light-emitting element 3 was a light-emitting element capable of being driven at low voltage.

Example 4

In Example 4, a light-emitting element that is one embodiment of the present invention will be described with reference to FIGS. 12A and 12B. Note that as for a light-emitting element and a reference light-emitting element described in this example, the same or similar parts as/to or parts having the same or similar functions as/to those described in above Examples are denoted by the same reference numerals as those of above Examples, and the description of them will not be repeated.

Hereinafter, a method for manufacturing a light-emitting element 4 and a reference light-emitting element 4 of this example will be described.

First, the light-emitting element 4 will be described (see FIG. 12A). The light-emitting element 4 was manufactured in a manner similar to that of the light-emitting element 2 described in Example 2, except for the electron-transporting layer 2103d of the first EL layer 2103 and the electron-injecting buffer 2104. As for the light-emitting element 4 of this example, Alq with a thickness of 10 nm and BPhen with a thickness of 10 nm were stacked on the light-emitting layer 2103c to form the electron-transporting layer 2103d.

Next, lithium oxide ($LiO_2$) was evaporated on the electron-transporting layer 2103d to a thickness of 0.1 nm to form the electron-injecting buffer 2104. Accordingly, the light-emitting element 4 of this example was obtained.

Next, the reference light-emitting element 4 will be described (see FIG. 12B). The reference light-emitting element 4 of this example has the structure of the light-emitting element 4, from which the electron-relay layer 2105 is removed. The other layers were formed by manufacturing methods similar to those of the light-emitting element 4. As for the reference light-emitting element 4, after the electron-injecting buffer 2104 was formed, the second charge production region 2106 was formed on the electron-injecting buffer 2104. Accordingly, the reference light-emitting element 4 of this example was obtained.

Table 7 below shows the element structures of the light-emitting element 4 and the reference light-emitting element 4.

TABLE 7

|  | 2101 | 2103 | | | | 2104 | 2105 | 2106 |
|  |  | 2103a | 2103b | 2103c | 2103d |  |  |  |
| --- | --- | --- | --- | --- | --- | --- | --- | --- |
| Light-emitting element 4 | ITSO 110 nm | NPB: MoOx (=4:1) 50 nm | NPB 10 nm | CzPA: DPABPA (=1:0.1) 30 nm | Alq 10 nm | BPhen 10 nm | $Li_2O$ 0.1 nm | PTCBI 3 nm | MoOx 20 nm | NPB 10 nm |
| Reference light-emitting element 4 | ITSO 110 nm | NPB: MoOx (=4:1) 50 nm | NPB 10 nm | CzPA: DPABPA (=1:0.1) 30 nm | Alq 10 nm | BPhen 10 nm | $Li_2O$ 0.1 nm | — | MoOx 20 nm | NPB 10 nm |

|  | 2108 | | | 2102 |
|  | 2108a | 2108b | 2108c |  |
| --- | --- | --- | --- | --- |
| Light-emitting element 4 | Alq:DCJTI (=1:0.01) 40 nm | Alq 10 nm | BPhen 20 nm | LiF 1 nm | Al 200 nm |
| Reference light-emitting element 4 | Alq:DCJTI (=1:0.01) 40 nm | Alq 10 nm | BPhen 20 nm | LiF 1 nm | Al 200 nm |

The thus obtained light-emitting element 4 and reference light-emitting element 4 were sealed in a glove box under a nitrogen atmosphere so that they were not exposed to atmospheric air. After that, the operating characteristics of these light-emitting elements were measured. The measurement was carried out at room temperature (under an atmosphere in which the temperature was kept at 25° C.).

Figure 17:
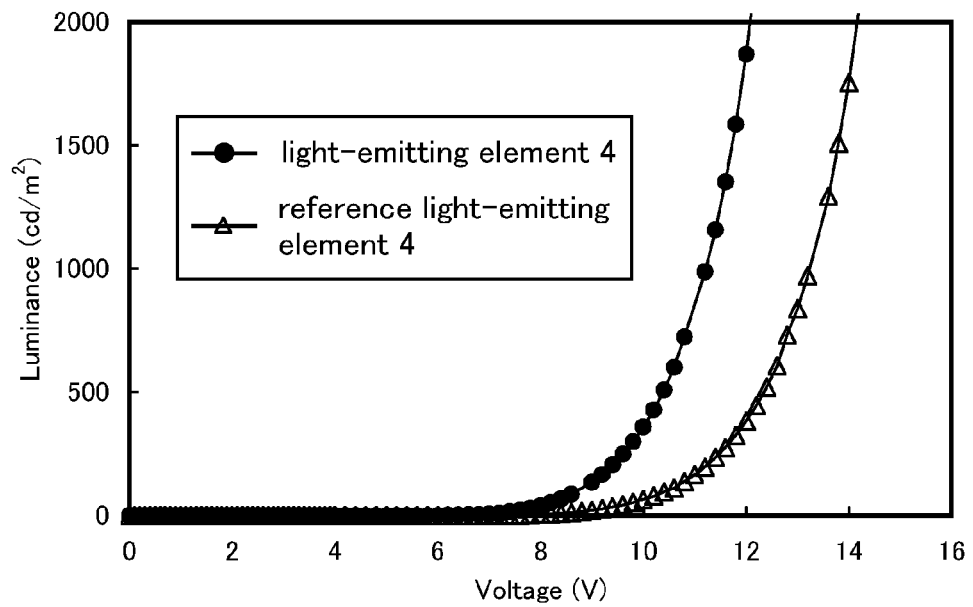
FIG. 17 is a graph showing characteristics of light-emitting elements of Example 4.
Figure 18:
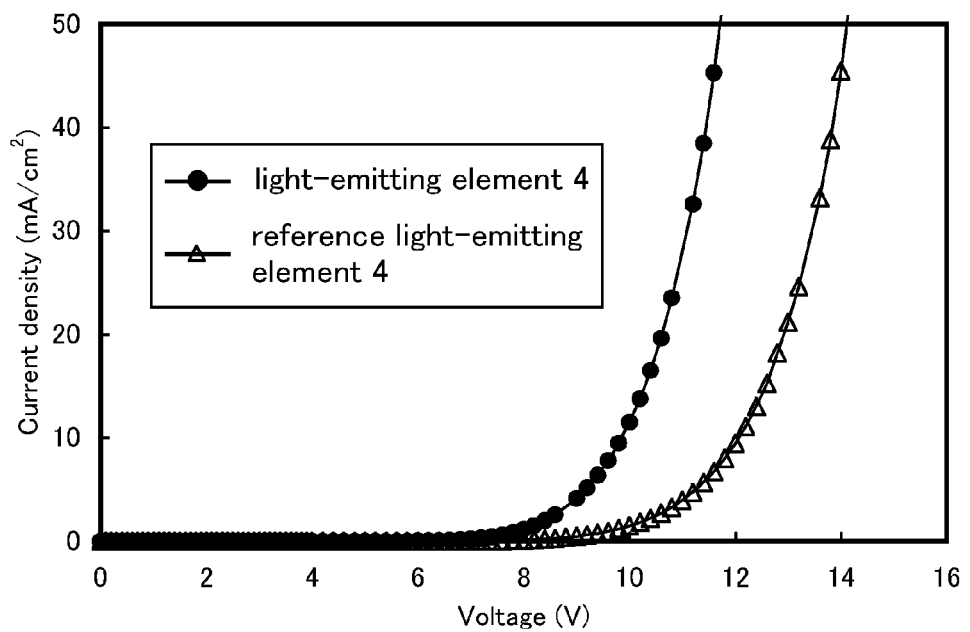
FIG. 18 is a graph showing characteristics of the light-emitting elements of Example 4.

FIG. 17 shows voltage-luminance characteristics of the light-emitting element 4 and the reference light-emitting element 4. In FIG. 17, the horizontal axis represents applied voltage (V) and the vertical axis represents luminance (cd/m²). In addition, FIG. 18 shows current density-luminance characteristics. In FIG. 18, the horizontal axis represents voltage (V) and the vertical axis represents current density (mA/cm²). Moreover, Table 8 shows initial values of main characteristics of the light-emitting element 4 and the reference light-emitting element 4 at around 1000 cd/m².

TABLE 8

|  | Voltage (V) | Chromaticity (x, y) | Current efficiency (cd/A) | External quantum efficiency (%) |
| --- | --- | --- | --- | --- |
| Light-emitting element 4 | 11 | (0.30, 0.26) | 3 | 2.3 |
| Reference light-emitting element 4 | 13 | (0.30, 0.28) | 3.9 | 2.8 |

Note that, as seen from CIE chromaticity coordinates of Table 8, the light-emitting element 4 and the reference light-emitting element 4 both exhibit white light emission. That is because blue-green light emission derived from DPABPA contained in the first EL layer 2103 and red light emission derived from DCJTI contained in the second EL layer 2108 were both obtained.

According to FIG. 17, the light-emitting element 4 in which the electron-relay layer is provided can have higher luminance than the reference light-emitting element 4 when the same voltage is applied to these light-emitting elements. In addition, according to FIG. 18, the light-emitting element 4 has a higher current density than the reference light-emitting element 4.

Accordingly, it was confirmed that the light-emitting element 4 of this example had characteristics as a light-emitting element and functioned well. In addition, it was confirmed that the light-emitting element 4 was a light-emitting element capable of being driven at low voltage.

Example 5

In Example 5, a light-emitting element that is one embodiment of the present invention will be described with reference to FIG. 9A. Note that as for a light-emitting element and a reference light-emitting element described in this example, the same or similar parts as/to or parts having the same or similar functions as/to those described in above Examples are denoted by the same reference numerals as those of above Examples, and the description of them will not be repeated.

Hereinafter, a method for manufacturing a light-emitting element 3 and a reference light-emitting element 5 of this example will be described.

Figure 9A:
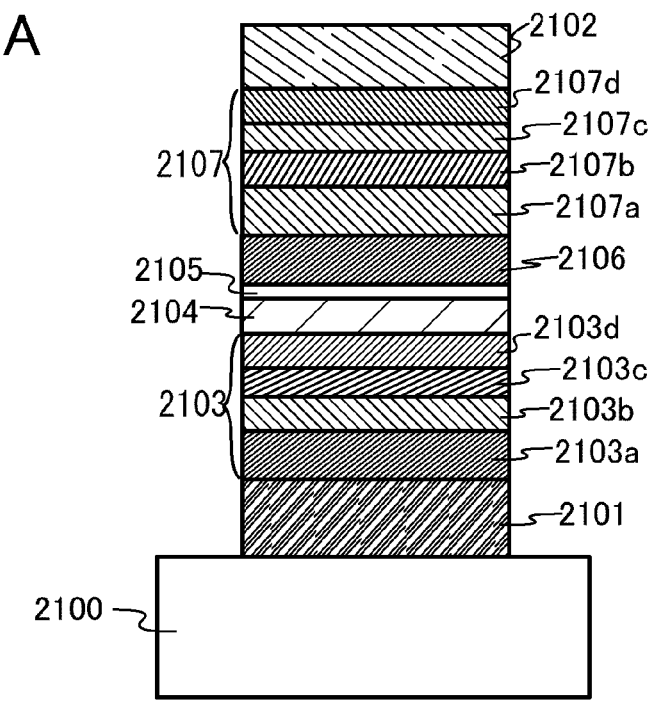
FIGS. 9A and 9B are views illustrating structures of a light-emitting element and a reference light-emitting element of Examples.
Figure 9B:
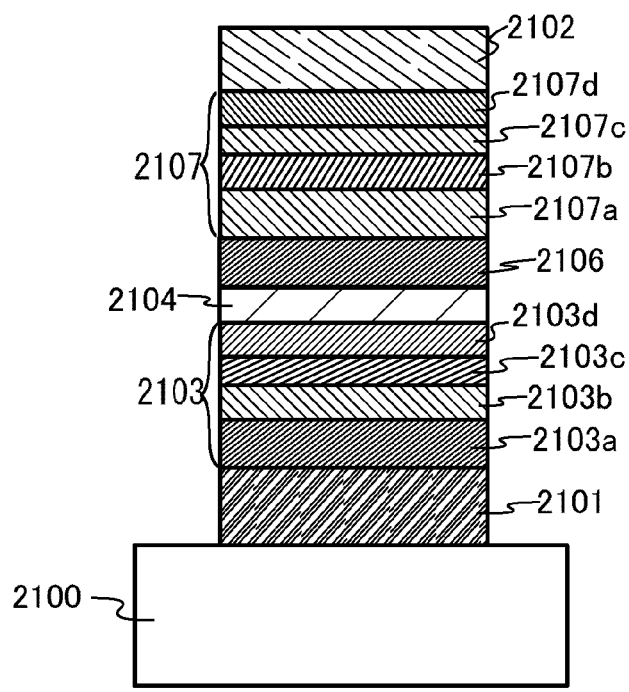

The light-emitting element 3 of this example was manufactured in a manner similar to that of the light-emitting element 3 described in Example 3 (see FIG. 9A). In addition, the reference light-emitting element 5 of this example was manufactured in a manner similar to that of the light-emitting element 3, except for the second charge production region 2106. As for the reference light-emitting element 5 of this example, NPB was evaporated on the electron-relay layer 2105, to a thickness of 20 nm to form the second charge production region 2106 (see FIG. 9A). Accordingly, the reference light-emitting element 5 was obtained.

Table 9 below shows the element structures of the light-emitting element 3 and the reference light-emitting element 5.

TABLE 9

| | | 2103 | | | | | 2104 | 2105 | 2106 |
| | 2101 | 2103a | 2103b | 2103c | | 2103d | | | |
|---|---|---|---|---|---|---|---|---|---|
| Light-emitting element 3 | ITSO 110 nm | NPB:MoOx (=4:1) 50 nm | NPB 10 nm | CzPA:DPABPA (=1:0.1) 30 nm | Alq 10 nm | BPhen 10 nm | Li₂O 0.1 nm | PTCBI 3 nm | NPB:MoOx (=4:1) 20 nm |
| Reference light-emitting element 5 | ITSO 110 nm | NPB:MoOx (=4:1) 50 nm | NPB 10 nm | CzPA:DPABPA (=1:0.1) 30 nm | Alq 10 nm | BPhen 10 nm | Li₂O 0.1 nm | PTCBI 3 nm | NPB 20 nm |

| | | 2107 | | | | 2102 |
| | 2107a | 2107b | | 2107c | 2107d | |
|---|---|---|---|---|---|---|
| Light-emitting element 3 | NPB 10 nm | Alq:DCJTI (=1:0.01) 40 nm | | Alq 10 nm | BPhen 20 nm | LiF 1 nm | Al 200 nm |
| Reference light-emitting element 5 | NPB 10 nm | Alq:DCJTI (=1:0.01) 40 nm | | Alq 10 nm | BPhen 20 nm | LiF 1 nm | Al 200 nm |

The thus obtained light-emitting element 3 and reference light-emitting element 5 were sealed in a glove box under a nitrogen atmosphere so that they were not exposed to atmospheric air. After that, the operating characteristics of these light-emitting elements were measured. The measurement was carried out at room temperature (under an atmosphere in which the temperature was kept at 25° C.).

Figure 19:
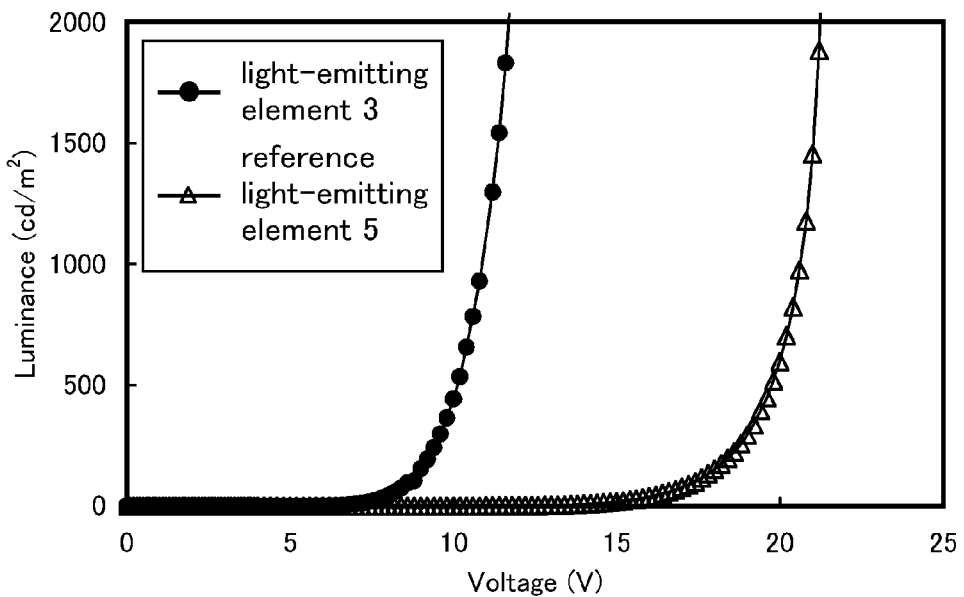
FIG. 19 is a graph showing characteristics of light-emitting elements of Example 5.
Figure 20:
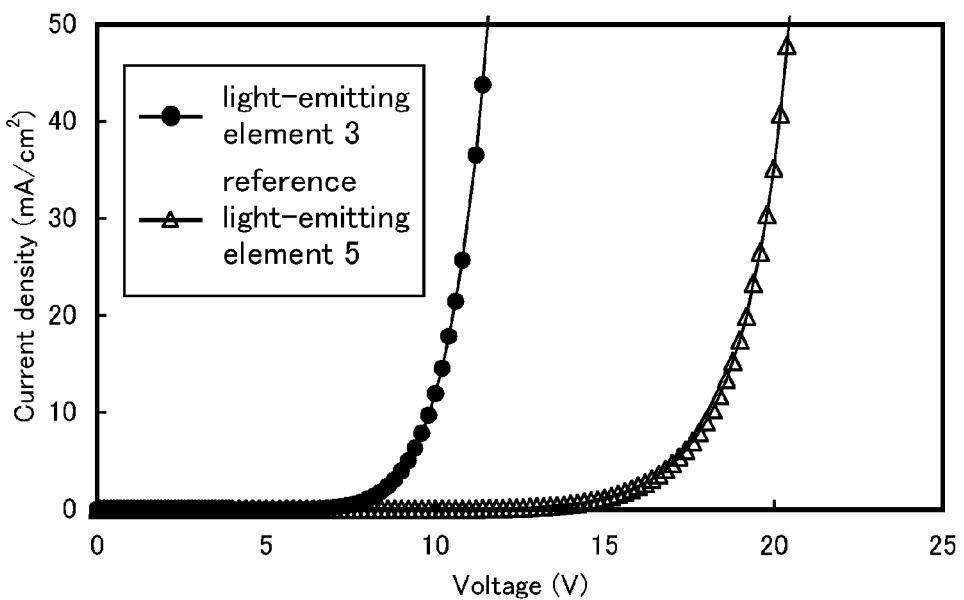
FIG. 20 is a graph showing characteristics of the light-emitting elements of Example 5.

FIG. 19 shows voltage-luminance characteristics of the light-emitting element 3 and the reference light-emitting element 5. In FIG. 19, the horizontal axis represents applied voltage (V) and the vertical axis represents luminance (cd/m²). In addition, FIG. 20 shows current density-luminance characteristics. In FIG. 20, the horizontal axis represents voltage (V) and the vertical axis represents current density (mA/cm²). Moreover, Table 10 below shows initial values of main characteristics of the light-emitting element 3 and the reference light-emitting element 5 at around 1000 cd/m².

TABLE 10

|  | Voltage (V) | Chromaticity (x, y) | Current efficiency (cd/A) | External quantum efficiency (%) |
| --- | --- | --- | --- | --- |
| Light-emitting element 3 | 11 | (0.31, 0.27) | 3.6 | 2.7 |
| Reference light-emitting element 5 | 21 | (0.21, 0.21) | 1.7 | 1.4 |

Note that, although the light-emitting element 3 exhibited white light emission as described in Example 3, while the reference light-emitting element 5 had low spectrum intensity of red emission derived from DCJTI and exhibited blue-green emission (see CIE chromaticity coordinates of Table 10). This indicates that holes are not easily injected into the second EL layer 2107 in the case where the second charge production region 2106 is formed of only a material having a high hole-transporting property (NPB in this example).

On the other hand, the second charge production region 2106 of the light-emitting element 3 contains a material having a hole-transporting property (NPB in this example) and an acceptor material (molybdenum oxide in this example); thus, electrons are donated and accepted in the second charge production region 2106 and holes and electrons are generated in the second charge production region 2106. The generated holes are easily moved over NPB by applied voltage to be injected into the second EL layer 2107. In addition, the electrons are easily injected into the electron-relay layer 2105 by applied voltage to reach the first EL layer 2103. Accordingly, as shown in FIG. 19, the light-emitting element 3 has a higher luminance than the reference light-emitting element 5. In addition, as shown in FIG. 20, a larger amount of current can be passed through the light-emitting element 3 by lower voltage than in the case of the reference light-emitting element 5.

Accordingly, it was confirmed that the light-emitting element 3 of this example had characteristics as a light-emitting element and functioned well. In addition, it was confirmed that the light-emitting element 3 was a light-emitting element capable of being driven at low voltage.

Example 6

Figure 21:
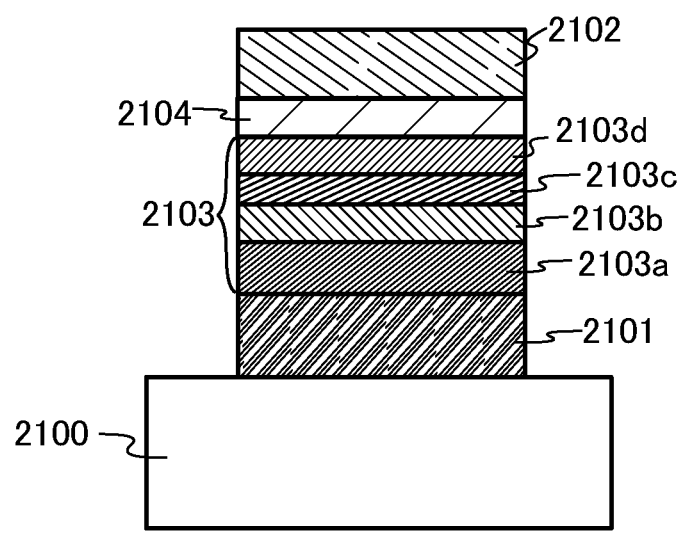
FIG. 21 is a view illustrating a structure of a reference light-emitting element of Example 6.

In Example 6, a light-emitting element that is one embodiment of the present invention will be described with reference to FIGS. 9A and 21. Note that as for a light-emitting element and a reference light-emitting element described in this example, the same or similar parts as/to or parts having the same or similar functions as/to those described in above Examples are denoted by the same reference numerals as those of above Examples, and the description of them will not be repeated.

A chemical formula of a material used in this example is shown below. Note that materials, the structural formulae of which have already been shown are omitted.

[Chemical Formula 2]

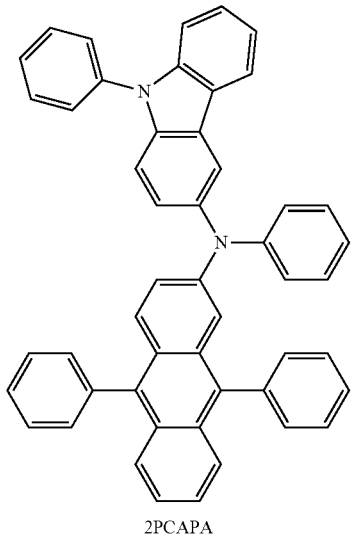

2PCAPA

Hereinafter, a method for manufacturing a light-emitting element 5 and a reference light-emitting element 6 of this example will be described.

First, the light-emitting element 5 will be described (see FIG. 9A). The light-emitting element 5 of this example was manufactured in a manner similar to that of the light-emitting element 3 described in Example 3, except for the light-emitting layer 2103c of the first EL layer 2103 and the light-emitting layer 2107b of the second EL layer 2107. As for the light-emitting element 5 of this example, CzPA, coumarin 30, and N-(9,10-diphenyl-2-anthryl)-N,9-diphenyl-9H-carbazol-3-amine (abbreviation: 2PCAPA) were co-evaporated to form the light-emitting layer 2103c with a thickness of 30 nm on the hole-transporting layer 2103b. In addition, similarly to the light-emitting layer 2103c, CzPA and 2PCAPA were co-evaporated to form the light-emitting layer 2107b with a thickness of 30 nm on the hole-transporting layer 2107a. The weight ratio of CzPA to 2PCAPA in each of the light-emitting layer 2103c and the light-emitting layer 2107b was adjusted to be 1:0.05 (=CzPA:2PCAPA). Note that CzPA is a material having an electron-transporting property and 2PCAPA that is a guest material is a material exhibiting green light emission. Accordingly, the light-emitting element 5 of this example was obtained.

Next, the reference light-emitting element 6 will be described (see FIG. 21). The reference light-emitting element 6 of this example has the structure of the light-emitting element 5, from which the electron-relay layer 2105, the charge production region 2106, and the second EL layer 2107 are removed. The other layers were formed in a manner similar to that or the light-emitting element 5. As illustrated in FIG. 21, the reference light-emitting element 6 has of this example a structure in which one EL layer is provided between a pair of electrodes.

As for the reference light-emitting element 6, after the electron-injecting buffer 2104 was formed, the second electrode 2102 was formed on the electron-injecting buffer 2104. Accordingly, the reference light-emitting element 6 of this example was obtained.

Table 11 below shows the element structures of the light-emitting element 5 and the reference light-emitting element 6.

TABLE 11

| | 2101 | 2103 | | | | 2104 | 2105 | 2106 |
|---|---|---|---|---|---|---|---|---|
| | | 2103a | 2103b | 2103c | 2103d | | | |
| Light-emitting element 5 | ITSO 110 nm | NPB:MoOx (=4:1) 50 nm | NPB 10 nm | CzPA:2PCAPA (=1:0.5) 30 nm | Alq 10 nm / BPhen 10 nm | Li₂O 0.1 nm | PTCBI 3 nm | NPB:MoOx (=4:1) 60 nm |
| Reference light-emitting element 6 | ITSO 110 nm | NPB:MoOx (=4:1) 50 nm | NPB 10 nm | CzPA:2PCAPA (=1:0.5) 30 nm | Alq 10 nm / BPhen 10 nm | Li₂O 0.1 nm | — | — |

| | 2107 | | | | 2102 |
|---|---|---|---|---|---|
| | 2107a | 2107b | 2107c | 2107d | |
| Light-emitting element 5 | NPB 10 nm | CzPA:2PCAPA (=1:0.05) 30 nm | Alq 10 nm | BPhen 20 nm / LiF 1 nm | Al 200 nm |
| Reference light-emitting element 6 | — | — | — | — | Al 200 nm |

The thus obtained light-emitting element 5 and reference light-emitting element 6 were sealed in a glove box under a nitrogen atmosphere so that they were not exposed to atmospheric air. After that, the operating characteristics of these light-emitting elements were measured. The measurement was carried out at room temperature (under an atmosphere in which the temperature was kept at 25° C.).

Figure 22:
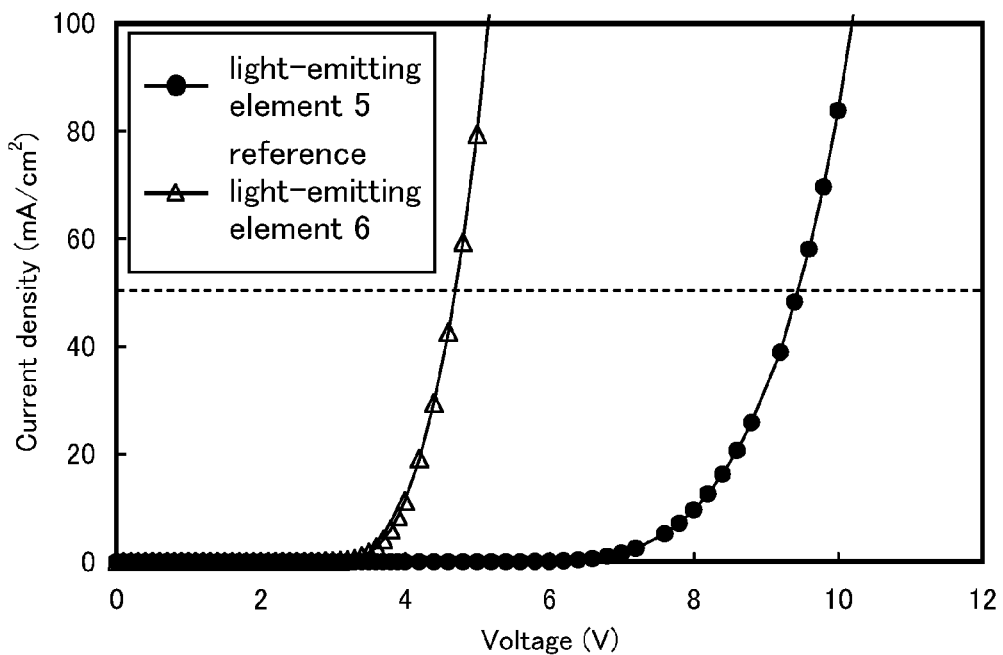
FIG. 22 is a graph showing characteristics of light-emitting elements of Example 6.
Figure 23:
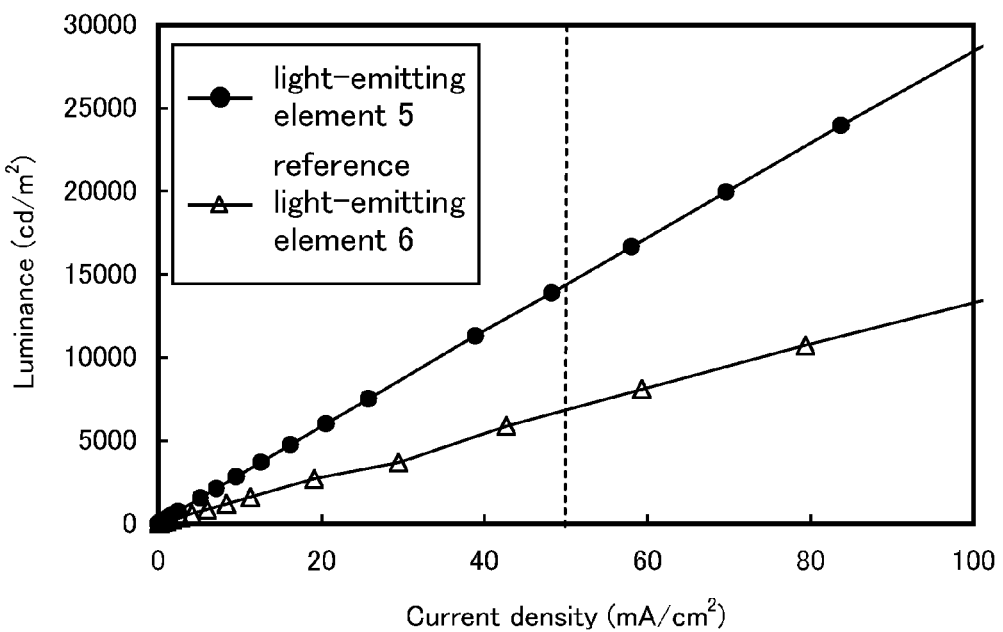
FIG. 23 is a graph showing characteristics of the light-emitting elements of Example 6.

FIG. 22 shows voltage-luminance characteristics of the light-emitting element 5 and the reference light-emitting element 6. In FIG. 22, the horizontal axis represents applied voltage (V) and the vertical axis represents current density (mA/cm$^2$). In addition, FIG. 23 shows current density-luminance characteristics. In FIG. 23, the horizontal axis represents current density (mA/cm$^2$) and the vertical axis represents luminance (cd/m$^2$). Moreover, Table 12 below shows initial values of main characteristics of the light-emitting element 5 and the reference light-emitting element 6 at around 1000 cd/m$^2$.

TABLE 12

| | Voltage (V) | Chromaticity (x, y) | Current efficiency (cd/A) | External quantum efficiency (%) |
|---|---|---|---|---|
| Light-emitting element 5 | 7.2 | (0.27, 0.64) | 30 | 8.5 |
| Reference light-emitting element 6 | 3.8 | (0.29, 0.62) | 14 | 4.2 |

According to FIG. 22, the light-emitting element 5 having two EL layers of this example can be driven by a voltage about twice as high as the voltage by which the reference light-emitting element 6 including one EL layer is driven, when current having the same current density as current applied to the reference light-emitting element 6 was applied to the light-emitting element 5. In addition, according to FIG. 23, the light-emitting element 5 exhibits luminance (that is current efficiency) about twice as high as the reference light-emitting element 6, when current having the same current density as current applied to the reference light-emitting element 6 was applied to the light-emitting element 5. The above indicates that the light-emitting element 5 of this example has little extra increase in voltage due to introduction of the electron-injecting buffer, the electron-relay layer, and the charge production region between the two EL layers.

Accordingly, it was confirmed that the light-emitting element 5 of this example had characteristics as a light-emitting element and functioned well. In addition, it was confirmed that the light-emitting element 5 was a light-emitting element which had little extra increase in voltage due to introduction of the electron-injecting buffer, the electron-relay layer, and the charge production region between the two EL layers, and which could be driven at low voltage.

Example 7

In Example 7, a light-emitting element that is one embodiment of the present invention will be described with reference to FIGS. 9A and 9B. Note that as for a light-emitting element and a reference light-emitting element described in this example, the same or similar parts as/to or parts having the same or similar functions as/to those described in the above examples are denoted by the same reference numerals as those of the above examples, and the description of them will not be repeated.

A chemical formula of a material used in this example is shown below. Note that materials, the structural formulae of which have already been shown are omitted.

[Chemical Formula 3]

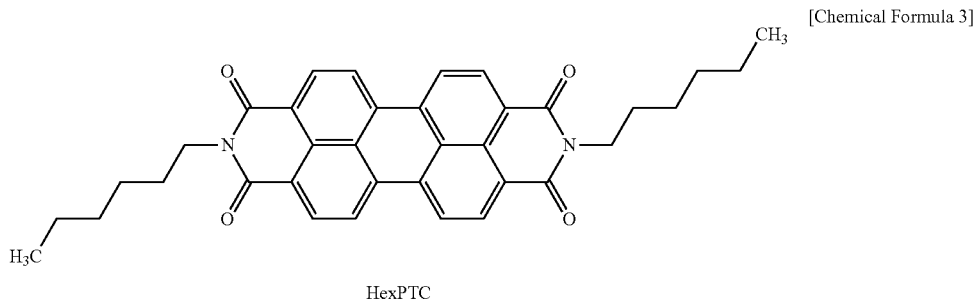 [SMILES: CCCCCCN1C(=O)c2ccc3c4ccc5c6c(ccc(c7ccc(c2c37)C1=O)c64)C(=O)N(CCCCCC)C5=O]

HexPTC

Hereinafter, a method for manufacturing a light-emitting element 6 and a reference light-emitting element 7 of this example will be described.

First, the light-emitting element 6 will be described (see FIG. 9A). The light-emitting element 6 of this example was manufactured in a manner similar to that of the light-emitting element 5 described in Example 6, except for the electron-relay layer 2105. As for the light-emitting element 6 of this example, N,N'-dihexyl-3,4,9,10-perylenetetracarboxylicdiimide (abbreviation: HexPTC) was evaporated to form the electron-relay layer 2105 with a thickness of 3 nm on the electron-injecting buffer 2104. Accordingly, the light-emitting element 6 of this example was obtained.

Next, the reference light-emitting element 7 will be described (see FIG. 9B). The reference light-emitting element 7 of this example has the structure of the light-emitting element 6, from which the electron-relay layer 2105 is removed. The other layers were formed by manufacturing methods similar to those of the light-emitting element 6. As for the reference light-emitting element 7, after the electron-injecting buffer 2104 was formed, the charge production region 2106 was formed on the electron-injecting buffer 2104. Accordingly, the reference light-emitting element 7 of this example was obtained.

Table 13 below shows the element structures of the light-emitting element 6 and the reference light-emitting element 7.

The thus obtained light-emitting element 6 and reference light-emitting element 7 were sealed in a glove box under a nitrogen atmosphere so that they were not exposed to atmospheric air. After that, the operating characteristics of these light-emitting elements were measured. The measurement was carried out at room temperature (under an atmosphere in which the temperature was kept at 25° C.).

Figure 25:
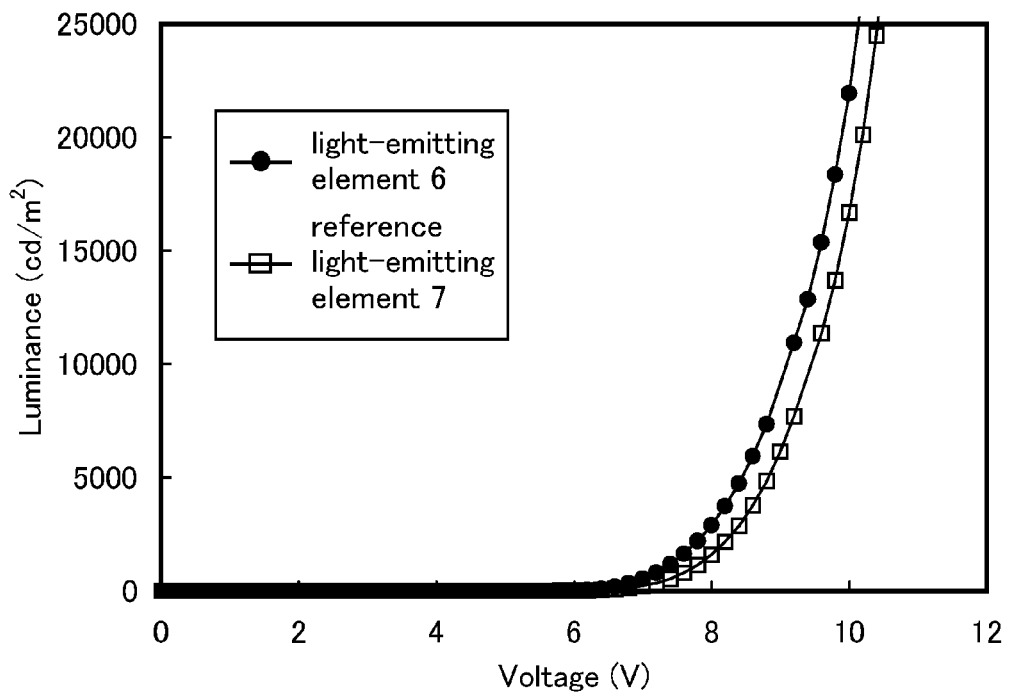
FIG. 25 is a graph showing characteristics of light-emitting elements of Example 7.
Figure 26:
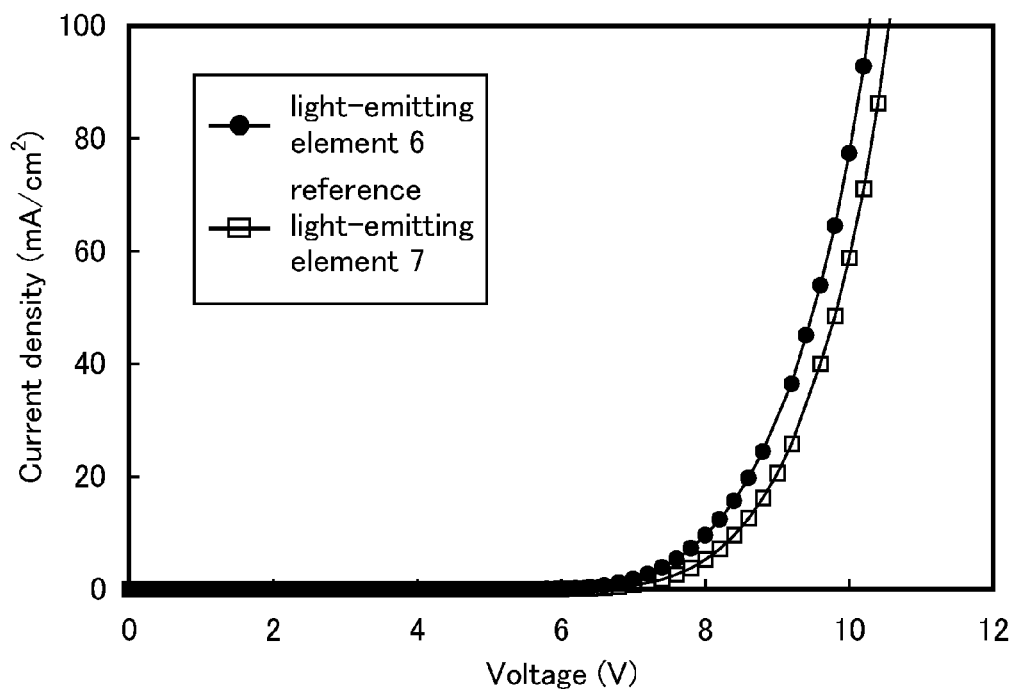
FIG. 26 is a graph showing characteristics of the light-emitting elements of Example 7.

FIG. 25 shows voltage-luminance characteristics of the light-emitting element 6 and the reference light-emitting element 7. In FIG. 25, the horizontal axis represents applied voltage (V) and the vertical axis represents luminance (cd/m$^2$). In addition, FIG. 26 shows voltage-current density characteristics. In FIG. 26, the horizontal axis represents voltage (V) and the vertical axis represents current density (mA/cm$^2$). Moreover, Table 14 below shows initial values of main characteristics of the light-emitting element 6 and the reference light-emitting element 7 at around 1000 cd/m$^2$.

TABLE 14

|  | Voltage (V) | Chromaticity (x, y) | Current efficiency (cd/A) | External quantum efficiency (%) |
|---|---|---|---|---|
| Light-emitting element 6 | 7.4 | (0.25, 0.64) | 31 | 8.9 |
| Reference light-emitting element 7 | 7.8 | (0.25, 0.63) | 30 | 8.9 |

TABLE 13

|  | 2101 | 2103a | 2103b | 2103c | 2103d | 2104 | 2105 | 2106 |
|---|---|---|---|---|---|---|---|---|
| Light-emitting element 6 | ITSO 110 nm | NPB: MoOx (=4:1) 50 nm | NPB 10 nm | CzPA: 2PCAPA (=1:0.05) 30 nm | Alq 10 nm | BPhen 20 nm | Li$_2$O 0.1 nm | HexPTC 3 nm | NPB: MoOx (=4:1) 60 nm |
| Reference light-emitting element 7 | ITSO 110 nm | NPB: MoOx (=4:1) 50 nm | NPB 10 nm | CzPA: 2PCAPA (=1:0.05) 30 nm | Alq 10 nm | BPhen 20 nm | Li$_2$O 0.1 nm | — | NPB: MoOx (=4:1) 60 nm |

|  | 2107a | 2107b | 2107c | 2107d | 2102 |
|---|---|---|---|---|---|
| Light-emitting element 6 | NPB 10 nm | CzPA: 2PCAPA (=1:0.05) 30 nm | Alq 10 nm | BPhen 20 nm | LiF 1 nm | Al 200 nm |
| Reference light-emitting element 7 | NPB 10 nm | CzPA: 2PCAPA (=1:0.05) 30 nm | Alq 10 nm | BPhen 20 nm | LiF 1 nm | Al 200 nm |

According to FIG. 25, the light-emitting element 6 in which the electron-relay layer is provided can have higher luminance than the reference light-emitting element 7 when the same voltage is applied to these light-emitting elements. In addition, according to FIG. 26, the light-emitting element 6 has a higher current density than the reference light-emitting element 7.

Accordingly, it was confirmed that the light-emitting element 6 of this example had characteristics as a light-emitting element and functioned well. In addition, it was confirmed that the light-emitting element 6 was a light-emitting element capable of being driven at low voltage.

Example 8

In Example 8, a light-emitting element that is one embodiment of the present invention will be described with reference to FIGS. 9A and 9B. Note that as for a light-emitting element and a reference light-emitting element described in this example, the same or similar parts as/to or parts having the same or similar functions as/to those described in the above examples are denoted by the same reference numerals as those of the above examples, and the description of them will not be repeated.

Chemical formulae of materials used in this example are shown below. Note that materials, the structural formulae of which have already been shown are omitted.

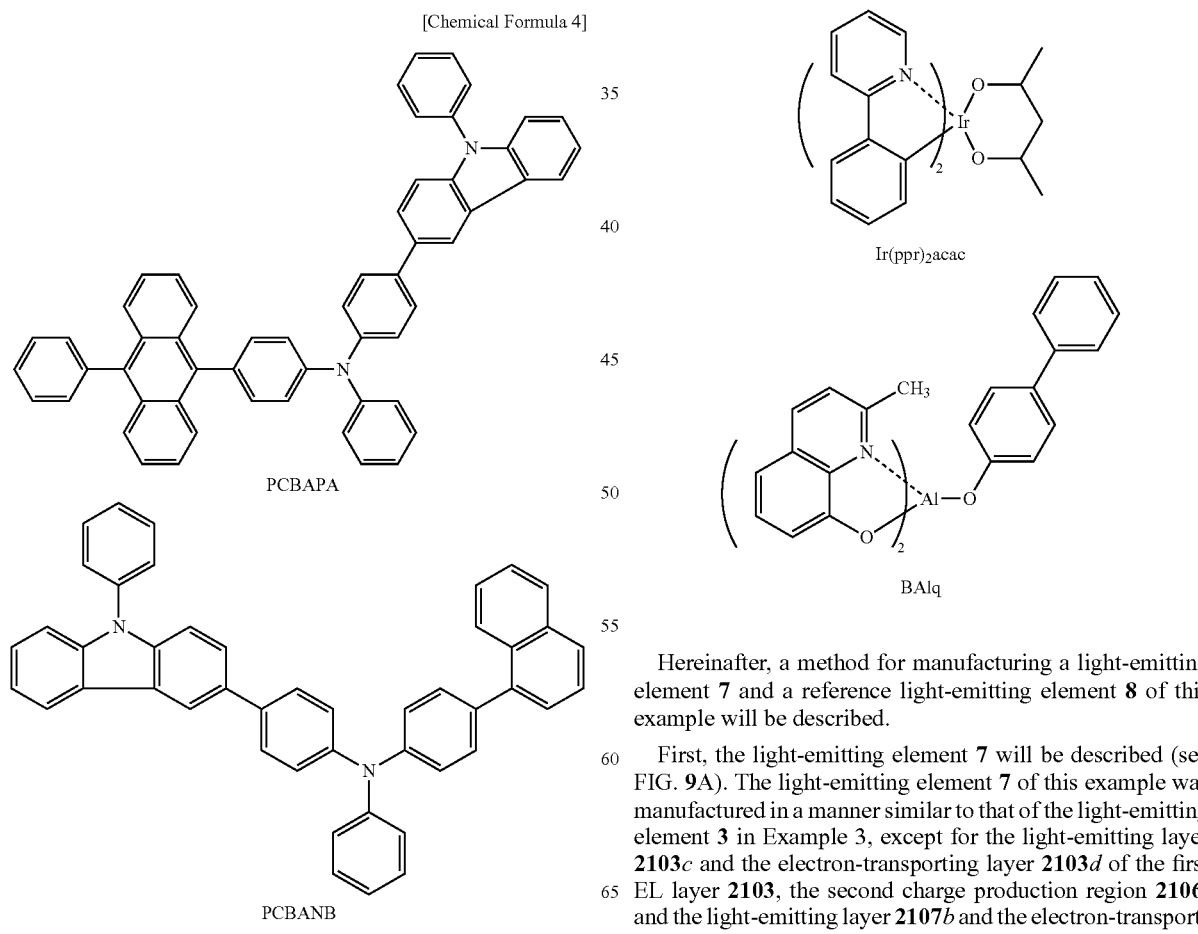

Hereinafter, a method for manufacturing a light-emitting element 7 and a reference light-emitting element 8 of this example will be described.

First, the light-emitting element 7 will be described (see FIG. 9A). The light-emitting element 7 of this example was manufactured in a manner similar to that of the light-emitting element 3 in Example 3, except for the light-emitting layer 2103c and the electron-transporting layer 2103d of the first EL layer 2103, the second charge production region 2106, and the light-emitting layer 2107b and the electron-transporting layer 2107c of the second EL layer 2107.

In the light-emitting element 7 of this example, 4-(10-phenyl-9-anthryl)-4'-(9-phenyl-9H-carbazol-3-yl)triphenylamine (abbreviation: PCBAPA) and 4-(1-naphthyl)-4'(9-phenyl-9H-carbazol-3-yl)-triphenylamine (abbreviation: PCBANB) were co-evaporated to a thickness of 20 nm, and furthermore CzPA and SD1 (product name; manufactured by SFC Co., Ltd) were co-evaporated thereon to a thickness of 30 nm, whereby the light-emitting layer 2103c was formed. Note that the weight ratio of PCBAPA to PCBANB was adjusted to be 1:1 (=PCBAPA:PCBANB). Note also that the weight ratio of CzPA to SD1 was adjusted to be 1:0.05 (=CzPA:SD1).

Then, BPhen was evaporated on the light-emitting layer 2103c to a thickness of 30 nm to form the electron-transporting layer 2107c.

In addition, as for the light-emitting element 7, NPB that is a material having a high hole-transporting property and molybdenum(VI) oxide that is an acceptor material were co-evaporated on the electron-relay layer 2105 to form the second charge production region 2106. The thickness of the second charge production region 2106 was 40 nm. The weight ratio of NPB to molybdenum(VI) oxide was adjusted to be 4:1 (=NPB:molybdenum oxide).

Moreover, in the light-emitting element 7, 4-(9H-carbazol-9-yl)-4'-(5-phenyl-1,3,4-oxadiazol-2-yl)triphenylamine) (abbreviation: YGAO11) and (acetylacetonate)bis(2,3,5-triphenylpyrazinato)iridium(III) (abbreviation: Ir(tppr)$_2$(acac)) were co-evaporated to a thickness of 10 nm, and then YGAO11 and bis(2-phenylpyridinato-N,C$^{2'}$)iridium(acetylacetonate) (abbreviation: Ir(ppy)$_2$(acac)) were co-evaporated to a thickness of 20 nm, whereby the light-emitting layer 2107b was formed. Note that the weight ratio of YGAO11 to Ir(tppr)$_2$(acac) was adjusted to be 1:0.03 (=YGAO11: Ir(tppr)$_2$(acac)). Note also that that the weight ratio of YGAO11 to Ir(ppy)$_2$(acac) was adjusted to be 1:0.06 (=YGAO11: Ir(ppy)$_2$(acac)).

Then, BAlq with a thickness of 10 nm and then BPhen with a thickness of 20 nm were stacked on the light-emitting layer 2107b by evaporation to form the electron-transporting layer 2107c. Accordingly, the light-emitting element 7 of this example was obtained.

Next, the reference light-emitting element 8 will be described (see FIG. 9B). The reference light-emitting element 8 of this example has the structure of the light-emitting element 7, from which the electron-relay layer 2105 is removed. In addition, as for the reference light-emitting element 8, BPhen and lithium (Li) were co-evaporated to a thickness of 20 nm to form the electron-injecting buffer 2104. Here, the weight ratio of BPhen to Li was adjusted to 1:0.02 (=BPhen:Li). The other layers were formed in manufacturing methods similar to those of the light-emitting element 7. As for the reference light-emitting element 8, after the electron-injecting buffer 2104 was formed, the charge production region 2106 was formed on the electron-injecting buffer 2104. Accordingly, the reference light-emitting element 8 was obtained.

Table 15 below shows the element structures of the light-emitting element 7 and the reference light-emitting element 8.

TABLE 15

| | | | | 2103 | | | | |
|---|---|---|---|---|---|---|---|---|
| | 2101 | 2103a | 2103b | 2103c | 2103d | 2104 | 2105 | 2106 |
| Light-emitting element 7 | ITSO 110 nm | NPB: MoOx (=4:1) 50 nm | NPB 10 nm | PCBAPA: PCBANB (=1:1) 20 nm | CzPA:SDI (=1:0.05) 30 nm | BPhen 30 nm | Li$_2$O 0.1 nm | PTCBI 3 nm | NPB: MoOx (=4:1) 40 nm |
| Reference light-emitting element 8 | ITSO 110 nm | NPB: MoOx (=4:1) 50 nm | NPB 10 mn | PCBAPA: PCBANB (=1:1) 20 nm | CzPA:SDI (=1:0.05) 30 nm | BPhen 10 nm | BPhen:Li (=1:0.02) 20 nm | — | NPB: MoOx (=4:1) 40 nm |

| | 2107 | | | | | |
|---|---|---|---|---|---|---|
| | 2107a | 2107b | 2107c | 2107d | 2102 | |
| Light-emitting element 7 | NPB 10 nm | YGAO11: Ir(tppr)$_2$acac (=1:0.03) 10 nm | YGAO11: Ir(ppy)$_2$acac (=1:0.06) 20 nm | BAlq 10 nm | BPhen 20 nm | LiF 1 nm | Al 200 nm |
| Reference light-emitting element 8 | NPB 10 nm | YGAO11: Ir(tppr)$_2$acac (=1:0.03) 10 nm | YGAO11: Ir(ppy)$_2$acac (=1:0.06) 20 nm | BAlq 10 nm | BPhen 20 nm | LiF 1 nm | Al 200 nm |

The thus obtained light-emitting element 7 and reference light-emitting element 8 were sealed in a glove box under a nitrogen atmosphere so that they were not exposed to atmospheric air. After that, the operating characteristics of these light-emitting elements were measured. The measurement was carried out at room temperature (under an atmosphere in which the temperature was kept at 25° C.).

Figure 27:
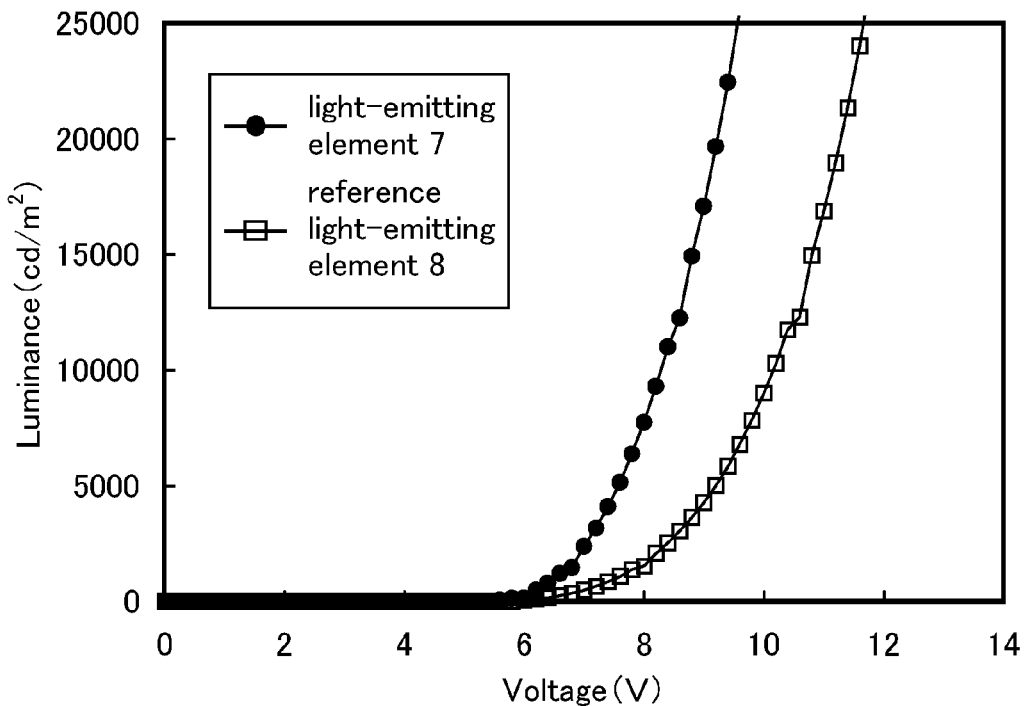
FIG. 27 is a graph showing characteristics of light-emitting elements of Example 8.
Figure 28:
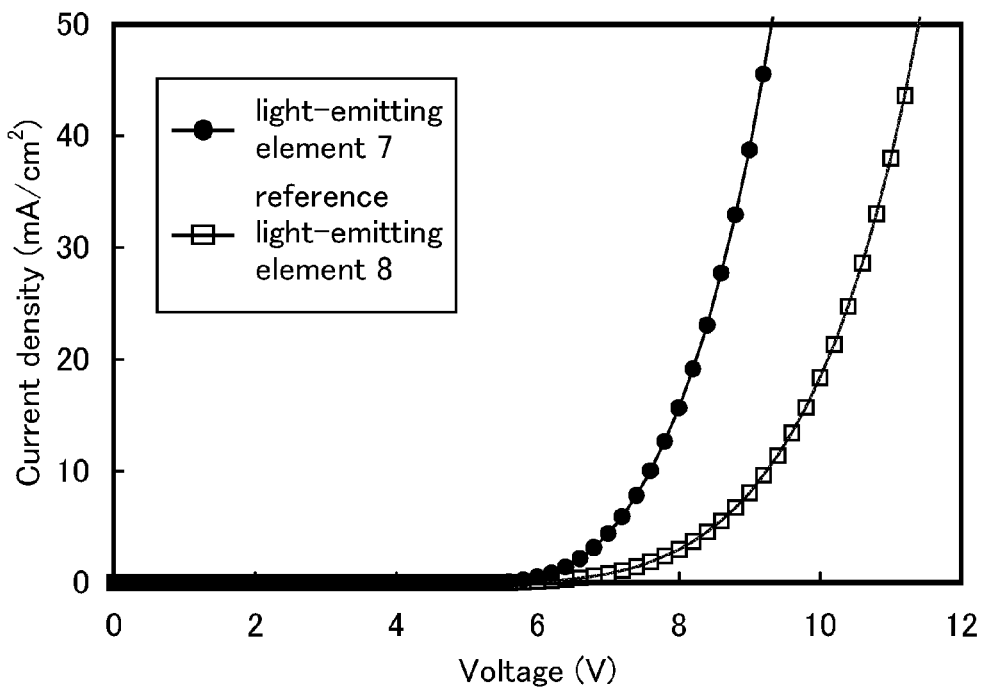
FIG. 28 is a graph showing characteristics of the light-emitting elements of Example 8.

FIG. 27 shows voltage-luminance characteristics of the light-emitting element 7 and the reference light-emitting element 8. In FIG. 27, the horizontal axis represents applied voltage (V) and the vertical axis represents luminance (cd/m$^2$). In addition, FIG. 28 shows voltage-current density characteristics. In FIG. 28, the horizontal axis represents voltage (V) and the vertical axis represents current density (mA/cm$^2$). Moreover, Table 16 below shows initial values of main characteristics of the light-emitting element 7 and the reference light-emitting element 8 at around 1000 cd/m$^2$.

TABLE 16

|  | Voltage (V) | Chromaticity (x, y) | Current efficiency (cd/A) | External quantum efficiency (%) |
| --- | --- | --- | --- | --- |
| Light-emitting element 7 | 6.4 | (0.32, 0.43) | 57 | 23 |
| Reference light-emitting element 8 | 7.6 | (0.32, 0.43) | 59 | 23 |

According to FIG. 27, the light-emitting element 7 in which the electron-relay layer is provided can have higher luminance than the reference light-emitting element 8 when the same voltage is applied to these light-emitting elements. In addition, according to FIG. 28, the light-emitting element 7 has a higher current density than the reference light-emitting element 8.

Figure 29:
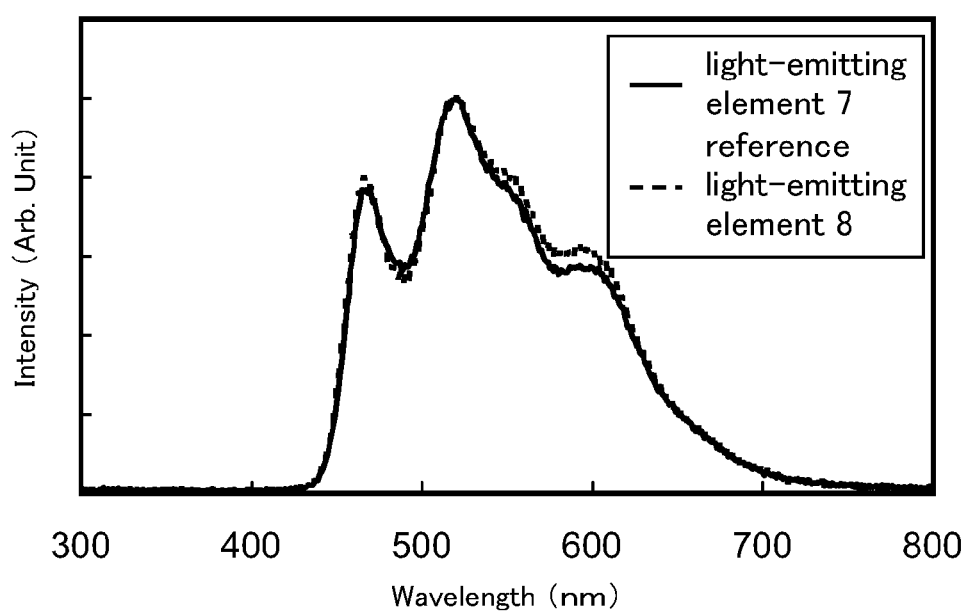
FIG. 29 is a graph showing characteristics of the light-emitting elements of Example 8.

Note that, as seen from CIE chromaticity coordinates of Table 16 and FIG. 29, the light-emitting element 7 and the reference light-emitting element 8 both exhibit white light emission. That is because blue light emission derived from PCBAPA and SD1 contained in the first EL layer 2103, red light emission derived from Ir(tppr)$_2$(acac) contained in the second EL layer 2107, and green light emission derived from Ir(ppy)$_2$(acac) were obtained.

Accordingly, it was confirmed that the light-emitting element 7 of this example had characteristics as a light-emitting element and functioned well. In addition, it was confirmed that the light-emitting element 7 was a light-emitting element capable of being driven at low voltage. Moreover, it was found that one embodiment of the structure of the present invention was effective even in the case where the structure is applied to a white light-emitting element in which EL layers exhibit different emission spectra.

Example 9

In Example 9, a light-emitting element that is one embodiment of the present invention will be described with reference to FIGS. 9A and 9B. Note that as for a light-emitting element and a reference light-emitting element described in this example, the same or similar parts as/to or parts having the same or similar functions as/to those described in the above examples are denoted by the same reference numerals as those of the above examples, and the description of them will not be repeated.

Chemical formulae of materials used in this example are shown below. Note that materials, the structural formulae of which have already been shown are omitted.

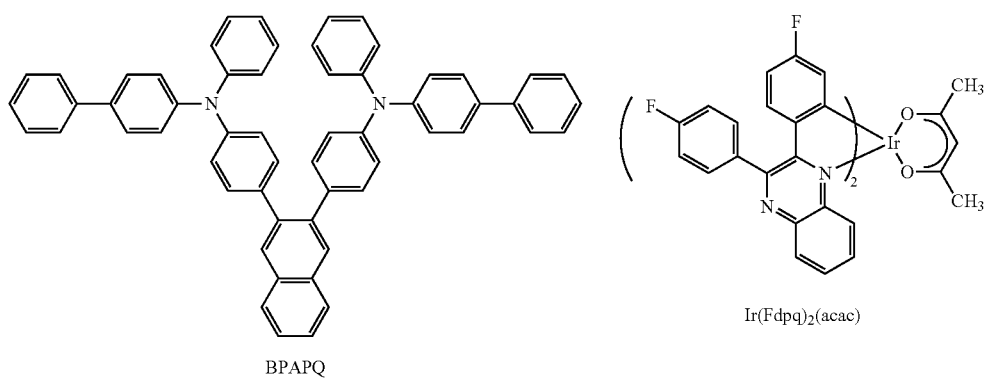

BPAPQ

Ir(Fdpq)$_2$(acac)

[Chemical Formula 5]

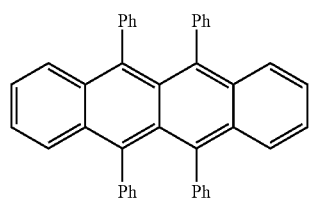
Rubrene

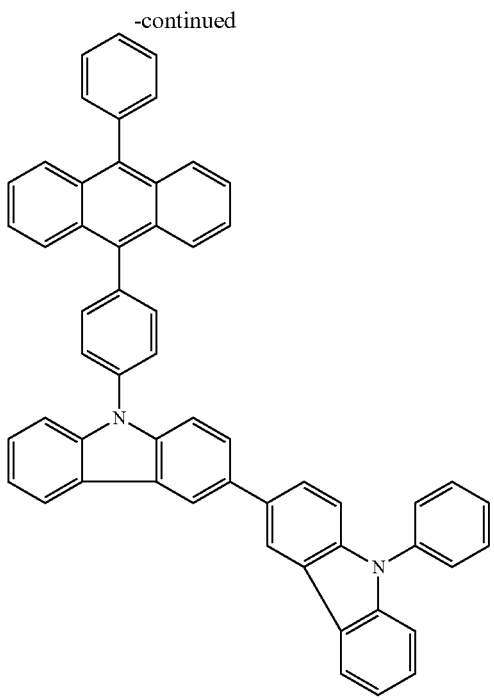
PCCPA

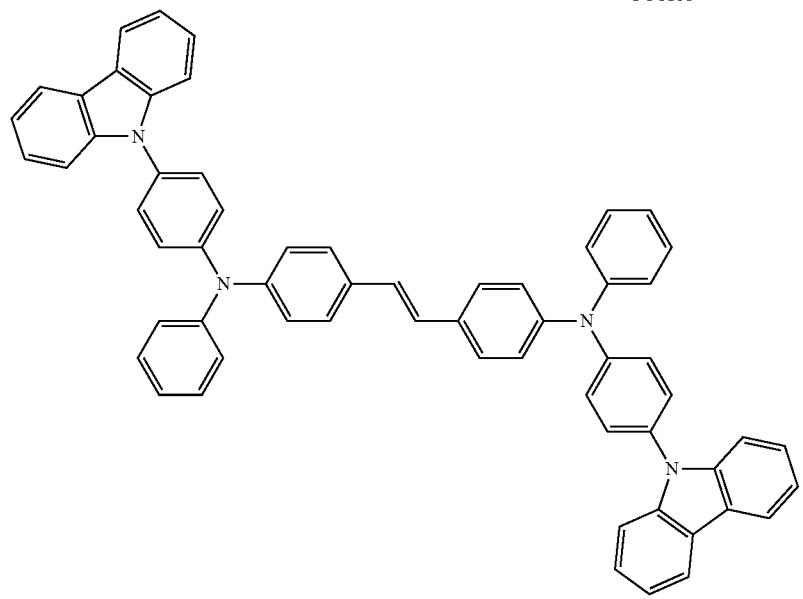
YGA2S

Hereinafter, a method for manufacturing a light-emitting element 8 and a reference light-emitting element 9 of this example will be described.

First, the light-emitting element 8 will be described (see FIG. 9A). The light-emitting element 8 of this example was manufactured in a manner similar to that of the light-emitting element in Example 8, except for the light-emitting layer 2103c of the first EL layer 2103, the second charge production region 2106, and the light-emitting layer 2107b and the electron-transporting layer 2107c of the second EL layer 2107.

As for the light-emitting element 8 of this example, 2,3-bis{4-[N-(4-biphenyl)-N-phenylamino]phenyl}quinoxaline (abbreviation: BPAPQ) and (acetylacetonato)bis[2,3-bis(4-fluorophenyl)quinoxalinato]iridium(III) (abbreviation: Ir(Fdpq)$_2$(acac)) were co-evaporated to a thickness of 10 nm; NPB and N,9-diphenyl-N-[4-(9,10-diphenyl-2-anthryl)phenyl]-9H-carbazol-3-amine (abbreviation: 2PCAPPA) were co-evaporated to a thickness of 5 nm; and then CzPA and 2PCAPPA were co-evaporated to a thickness of 30 nm, whereby the light-emitting layer 2103c was formed.

Note that the weight ratio of BPAPQ to Ir(Fdpq)$_2$(acac) was adjusted to be 1:0.06 (=BPAPQ:Ir(Fdpq)$_2$(acac)). Note also that the weight ratio of NPB to 2PCAPPA was adjusted to be 1:0.1 (=NPB:2PCAPPA). Note also that the weight ratio of CzPA to 2PCAPPA was adjusted to be 1:0.1 (=CzPA:2PCAPPA).

In addition, in the light-emitting element 7, NPB that is a material having a high hole-transporting property and molybdenum(VI) oxide that is an acceptor material were co-evaporated on the electron-relay layer 2105 to form the second charge production region 2106. The thickness of the second charge production region 2106 was 70 nm. The weight ratio of NPB to molybdenum(VI) oxide was adjusted to be 4:1 (=NPB:molybdenum oxide).

Moreover, as for the light-emitting element 7, NPB and rubrene were co-evaporated to a thickness of 20 nm; then 9-phenyl-9'-[4-(10-phenyl-9-anthryl)phenyl]-3,3'-bi(9H-carbazole) (abbreviation: PCCPA) and N,N'-bis[4-(9H-carbazol-9-yl)phenyl]-N,N'-diphenylstilbene-4,4'-diamine (abbreviation: YGA2S) were co-evaporated to a thickness of 10 nm; and furthermore, CzPA and YGA2S were co-evaporated to a thickness of 20 nm, whereby the light-emitting layer 2107b was formed. Note that the weight ratio of NPB to rubrene was adjusted to be 1:0.015 (=NPB:rubrene). Note also that the weight ratio of PCCPA to YGA2S was adjusted to be 1:0.05 (=PCCPA:YGA2S). Note also that the weight ratio of CzPA to YGA2S was adjusted to be 1:0.05 (=CzPA:YGA2S).

Then, BPhen was evaporated on the light-emitting layer 2107b to form the electron-transporting layer 2107c. Accordingly, the light-emitting element 8 of this example was obtained.

Next, the reference light-emitting element 9 will be described (see FIG. 9B). The reference light-emitting element 9 of this example has the structure of the light-emitting element 8, from which the electron-relay layer 2105 is removed. Further, as for the reference light-emitting element 9, BPhen and lithium (Li) were co-evaporated to a thickness of 20 nm to form the electron-injecting buffer 2104. Here, the weight ratio of BPhen to Li was adjusted to be 1:0.02 (=BPhen:Li). The other layers were formed by manufacturing methods similar to those of the light-emitting element 8. As for the light-emitting element 9, after the electron-injecting buffer 2104 was formed, the charge production region 2106 was formed on the electron-injecting buffer 2104. Accordingly, the reference light-emitting element 9 of this example was obtained.

Table 17 below shows the element structures of the light-emitting element 8 and the reference light-emitting element 9.

TABLE 17

| | 2101 | 2103 | | | | | 2104 | 2105 | 2106 |
| | | a | b | c | | | d | | | |
|---|---|---|---|---|---|---|---|---|---|---|
| Light-emitting element 8 | ITSO 110 nm | NPB: MoOx (=4:1) 50 nm | NPB 10 nm | BPAPQ: Ir(Fdpq)₂acac (=1:0.06) 10 nm | NPB: 2PCAPA (=1:0.1) 5 nm | CzPA: 2PCAPPA (=1:0.1) 30 nm | BPhen 30 nm | Li₂O 0.1 nm | PTCBI 3 nm | NPB: MoOx (=4:1) 70 nm |
| Reference light-emitting element 9 | ITSO 110 nm | NPB: MoOx (=4:1) 50 nm | NPB 10 mn | BPAPQ: Ir(Fdpq)₂acac (=1:0.06) 10 nm | NPB: 2PCAPA (=1:0.1) 5 nm | CzPA: 2PCAPPA (=1:0.1) 30 nm | BPhen 10 nm | BPhen:Li (=1:0.02) 20 nm | — | NPB: MoOx (=4:1) 70 nm |

| | 2107 | | | | | | 2102 |
| | a | b | | | c | d | |
|---|---|---|---|---|---|---|---|
| Light-emitting element 8 | NPB 10 nm | NPB: Rubrene (=1:0.015) 20 nm | PCCPA: YGA2S (=1:0.05) 10 nm | CzPA: YGA2S (=1:0.05) 20 nm | BPhen 30 nm | LiF 1 nm | Al 200 nm |
| Reference light-emitting element 9 | NPB 10 nm | NPB: Rubrene (=1:0.015) 20 nm | PCCPA: YGA2S (=1:0.05) 10 nm | CzPA: YGA2S (=1:0.05) 20 nm | BPhen 30 nm | LiF 1 nm | Al 200 nm |

The thus obtained light-emitting element 8 and reference light-emitting element 9 were sealed in a glove box under a nitrogen atmosphere so that they were not exposed to atmospheric air. After that, the operating characteristics of these light-emitting elements were measured. The measurement was carried out at room temperature (under an atmosphere in which the temperature was kept at 25° C.).

Figure 30:
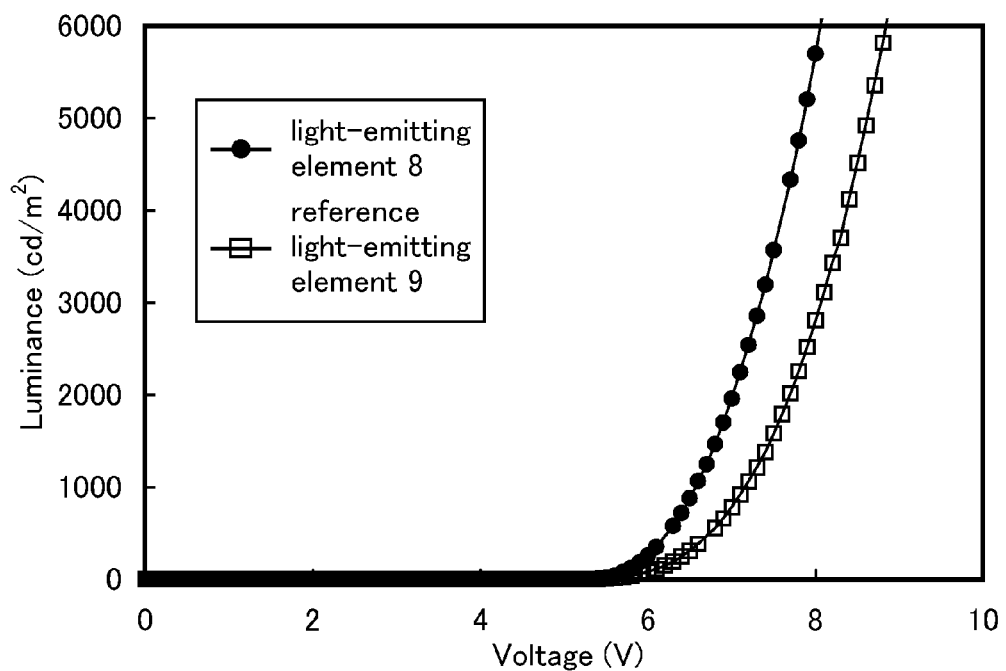
FIG. 30 is a graph showing characteristics of light-emitting elements of Example 9.
Figure 31:
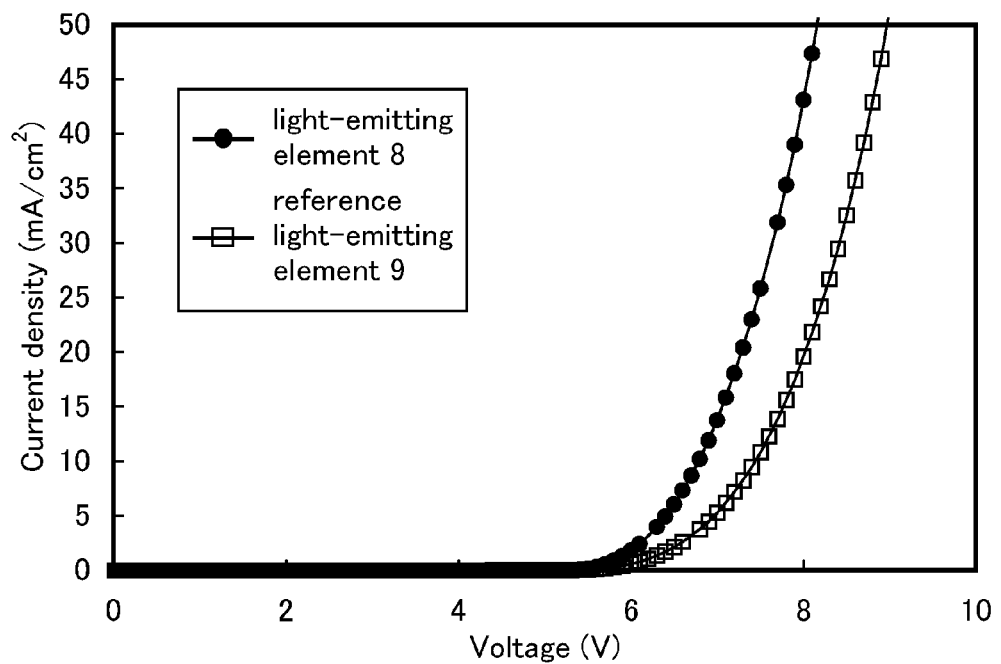
FIG. 31 is a graph showing characteristics of the light-emitting elements of Example 9.

FIG. 30 shows voltage-luminance characteristics of the light-emitting element 8 and the reference light-emitting element 9. In FIG. 30, the horizontal axis represents applied voltage (V) and the vertical axis represents luminance (cd/m²). In addition, FIG. 31 shows voltage-current density characteristics. In FIG. 31, the horizontal axis represents voltage (V) and the vertical axis represents current density (mA/cm²). Moreover, Table 18 below shows initial values of main characteristics of the light-emitting element 8 and the reference light-emitting element 9 at around 1000 cd/m².

TABLE 18

| | Voltage (V) | Chromaticity (x, y) | Current efficiency (cd/A) | External quantum efficiency (%) |
|---|---|---|---|---|
| Light-emitting element 8 | 6.6 | (0.31, 0.36) | 15 | 7.0 |
| Reference light-emitting element 9 | 7.2 | (0.31, 0.37) | 15 | 7.0 |

According to FIG. 30, the light-emitting element 8 in which the electron-relay layer is provided can have higher luminance than the reference light-emitting element 9 when the same voltage is applied to these light-emitting elements. In addition, according to FIG. 31, the light-emitting element 8 has a higher current density than the reference light-emitting element 9.

Figure 32:
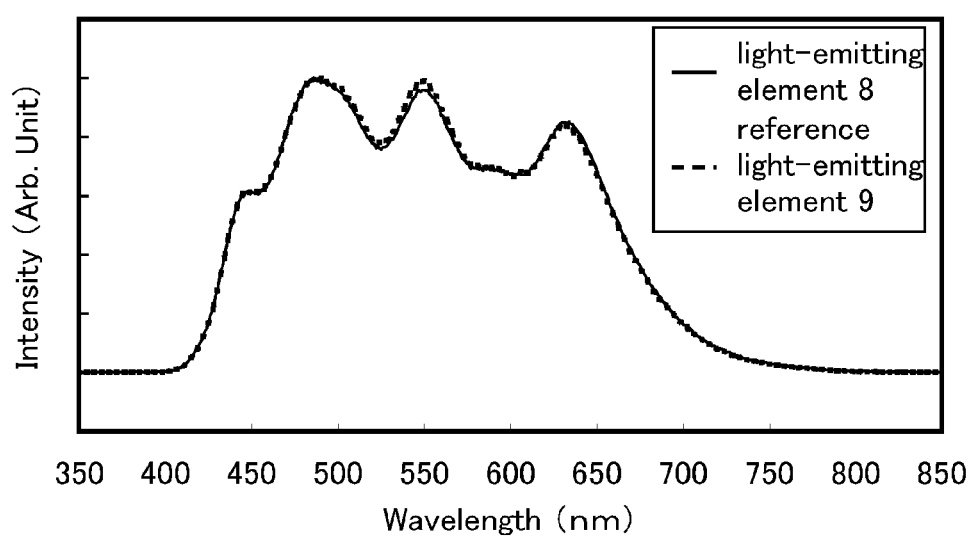
FIG. 32 is a graph showing characteristics of the light-emitting elements of Example 9.

Note that, as seen from CIE chromaticity coordinates of Table 18 and FIG. 32, the light-emitting element 8 and the reference light-emitting element 9 both exhibit white light emission. That is because red light emission derived from Ir(Fdpq)$_2$(acac) contained in the first EL layer 2103, blue-green light emission derived from 2PCAPPA, yellow light emission derived from rubrene contained in the second EL layer 2107, and blue light emission derived from YGA2S were obtained. In addition, those four emission colors are combined, whereby color rendering index (CRI) of as high as 92 was obtained.

Accordingly, it was confirmed that the light-emitting element 8 of this example had characteristics as a light-emitting element and functioned well. In addition, it was confirmed that the light-emitting element 8 was a light-emitting element capable of being driven at low voltage. Moreover, it was found that one embodiment of the structure of the present invention was effective even in the case where the structure is applied to a white light-emitting element in which EL layers exhibit different emission spectra.

Reference Example

In this reference example, a synthesis method of the material used in the above examples will be specifically described.

Synthesis Example of 4-(1-naphthyl)-4'-(9-phenyl-9H-carbazol-3-yl)-triphenylamine (abbreviation: PCBANB)

Synthesis scheme of 4-(1-naphthyl)-4'-(9-phenyl-9H-carbazol-3-yl)-triphenylamine is shown below (A-1).

[Chemical Formula 6]

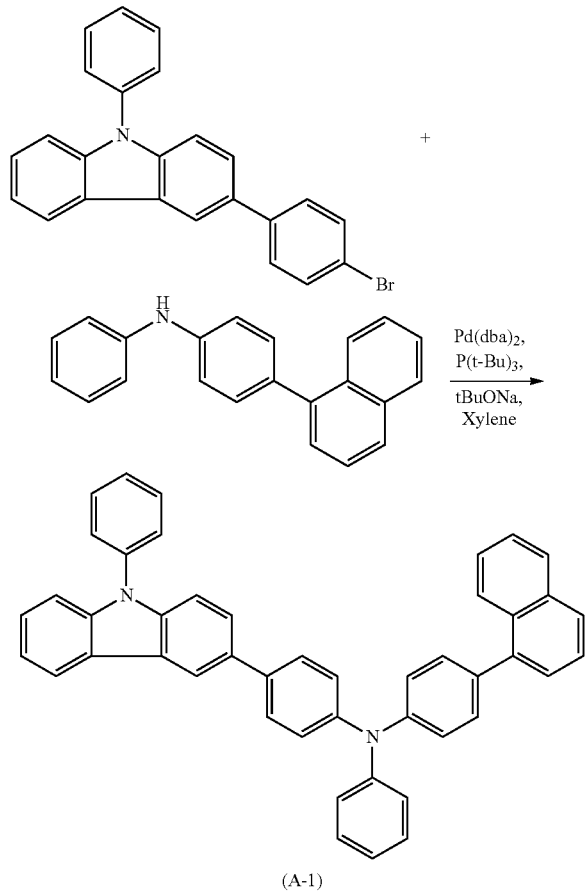

(A-1)

In a 50-mL three-neck flask, 1.2 g (3.0 mmol) of 3-(4-bromophenyl)-9-phenyl-9H-carbazole, 0.9 g (3.0 mmol) of 4-(1-naphthyl)diphenylamine, 0.5 g (5.0 mmol) of sodium tert-butoxide, and 6.0 mg (0.01 mmol) of bis(dibenzylidene-acetone)palladium(0) were put, and 15 mL of dehydrated xylene was added to this mixture. This mixture was deaerated while being stirred under low pressure. After the deaeration, 0.06 mL (0.03 mmol) of tri(tert-butyl)phosphine (10 wt % hexane solution) was added thereto. This mixture was stirred under a nitrogen atmosphere at 120° C. for 4.5 hours to be reacted.

After the reaction, 250 mL of toluene was added to this reaction mixture, and this suspension Was filtrated through Florisil, silica gel, alumina, and then Celite. The obtained filtrate was washed with water. Then, magnesium sulfate was added to remove moisture. This suspension was filtrated through Florisil, alumina, silica gel, and then Celite to obtain filtrate. The obtained filtrate was concentrated, and acetone and methanol were added thereto. The mixture was exposed to ultrasonic waves and recrystallized to obtain 1.5 g of an objective white powder at a yield of 82%.

An Rf value of the objective substance by a silica gel thin layer chromatography (TLC) (developing solvent, ethyl acetate:hexane=1:10) was 0.34, that of 3-(4-bromophenyl)-9-phenyl-9H-carbazole was 0.46, and that of 4-(1-naphthyl)diphenylamine was 0.25.

A compound that was obtained through the above step was measured by a nuclear magnetic resonance method ($^1$H NMR). The measurement data are shown below. The measurement results show that PCBANB that was an objective material was obtained.

$^1$H NMR (CDCl$_3$, 300 MHz): δ (ppm)=7.07 (t, J=6.6 Hz, 1H), 7.25-7.67 (m, 26H), 7.84 (d, J=7.8 Hz, 1H), 7.89-7.92 (m, 1H), 8.03-8.07 (m, 1H), 8.18 (d, J=7.8 Hz, 1H), 8.35 (d, J=0.9 Hz, 1H).

This application is based on Japanese Patent Application serial no. 2008-306425 filed with Japan Patent Office on Dec. 1, 2008, and Japanese Patent Application serial no. 2009-131518 filed Japan Patent Office on May 29, 2009, the entire contents of which are hereby incorporated by reference.

What is claimed is:
1. A light emitting element comprising:
an anode;
a first EL layer over the anode, the first EL layer comprising a first material having an electron-transporting property;
a first layer over the first EL layer;
a second layer over and in contact with the first layer;
a region over and in contact with the second layer;
a second EL layer over the region; and
a cathode over the second EL layer,
wherein the first layer includes at least one selected from the group consisting of an alkali metal, an alkaline earth metal, a rare earth metal, an alkali metal compound, an alkaline earth metal compound, and a rare earth metal compound,
wherein the second layer includes a second material having an electron-transporting property,
wherein the region includes a material having a hole-transporting property and an acceptor material, and
wherein the first material is different from the second material.
2. The light emitting element according to claim 1, wherein a mass ratio of the acceptor material to the material having the hole-transporting property in the region is from 0.1:1 to 4.0:1.

3. The light emitting element according to claim 1, wherein the acceptor material is a transition metal oxide which is an oxide of a metal belonging to Groups 4 to 8 of the periodic table.

4. The light emitting element according to claim 3, wherein the transition metal oxide is a molybdenum oxide.

5. The light emitting element according to claim 1, wherein the region further comprises 7,7,8,8-tetracyano-2,3,5,6-tetrafluoroquinodimethane and/or chloranil.

6. The light emitting element according to claim 1, wherein an emission spectrum of the first EL layer is different from an emission spectrum of the second EL layer.

7. The light emitting element according to claim 1, wherein the first EL layer includes an organic light emitting layer.

8. Any one of a light emitting device, a lighting device, and an electronic device selected from the group consisting of a camera, a goggle type display, a navigation system, an audio replay device, a computer, a game machine, a portable information terminal device, an electronic book, a cellular phone, an image replay device, and a television includes the light emitting element according to claim 1.

9. A light emitting element comprising:
an anode;
a first EL layer over the anode;
a first layer over the first EL layer;
a second layer over and in contact with the first layer;
a region over and in contact with the second layer;
a second EL layer over the region; and
a cathode over the second EL layer,
wherein the first layer includes at least one selected from the group consisting of an alkali metal, an alkaline earth metal, a rare earth metal, an alkali metal compound, an alkaline earth metal compound, and a rare earth metal compound,
wherein the second layer is configured to transport an electron from the region to the first layer, and
wherein the region includes a material having a hole-transporting property and an acceptor material.

10. The light emitting element according to claim 9, wherein a mass ratio of the acceptor material to the material having the hole-transporting property in the region is from 0.1:1 to 4.0:1.

11. The light emitting element according to claim 9, wherein the acceptor material is a transition metal oxide which is an oxide of a metal belonging to Groups 4 to 8 of the periodic table.

12. The light emitting element according to claim 11, wherein the transition metal oxide is a molybdenum oxide.

13. The light emitting element according to claim 9, wherein the region further comprises 7,7,8,8-tetracyano-2,3,5,6-tetrafluoroquinodimethane and/or chloranil.

14. The light emitting element according to claim 9, wherein an emission spectrum of the first EL layer is different from an emission spectrum of the second EL layer.

15. The light emitting element according to claim 9, wherein the first EL layer includes an organic light emitting layer.

16. Any one of a light emitting device, a lighting device, and an electronic device selected from the group consisting of a camera, a goggle type display, a navigation system, an audio replay device, a computer, a game machine, a portable information terminal device, an electronic book, a cellular phone, an image replay device, and a television includes the light emitting element according to claim 9.

17. A light emitting element comprising:
an anode;
a first EL layer over the anode;
a first layer over the first EL layer, the first EL layer comprising a first material having an electron-transporting property;
a second layer over and in contact with the first layer;
a third layer over and in contact with the second layer;
a second EL layer over the third layer; and
a cathode over the second EL layer,
wherein the first layer includes at least one selected from the group consisting of an alkali metal, an alkaline earth metal, a rare earth metal, an alkali metal compound, an alkaline earth metal compound, and a rare earth metal compound,
wherein the second layer includes a second material having an electron-transporting property,
wherein the third layer is a layer in which a first region including a material having a hole-transporting property and a second region including an acceptor material are stacked, and
wherein the first material is different from the second material.

18. The light emitting element according to claim 17, wherein a mass ratio of the acceptor material to the material having the hole-transporting property in the third layer is from 0.1:1 to 4.0:1.

19. The light emitting element according to claim 17, wherein the acceptor material is a transition metal oxide which is an oxide of a metal belonging to Groups 4 to 8 of the periodic table.

20. The light emitting element according to claim 19, wherein the transition metal oxide is a molybdenum oxide.

21. The light emitting element according to claim 17, wherein the third layer further comprises 7,7,8,8-tetracyano-2,3,5,6-tetrafluoroquinodimethane and/or chloranil.

22. The light emitting element according to claim 17, wherein an emission spectrum of the first EL layer is different from an emission spectrum of the second EL layer.

23. The light emitting element according to claim 17, wherein the first EL layer includes an organic light emitting layer.

24. Any one of a light emitting device, a lighting device, and an electronic device selected from the group consisting of a camera, a goggle type display, a navigation system, an audio replay device, a computer, a game machine, a portable information terminal device, an electronic book, a cellular phone, an image replay device, and a television includes the light emitting element according to claim 17.

25. A light emitting element comprising:
an anode;
a first EL layer over the anode;
a first layer over the first EL layer;
a second layer over and in contact with the first layer;
a third layer over and in contact with the second layer;
a second EL layer over the third layer; and
a cathode over the second EL layer,
wherein the first layer includes at least one selected from the group consisting of an alkali metal, an alkaline earth metal, a rare earth metal, an alkali metal compound, an alkaline earth metal compound, and a rare earth metal compound,
wherein the second layer is configured to transport an electron from the third layer to the first layer, and wherein the third layer is a layer in which a first region including a material having a hole-transporting property and a second region including an acceptor material are stacked.

26. The light emitting element according to claim 25, wherein a mass ratio of the acceptor material to the material having the hole-transporting property in the third layer is from 0.1:1 to 4.0:1.

27. The light emitting element according to claim 25, wherein the acceptor material is a transition metal oxide which is an oxide of a metal belonging to Groups 4 to 8 of the periodic table.

28. The light emitting element according to claim 27, wherein the transition metal oxide is a molybdenum oxide.

29. The light emitting element according to claim 25, wherein the third layer further comprises 7,7,8,8-tetracyano-2,3,5,6-tetrafluoroquinodimethane and/or chloranil.

30. The light emitting element according to claim 25, wherein an emission spectrum of the first EL layer is different from an emission spectrum of the second EL layer.

31. The light emitting element according to claim 25, wherein the first EL layer includes an organic light emitting layer.

32. Any one of a light emitting device, a lighting device, and an electronic device selected from the group consisting of a camera, a goggle type display, a navigation system, an audio replay device, a computer, a game machine, a portable information terminal device, an electronic book, a cellular phone, an image replay device, and a television includes the light emitting element according to claim 25.

\* \* \* \* \*

UNITED STATES PATENT AND TRADEMARK OFFICE
CERTIFICATE OF CORRECTION

| | |
|---|---|
| PATENT NO. | : 8,431,940 B2 |
| APPLICATION NO. | : 13/484602 |
| DATED | : April 30, 2013 |
| INVENTOR(S) | : Hiromi Nowatari et al. |

Page 1 of 1

It is certified that error appears in the above-identified patent and that said Letters Patent is hereby corrected as shown below:

In the Specification:

At column 26, line 10, "R, and B" should be --R, G, and B--;

At column 44, line 57, "that or" should be --that of--.

Signed and Sealed this
Sixth Day of August, 2013

Teresa Stanek Rea
*Acting Director of the United States Patent and Trademark Office*